US010862456B2

(12) United States Patent
Nosaka

(10) Patent No.: US 10,862,456 B2
(45) Date of Patent: Dec. 8, 2020

(54) ACOUSTIC WAVE FILTER DEVICE, MULTIPLEXER, RADIO FREQUENCY FRONT-END CIRCUIT, AND COMMUNICATION DEVICE

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/280,482

(22) Filed: Feb. 20, 2019

(65) Prior Publication Data

US 2019/0181833 A1    Jun. 13, 2019

Related U.S. Application Data

(63) Continuation of application No. PCT/JP2017/029311, filed on Aug. 14, 2017.

(30) Foreign Application Priority Data

Aug. 26, 2016 (JP) .................................. 2016-166130

(51) Int. Cl.
*H03H 9/54* (2006.01)
*H03H 9/64* (2006.01)
(Continued)

(52) U.S. Cl.
CPC .......... *H03H 9/542* (2013.01); *H03H 7/0161* (2013.01); *H03H 9/0542* (2013.01);
(Continued)

(58) Field of Classification Search
CPC .. H03H 9/542; H03H 9/14541; H03H 9/0542; H03H 9/605; H03H 9/706;
(Continued)

(56) References Cited

U.S. PATENT DOCUMENTS 5,631,612 A * 5/1997 Satoh ................... H03H 9/0576
333/193
6,472,953 B1 10/2002 Sakuragawa et al.
(Continued)

FOREIGN PATENT DOCUMENTS

JP    2000-323961 A    11/2000
JP    2003-110404 A    4/2003
(Continued)

OTHER PUBLICATIONS

International Search Report for International Application No. PCT/JP2017/029311 dated Nov. 7, 2017.
(Continued)

*Primary Examiner* — Robert J Pascal
*Assistant Examiner* — Jorge L Salazar, Jr.
(74) *Attorney, Agent, or Firm* — Pearne & Gordon LLP

(57) ABSTRACT

An acoustic wave filter device includes a ground connection terminal connected to an external ground electrode, a serial arm resonator, a first parallel arm circuit connected to a first node of the serial arm resonator, the first node being positioned closer to an input/output terminal, and to the ground connection terminal, and a second parallel arm circuit connected to a second node of the serial arm resonator, the second node being positioned closer to an input/output terminal, and to the ground connection terminal. The first parallel arm circuit includes a parallel arm resonator having a resonant frequency higher than a center frequency of a filter pass band, and a frequency varying circuit connected to the parallel arm resonator and the ground connection terminal. The second parallel arm circuit includes a parallel arm resonator having a resonant frequency higher than the center frequency of the filter pass band.

19 Claims, 27 Drawing Sheets

(51) Int. Cl.
*H04B 1/00* (2006.01)
*H03H 9/70* (2006.01)
*H03H 9/60* (2006.01)
*H03H 9/05* (2006.01)
*H03H 9/145* (2006.01)
*H03H 7/01* (2006.01)
*H03H 9/205* (2006.01)
*H03H 9/72* (2006.01)
*H04B 1/10* (2006.01)

(52) U.S. Cl.
CPC ........ *H03H 9/14541* (2013.01); *H03H 9/205* (2013.01); *H03H 9/605* (2013.01); *H03H 9/64* (2013.01); *H03H 9/6403* (2013.01); *H03H 9/6483* (2013.01); *H03H 9/706* (2013.01); *H03H 9/725* (2013.01); *H04B 1/00* (2013.01); *H03H 2210/036* (2013.01); *H04B 1/1027* (2013.01)

(58) Field of Classification Search
CPC .... H03H 9/6483; H03H 9/6403; H03H 9/725; H03H 9/205; H03H 7/0161; H03H 9/64; H03H 2210/036; H04B 1/00; H04B 1/1027
USPC .......................... 333/133, 187, 188, 193–196
See application file for complete search history.

(56) References Cited

U.S. PATENT DOCUMENTS

| | | |
|---|---|---|
| 8,310,321 B2 | 11/2012 | Kadota |
| 2004/0090288 A1 | 5/2004 | Inoue |
| 2006/0267708 A1 | 11/2006 | Matsuda et al. |
| 2010/0188166 A1 | 7/2010 | Nara et al. |
| 2012/0286895 A1 | 11/2012 | Hara et al. |
| 2013/0113576 A1 | 5/2013 | Inoue et al. |
| 2014/0062614 A1* | 3/2014 | Park .................. H04B 1/006 333/133 |
| 2014/0218129 A1 | 8/2014 | Fujiwara et al. |
| 2016/0294357 A1 | 10/2016 | Tani |
| 2017/0099044 A1 | 4/2017 | Takamine |

FOREIGN PATENT DOCUMENTS

| | | |
|---|---|---|
| JP | 2008-219748 A | 9/2008 |
| JP | 2010-177770 A | 8/2010 |
| JP | 2012-239039 A | 12/2012 |
| JP | 2013-118611 A | 6/2013 |
| JP | 2016-54374 A | 4/2016 |
| JP | 2006-333012 A | 12/2016 |
| WO | 2010/058570 A1 | 5/2010 |
| WO | 2013/080461 A1 | 6/2013 |
| WO | 2015/087894 A1 | 6/2015 |
| WO | 2016/013330 A1 | 1/2016 |
| WO | 2017/138540 A1 | 8/2017 |

OTHER PUBLICATIONS

Written Opinion for International Application No. PCT/JP2017/029311 dated Nov. 7, 2017.

* cited by examiner

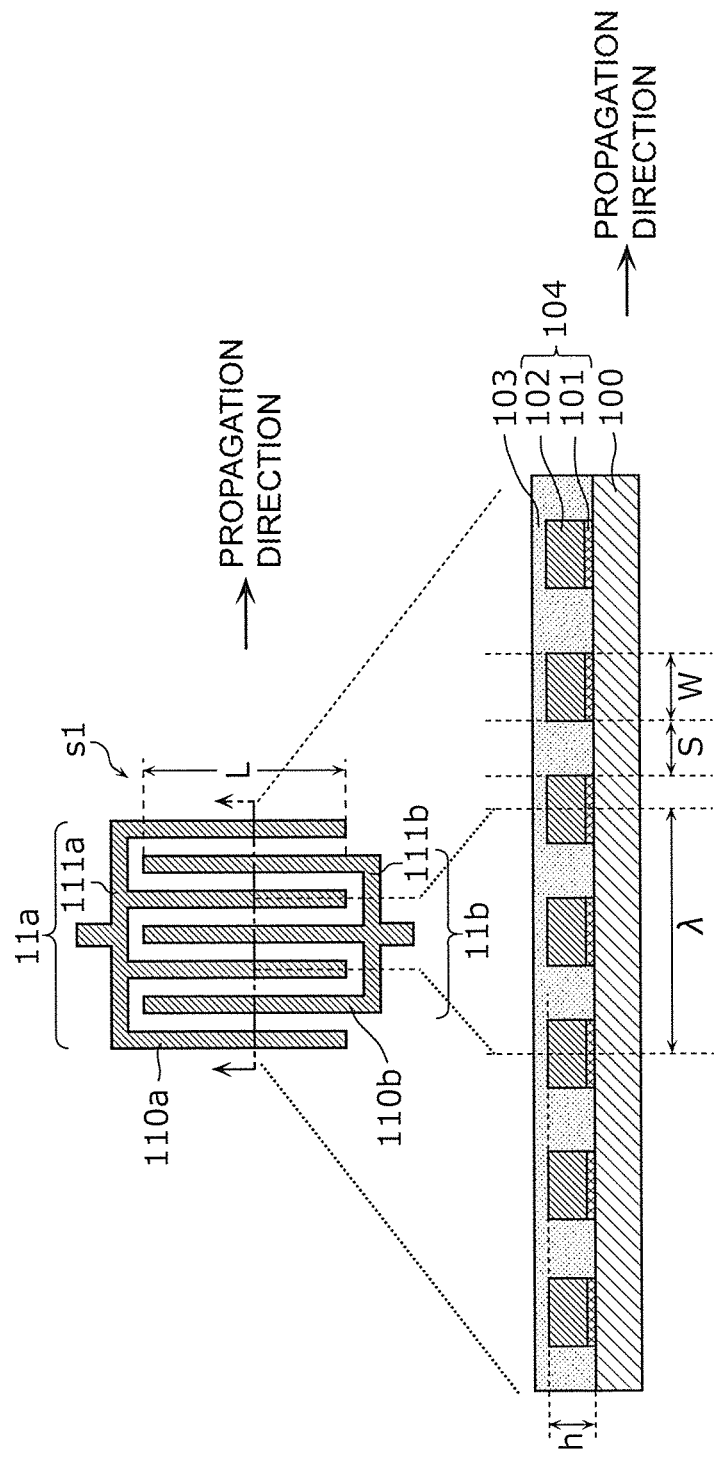

FIG. 4C
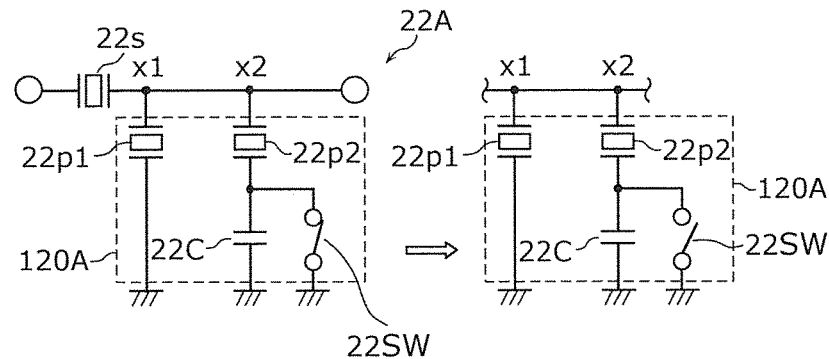
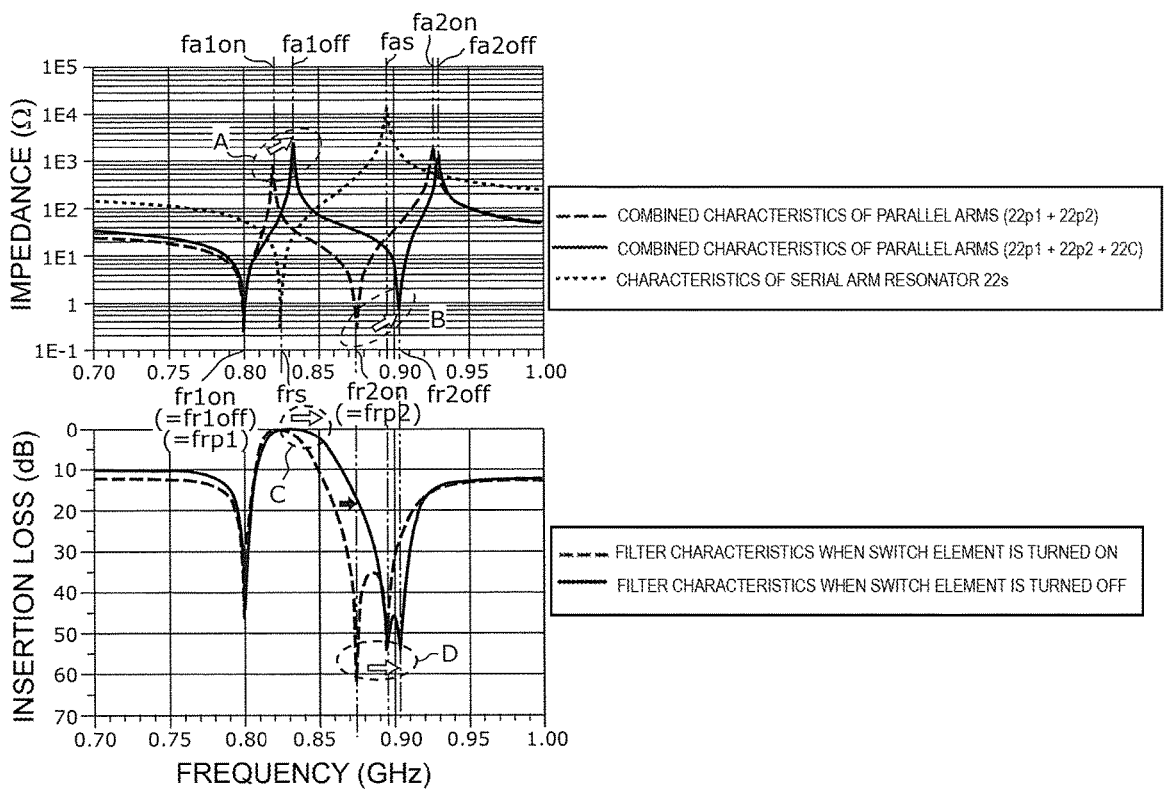

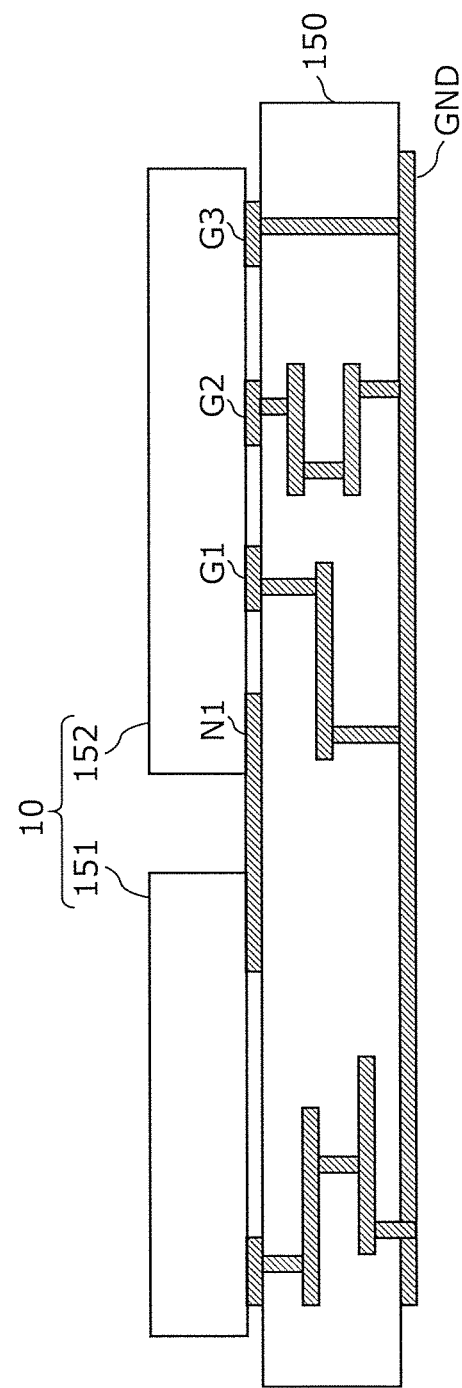

FIG. 17
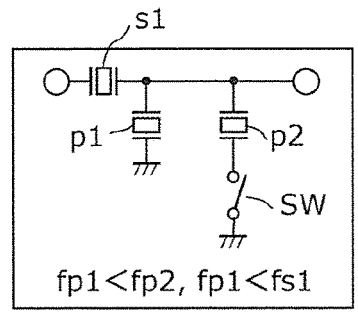
fp1<fp2, fp1<fs1
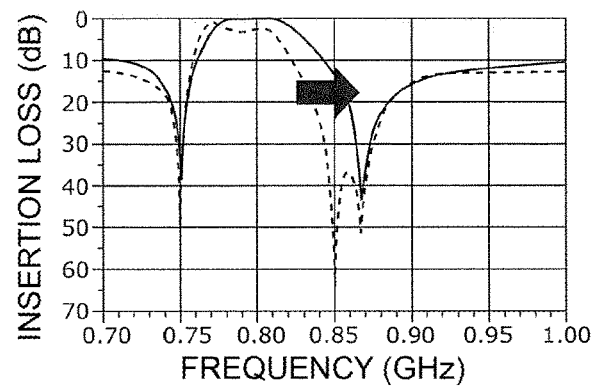
------- WHEN SWITCH IS TURNED ON
——— WHEN SWITCH IS TURNED OFF
FIG. 18A
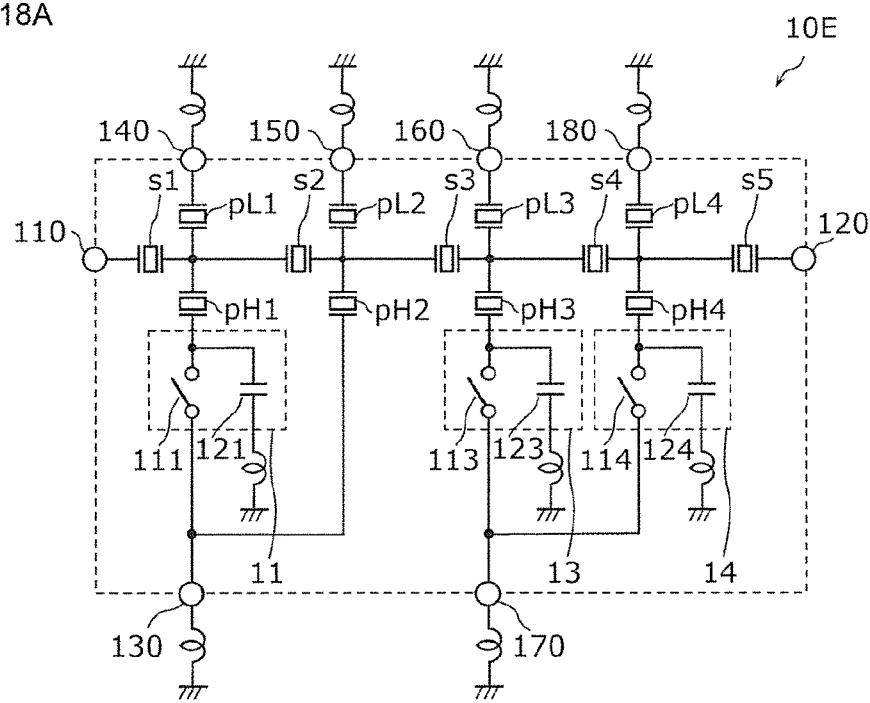

ACOUSTIC WAVE FILTER DEVICE, MULTIPLEXER, RADIO FREQUENCY FRONT-END CIRCUIT, AND COMMUNICATION DEVICE

This is a continuation of International Application No. PCT/JP2017/029311 filed on Aug. 14, 2017 which claims priority from Japanese Patent Application No. 2016-166130 filed on Aug. 26, 2016. The contents of these applications are incorporated herein by reference in their entireties.

BACKGROUND OF THE DISCLOSURE

Field of the Disclosure

The present disclosure relates to an acoustic wave filter device including acoustic wave resonators, and further relates to a multiplexer, a radio frequency front-end circuit, and a communication device.

Description of the Related Art

Hitherto, an acoustic wave filter utilizing an acoustic wave has been widely used in a bandpass filter that is arranged in a front-end portion of a mobile communication device. Furthermore, a radio frequency front-end circuit including a plurality of acoustic wave filters has been put into practice to be adapted for a trend toward a more complex device, such as a multimode/multiband device.

FIG. 23 is a circuit diagram of an antenna duplexer disclosed in Patent Document 1. An antenna duplexer 501 illustrated in FIG. 23 is applied to a UMTS system. A ladder acoustic wave filter 502 serving as a transmit filter and a receive filter 503 are connected to an antenna terminal 505. The receive filter 503 is constituted by a resonator 519 and a longitudinal mode coupled filter 518. The ladder acoustic wave filter 502 is connected between an input terminal 504 and the antenna terminal 505, and it is constituted by serial resonators 508 to 511, first parallel resonators 512 to 514, a second parallel resonator 520, a third parallel resonator 540, and an inductor 515. Here, resonant frequencies of the first parallel resonators 512 to 514 are lower than resonant frequencies of the serial resonators 508 to 511. A resonant frequency of the second parallel resonators 520 is higher than the resonant frequencies of the serial resonators 508 to 511 and lower than anti-resonant frequencies of the serial resonators 508 to 511. A resonant frequency of the third parallel resonators 540 is higher than the anti-resonant frequencies of the serial resonators 508 to 511. With the above configuration, the serial resonators 508 to 511 and the first parallel resonators 512 to 514 form attenuation poles on the lower frequency side and the higher frequency side than a pass band in the vicinity thereof. Furthermore, the second parallel resonator 520 forms an attenuation pole on the higher frequency side than the pass band and the lower frequency side than the attenuation pole formed by the serial resonators. Moreover, the third parallel resonator 540 forms an attenuation pole at a frequency away from the pass band toward the higher frequency side. Thus, steepness of the ladder acoustic wave filter 502 on the higher frequency side than the pass band can be increased with the disclosed technique.

Patent Document 1: International Publication No. 2013/080461

BRIEF SUMMARY OF THE DISCLOSURE

The antenna duplexer 501 disclosed in Patent Document 1 relates to a fixed filter adapted for a single band, and it is intended to improve the filter characteristics by adjusting the resonance frequencies of the plurality of parallel resonators.

However, when a technique of adjusting the resonance frequencies of the plurality of parallel resonators is applied to a frequency variable filter for the purpose of application to a multiband-adaptable multiplexer circuit, the harmonic characteristics are deteriorated for the reason that, because there is one ground terminal for the plurality of parallel resonators, resonance occurs between an inductor component of connection wirings to the ground terminal and the plurality of parallel resonators. On the other hand, aiming to avoid the deterioration of the harmonic characteristics, it is conceivable to provide ground terminals separately for all the parallel resonators. However, such a solution raises a problem of increasing the number of ground terminals and hence a filter size.

The present disclosure has been made to solve the above-described problem, and an object of the present disclosure is to provide a acoustic wave filter device of frequency variable type, a multiplexer, a radio frequency front-end circuit, and a communication device in each of which the number of terminals connected to a ground can be reduced and a size can be reduced without deteriorating the filter characteristics.

To achieve the above object, according to one aspect of the present disclosure, there is provided an acoustic wave filter device of frequency variable type including a plurality of acoustic wave resonators and allowing a radio frequency signal in a predetermined frequency band to pass therethrough, the acoustic wave filter device including a first input/output terminal and a second input/output terminal through each of which a radio frequency signal is input and output; a first terminal connected to an external ground electrode; a first serial arm circuit including one or more acoustic wave resonators and connected to a path connecting the first input/output terminal and the second input/output terminal; a first parallel arm circuit connected between the first terminal and a first node among nodes on the path, the first node being positioned closer to the first input/output terminal relative to the first serial arm circuit; and a second parallel arm circuit connected between the first terminal and a second node among the nodes on the path, the second node being positioned closer to the second input/output terminal relative to the first serial arm circuit, wherein the first parallel arm circuit includes a first higher-frequency parallel arm resonator having a resonant frequency higher than a center frequency of the predetermined frequency band; and a first frequency varying circuit connected in series to the first higher-frequency parallel arm resonator between the first node and the first terminal, and wherein the second parallel arm circuit includes a second higher-frequency parallel arm resonator having a resonant frequency higher than the center frequency of the predetermined frequency band.

With the above features, since the first frequency varying circuit is connected to the first higher-frequency parallel arm resonator having the resonant frequency higher than the center frequency of the filter pass band, a slope or an attenuation pole on the higher frequency side of the filter pass band can be shifted. Thus, since multiple filter characteristics can be constituted by one filter circuit, the size of a frequency variable filter circuit can be reduced. Furthermore, when connecting the parallel arm resonators to the ground, parallel arms of the adjacent first and second higher-frequency parallel arm resonators on the side to be grounded are connected to the common first terminal. Therefore, the number of ground terminals provided in the acoustic wave filter device can be reduced. From the viewpoint of filter attenuation characteristics, connecting parallel arms of the parallel arm resonators, which are to be grounded, individually to the ground is more preferable than connecting the parallel arms to the ground after connecting them in advance. The reason is that parasitic inductors, etc. attributable to wiring lines, etc. are generated in the ground. In the case of two adjacent parallel arm resonators, however, even when the parallel arms to be grounded are connected to the ground after connecting them in advance, the filter attenuation characteristics are not deteriorated. Accordingly, the above configuration can realize the frequency variable filter circuit in which the number of terminals connected to the ground can be reduced, and in which size reduction and space-saving can be obtained without deteriorating the filter characteristics.

The acoustic wave filter device may further include a second terminal and a third terminal both connected to the external ground electrode, a first lower-frequency parallel arm resonator connected between the first node and the second terminal, and having a resonant frequency lower than the center frequency of the predetermined frequency band, and a second lower-frequency parallel arm resonator connected between the second node and the third terminal, and having a resonant frequency lower than the center frequency of the predetermined frequency band.

With the above feature, a bandpass filter can be realized with a combination of the first lower-frequency parallel arm resonator and the first serial arm circuit. The slope or the attenuation pole on the higher frequency side of the filter pass band can be shifted by the first higher-frequency parallel arm resonator, the second higher-frequency parallel arm resonator, and the first frequency varying circuit.

The first serial arm circuit may be constituted by one or more acoustic wave resonators, the resonant frequency of the first higher-frequency parallel arm resonator may be lower than an anti-resonant frequency of the one or more acoustic wave resonators in the first serial arm circuit, and the resonant frequency of the second higher-frequency parallel arm resonator may be lower than the anti-resonant frequency of the one or more acoustic wave resonators in the first serial arm circuit.

With the above features, a ladder bandpass filter can be constituted, and bandpass characteristics with high sharpness can be realized. Furthermore, since the resonant frequency of each higher-frequency parallel arm resonator is lower than the anti-resonant frequency of each serial arm circuit, the slope or the attenuation pole on the higher frequency side of the filter pass band can be finely shifted with high accuracy corresponding to, for example, a plurality of bands having partly overlapped with frequency bands.

The first serial arm circuit may be a longitudinally-coupled filter resonator including a plurality of acoustic wave resonators.

The above feature can make the acoustic wave filter device adaptable for filter characteristics in which the enhancement of the attenuation, for example, is demanded.

The first frequency varying circuit may include a first switch element and a first impedance element, and only one of the first switch element and the first impedance element may be connected between the first higher-frequency parallel arm resonator and the first terminal.

With the above features, the acoustic wave filter device can take two bandpass characteristics in which pass bands are different from each other depending on turning-on and -off of the first switch element. More specifically, when the first switch element is turned on, first bandpass characteristics are specified by impedance that is not affected by the impedance element. On the other hand, when the first switch element is turned off, second bandpass characteristics different from the first bandpass characteristics are specified by impedance that is affected by the impedance element. In the first parallel arm circuit, at least one of frequencies at which the impedance is locally minimized and at least one of the frequencies at which the impedance is locally maximized is shifted to the lower frequency side or the higher frequency side depending on turning-on and -off of the first switch element. Therefore, the attenuation slopes specified by the frequencies at which the impedance of the parallel arm circuit is locally minimized and maximized are shifted to the lower frequency side or the higher frequency side. Thus, according to this aspect of the present disclosure, the pass band can be switched over while dropping of a shoulder of the pass band is suppressed.

The second parallel arm circuit may further include a second switch element connected to the first terminal, and connected between the second higher-frequency parallel arm resonator and the first terminal, and the first switch element may be connected to the first terminal.

The second parallel arm circuit may further include a second impedance element connected to the first terminal, and connected between the second higher-frequency parallel arm resonator and the first terminal, and the first impedance element may be connected to the first terminal.

The acoustic wave filter device may further include a fourth terminal connected to the external ground electrode, wherein the second parallel arm circuit may further include a second impedance element connected to the second higher-frequency parallel arm resonator and to the fourth terminal, and the first impedance element and the second impedance element are connected to the fourth terminal.

With the above features, since the second parallel arm circuit also has the frequency variable function, the slope or the attenuation pole on the higher frequency side of the filter pass band can be shifted with high accuracy.

The acoustic wave filter device may further include a fifth terminal connected to the external ground electrode without passing the first terminal; a second serial arm circuit including one or more acoustic wave resonators and connected in series to the first serial arm circuit between the first input/output terminal and the second input/output terminal; and a third parallel arm circuit connected between the fifth terminal and a third node among the nodes on the path, the third node being positioned closer to the second input/output terminal relative to the second serial arm circuit, wherein the first terminal may be connected to the external ground electrode without passing the fifth terminal, and the third parallel arm circuit may include a third higher-frequency parallel arm resonator having a resonant frequency higher than the center frequency of the predetermined frequency band.

With the above features, parallel arms of the adjacent first and second parallel arm circuits on the side to be grounded are connected to the first terminal, while a parallel arm of the third parallel arm circuit on the side to be grounded is connected to the fifth terminal. Here, the first terminal and the fifth terminal are both connected to the ground outside the acoustic wave filter device, but they are not connected to each other inside the acoustic wave filter device. In other words, the ground connection terminal for the adjacent first and second parallel arm circuits and the ground connection terminal for the third parallel arm circuit are separated from each other. In the case of two adjacent parallel arm resonators, the filter attenuation characteristics are not deteriorated even when the parallel arms to be grounded are connected to the ground after previously connecting them in common. However, the attenuation characteristics near the filter pass band are deteriorated when parallel arms of three or more adjacent parallel arm resonators on the side to be grounded are connected to the ground after previously connecting them in common. Thus, with the above features, even in the case of a filter circuit configuration including three or more stages of unit circuits each constituted by the serial and parallel arm resonators, the frequency variable filter circuit can be realized in which the number of terminals connected to the ground is reduced, good filter attenuation characteristics are ensured, and in which size reduction and space-saving are obtained.

The acoustic wave filter device may further include a sixth terminal connected to the external ground electrode, and a third lower-frequency parallel arm resonator connected between the third node and the sixth terminal, and having a resonant frequency lower than the center frequency of the predetermined frequency band.

With the above feature, a bandpass filter having higher sharpness can be realized with the provision of the third lower-frequency parallel arm resonator.

The second serial arm circuit may be constituted by one or more acoustic wave resonators, and the resonant frequency of the third higher-frequency parallel arm resonator may be lower than an anti-resonant frequency of the one or more acoustic wave resonators in the second serial arm circuit.

With the above features, a ladder bandpass filter can be constituted by the second parallel arm circuit and the second lower-frequency parallel arm resonator, and bandpass characteristics having higher sharpness can be realized. Furthermore, since the resonant frequency of the third higher-frequency parallel arm resonator is lower than the anti-resonant frequency of the one or more second serial arm circuit, the slope or the attenuation pole on the higher frequency side of the filter pass band can be finely shifted with high accuracy corresponding to, for example, a plurality of bands having partly overlapped frequency bands.

The third parallel arm circuit may further include a third switch element connected to the third higher-frequency parallel arm resonator and to the fifth terminal.

The third parallel arm circuit may further include a third impedance element connected to the third higher-frequency parallel arm resonator and to the fifth terminal.

With the above features, since the third parallel arm circuit also has the frequency variable function, the slope or the attenuation pole on the higher frequency side of the filter pass band can be shifted with higher accuracy.

The acoustic wave filter device may include the first input/output terminal and the second input/output terminal, a filter substrate in or on which the first serial arm circuit, the first higher-frequency parallel arm resonator, and the second higher-frequency parallel arm resonator are formed, a tunable circuit section in which the first frequency varying circuit and the first terminal are formed, and a mounting board to which the filter substrate and the tunable circuit section are mounted, which includes the external ground electrode, and in which wiring extending from the first terminal to the external ground electrode is formed.

With the above feature, the acoustic wave filter device is constituted by the filter substrate and the tunable circuit section. Nodes of the first and second higher-frequency parallel arm resonators formed in or on the filter substrate, each of the nodes being positioned closer to the ground connection side, are connected to the first terminal in the tunable circuit section. Therefore, the number of ground terminals for connecting the tunable circuit section and the mounting board to the ground can be reduced. As a result, the filter circuit can be realized in which size reduction and space-saving are obtained without deteriorating the filter characteristics.

According to another aspect of the present disclosure, there is provided an acoustic wave filter device of frequency variable type including a plurality of acoustic wave resonators and allowing a radio frequency signal in a predetermined frequency band to pass therethrough, the acoustic wave filter device including a first input/output terminal and a second input/output terminal through each of which a radio frequency signal is input and output; a first terminal connected to an external ground electrode; a first serial arm circuit including one or more acoustic wave resonators and connected to a path connecting the first input/output terminal and the second input/output terminal; a first parallel arm circuit connected between the first terminal and a first node among nodes on the path, the first node being positioned closer to the first input/output terminal than the first serial arm circuit; and a second parallel arm circuit connected between the first terminal and a second node among the nodes on the path, the second node being positioned closer to the second input/output terminal than the first serial arm circuit, wherein the first parallel arm circuit includes a first lower-frequency parallel arm resonator, a first higher-frequency parallel arm resonator having a higher resonant frequency than the first lower-frequency parallel arm resonator, and a first frequency varying circuit connected to the first terminal and connected in series to the first higher-frequency parallel arm resonator between the first node and the first terminal, wherein the second parallel arm circuit includes a second lower-frequency parallel arm resonator, and a second higher-frequency parallel arm resonator having a higher resonant frequency than the second lower-frequency parallel arm resonator and connected to the first terminal, and wherein the first frequency varying circuit and the second higher-frequency parallel arm resonator are grounded in common at the first terminal.

With the above features, since the first frequency varying circuit is connected to the first higher-frequency parallel arm resonator having the higher resonant frequency, a slope or an attenuation pole on the higher frequency side of the filter pass band can be shifted. Thus, since multiple filter characteristics can be constituted by one filter circuit, the size of a frequency variable filter circuit can be reduced. Furthermore, when connecting the parallel arm resonators to the ground, the adjacent first and second higher-frequency parallel arm resonators are grounded in common at the first terminal. Therefore, the number of ground terminals provided in the acoustic wave filter device can be reduced. Accordingly, the frequency variable filter circuit can be realized in which the number of terminals connected to the ground can be reduced, and in which size reduction and space-saving can be obtained without deteriorating the filter characteristics.

The acoustic wave filter device may further include a fifth terminal connected to the external ground electrode, a second serial arm circuit including one or more acoustic wave resonators and connected in series to the first serial arm circuit between the first input/output terminal and the second input/output terminal, and a third parallel arm circuit connected between the fifth terminal and a third node among the nodes on the path, the third node being positioned closer to the second input/output terminal than the second serial arm circuit, wherein the third parallel arm circuit includes a third higher-frequency parallel arm resonator having a resonant frequency higher than the center frequency of the predetermined frequency band, and wherein the third higher-frequency parallel arm resonator is grounded in a relation not common to the first frequency varying circuit and the second higher-frequency parallel arm resonator.

With the above features, parallel arms of the adjacent first and second parallel arm circuits on the side to be grounded are connected to the first terminal, while a parallel arm of the third parallel arm circuit on the side to be grounded is connected to the fifth terminal. Here, the first terminal and the fifth terminal are both connected to the ground outside the acoustic wave filter device, but they are not connected to each other inside the acoustic wave filter device. In other words, the ground for the adjacent first and second parallel arm circuits and the ground for the third parallel arm circuit are not in common to each other. With the above features, therefore, even in the case of a filter circuit configuration including three or more stages of unit circuits each constituted by the serial and parallel arm resonators, the frequency variable filter circuit can be realized in which the number of terminals connected to the ground is reduced, good filter attenuation characteristics are ensured, and in which size reduction and space-saving are obtained.

According to still another aspect of the present disclosure, there is provided a multiplexer including a plurality of acoustic wave filter devices including any of the above-described acoustic wave filter devices.

With the above features, the multiplexer can be realized in which the number of terminals connected to the ground is reduced, and in which size reduction and space-saving are obtained without deteriorating the filter characteristics.

According to still another aspect of the present disclosure, there is provided a radio frequency front-end circuit including a plurality of acoustic wave filter devices including any of the above-described acoustic wave filter devices, and a switch circuit disposed upstream or downstream of the plurality of acoustic wave filter devices, having a plurality of select terminals individually connected to the plurality of acoustic wave filter devices, and having a common terminal selectively connected to the plurality of select terminals.

With the above features, the radio frequency front-end circuit can be realized in which the number of terminals connected to the ground is reduced, and in which size reduction and space-saving are obtained without deteriorating the filter characteristics.

According to still another aspect of the present disclosure, there is provided a communication device including an RF signal processing circuit that processes a radio frequency signal transmitted from or received by an antenna element, and any of the above-described acoustic wave filter devices, the acoustic wave filter device transferring the radio frequency signal between the antenna element and the RF signal processing circuit.

With the above features, the communication device can be realized in which the number of terminals connected to the ground is reduced, and in which size reduction and space-saving are obtained without deteriorating the filter characteristics.

According to the present disclosure, the acoustic wave filter device of frequency variable type, the multiplexer, the radio frequency front-end circuit, and the communication device can be provided in each of which the number of terminals connected to the ground can be reduced and the size can be reduced without deteriorating the filter characteristics.

BRIEF DESCRIPTION OF THE SEVERAL VIEWS OF THE DRAWINGS

FIG. 3 represents examples of a plan view and a sectional view schematically illustrating each of resonators in the acoustic wave filter devices according to Embodiment 1.

FIG. 4A represents graphs depicting impedance characteristics and bandpass characteristics of a tunable filter according to Embodiment 1 when a switch is turned on.

FIG. 4C represents graphs comparatively depicting the impedance characteristics and the bandpass characteristics of the tunable filter according to Embodiment 1 when the switch is turned on and off.

FIG. 5A is a graph depicting bandpass characteristics of the acoustic wave filter device according to Example 1 when switches are turned on.

FIG. 5B is a graph depicting bandpass characteristics of an acoustic wave filter device according to Comparative Example 1 when switches are turned on.

FIG. 5C is a graph depicting bandpass characteristics of an acoustic wave filter device according to Comparative Example 2 when switches are turned on.

FIG. 5D is a graph depicting bandpass characteristics of an acoustic wave filter device according to Comparative Example 3 when switches are turned on.

FIG. 6 is a graph comparatively depicting the bandpass characteristics of the acoustic wave filter devices according to Example 1, Comparative Example 1, Comparative Example 2, and Comparative Example 3 when the switches are turned on.

FIG. 14B illustrates a mount configuration of the acoustic wave filter device according to Modification 3 of Embodiment 1 when viewed in section.

FIG. 17 represents a circuit diagram of an acoustic wave filter device according to Modification 5 of Embodiment 1, and a graph comparatively depicting bandpass characteristics when a switch is turned on and off.

FIG. 18A is a circuit diagram of an acoustic wave filter device according to Modification 6 of Embodiment 1.

DETAILED DESCRIPTION OF THE DISCLOSURE

Figure 1:
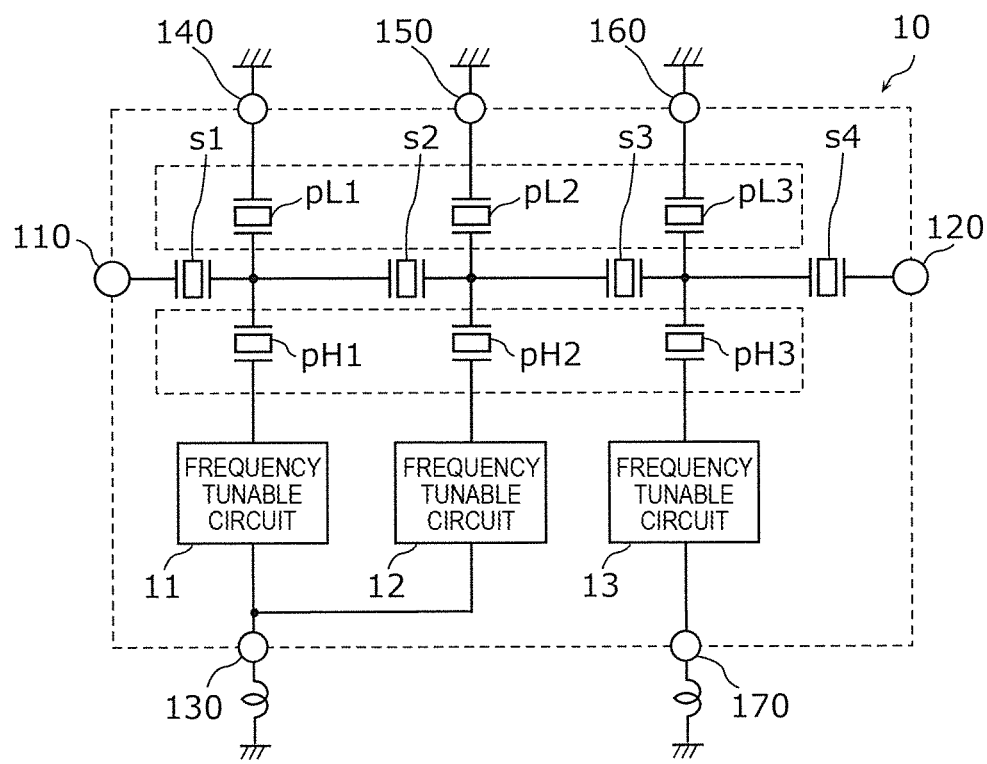
FIG. 1 is a circuit block diagram of an acoustic wave filter device according to Embodiment 1.

Embodiments of the present disclosure will be described in detail below with reference to the examples and the drawings. It is to be noted that any of the following embodiments represents a generic or specific example. Numerical values, shapes, materials, constituent elements, arrangements and connection forms of the constituent elements, etc., which are described in the following embodiments, are merely illustrative, and they are not purported to limit the scope of the present disclosure. Among the constituent elements in the following embodiments, those ones not stated in independent Claims are explained as optional constituent elements. Sizes or relative size ratios of the constituent elements illustrated in the drawings are not always exactly true in a strict sense. In the drawings, substantially the same constituent elements are denoted by the same reference sings, and duplicate description of those constituent elements is omitted or simplified in some cases.

Embodiment 1

[1.1 Configuration of Acoustic Wave Filter Device]

FIG. 1 is a circuit block diagram of an acoustic wave filter device 10 according to Embodiment 1. The acoustic wave filter device 10 illustrated in FIG. 1 includes input/output terminals 110 and 120, ground connection terminals 130, 140, 150, 160 and 170, serial arm resonators s1, s2, s3 and s4, parallel arm resonators pL1 and pH1, parallel arm resonators pL2 and pH2, parallel arm resonators pL3 and pH3, and frequency varying circuits 11, 12 and 13. Here, a resonant frequency of the parallel arm resonator pH1 is higher than that of the parallel arm resonator pL1, a resonant frequency of the parallel arm resonator pH2 is higher than that of the parallel arm resonator pL2, and a resonant frequency of the parallel arm resonator pH3 is higher than that of the parallel arm resonator pL3.

With the above configuration, the acoustic wave filter device 10 constitutes a bandpass filter having a pass band that is formed by the serial arm resonators s1 to s4 and the parallel arm resonators pL1 to pL3. Furthermore, the frequency varying circuits 11, 12 and 13 shift the pass band to the lower frequency side or the higher frequency side. Although circuit configurations of the frequency varying circuits 11, 12 and 13 are described in detail with reference to FIG. 2 and subsequent drawings, those circuits typically have such circuit configurations that a switch element and an impedance element connected in parallel are connected in series to each of the parallel arm resonators pH1 to pH3. When the impedance element is a capacitor, the pass band can be shifted to the higher frequency side, and when the impedance element is an inductor, the pass band can be shifted to the lower frequency side.

The ground connection terminals 130, 140, 150, 160 and 170 are each a terminal connected to an external ground electrode. The ground connection terminal 130 is connected to the external ground electrode without passing the ground connection terminal 170, and the ground connection terminal 170 is connected to the external ground electrode without passing the ground connection terminal 130.

The serial arm resonators s1, s2, s3 and s4 are respectively a fourth serial arm circuit, a first serial arm circuit, a second serial arm circuit, and a third serial arm circuit, which are connected in series in the mentioned order on a path connecting the input/output terminal 110 and the input/output terminal 120. Thus, the serial arm resonator s2 and the serial arm resonator s3 are directly connected to each other without any other serial arm resonator interposed therebetween.

The parallel arm resonator pL1 is a first lower-frequency parallel arm resonator that is connected between the ground connection terminal 140 (second terminal) and a first node among nodes on the path connecting the input/output terminal 110 and the input/output terminal 120, the first node being positioned closer to the input/output terminal 110 than the serial arm resonator s2, and that has a resonant frequency lower than a center frequency of the above-mentioned pass band. The parallel arm resonator pH1 is a first higher-frequency parallel arm resonator that is connected between the first node and the ground connection terminal 130 (first terminal), and that has a resonant frequency higher than the center frequency of the above-mentioned pass band. The resonant frequency of the parallel arm resonator pH1 is lower than an anti-resonant frequency of the serial arm resonator s1.

The frequency varying circuit 11 is a first frequency varying circuit that is connected to the ground connection terminal 130 (first terminal), and that is connected in series to the parallel arm resonator pH1 between the first node and the ground connection terminal 130 (first terminal). The parallel arm resonator pH1 and the frequency varying circuit 11 constitute a first parallel arm circuit.

The parallel arm resonator pL2 is a second lower-frequency parallel arm resonator that is connected between the ground connection terminal 150 (third terminal) and a second node among the nodes on the path connecting the input/output terminal 110 and the input/output terminal 120, the second node being positioned closer to the input/output terminal 120 than the serial arm resonator s2, and that has a resonant frequency lower than the center frequency of the above-mentioned pass band. The parallel arm resonator pH2 is a second higher-frequency parallel arm resonator that is connected between the second node and the ground connection terminal 130 (first terminal), and that has a resonant frequency higher than the center frequency of the above-mentioned pass band. The resonant frequency of the parallel arm resonator pH2 is lower than an anti-resonant frequency of the serial arm resonator s2.

The frequency varying circuit 12 is connected to the parallel arm resonator pH2 and the ground connection terminal 130 (first terminal). The parallel arm resonator pH2 and the frequency varying circuit 12 constitute a second parallel arm circuit.

The parallel arm resonator pL3 is a third lower-frequency parallel arm resonator that is connected between the ground connection terminal 160 (sixth terminal) and a third node among the nodes on the path connecting the input/output terminal 110 and the input/output terminal 120, the third node being positioned closer to the input/output terminal 120 than the serial arm resonator s3, and that has a resonant frequency lower than the center frequency of the above-mentioned pass band. The parallel arm resonator pH3 is a third higher-frequency parallel arm resonator that is connected between the third node and the ground connection terminal 170 (fifth terminal), and that has a resonant frequency higher than the center frequency of the above-mentioned pass band. The frequency varying circuit 13 is connected to the parallel arm resonator pH3 and the ground connection terminal 170 (fifth terminal). The parallel arm resonator pH3 and the frequency varying circuit 13 constitute a third parallel arm circuit.

In FIG. 1, an inductor is illustrated between each of the ground connection terminals 130 and 170 and the ground electrode. The illustrated inductor represents an inductance component that is generated by wiring lines, via holes, etc. for the connection between the acoustic wave filter device and the external ground electrode, and it is an inductor having a small value of about 1 nH or below.

The frequency varying circuits 12 and 13 are not essential constituent elements in the acoustic wave filter device according to the present disclosure. In other words, the parallel arm resonator pH2 may be connected to the ground connection terminal 130, or the parallel arm resonator pH3 may be connected to the ground connection terminal 170.

The expression "A and B are connected" in this and subsequent embodiments implies not only the case that A and B are directly connected, but also the case that A and B are connected with another circuit interposed therebetween.

With the above configuration, since the frequency varying circuit 11 is connected to the parallel arm resonator pH1 having the resonant frequency higher than the center frequency of the filter pass band, a slope or an attenuation pole on the higher frequency side of the filter pass band can be shifted. Thus, since multiple filter characteristics can be constituted by one filter circuit having the above configuration, a frequency variable filter circuit having a small size can be realized. Furthermore, when connecting the parallel arm resonators to the ground, parallel arms of the adjacent parallel arm resonators pH1 and pH2 on the side to be grounded are connected to the common ground connection terminal 130. Therefore, the number of ground terminals provided in the acoustic wave filter device 10 can be reduced. In other words, the ground connection nodes of the adjacent parallel arm resonators pH1 and pH2 are joined in common at the ground connection terminal 130.

From the viewpoint of the filter attenuation characteristics, connecting parallel arms of the parallel arm resonators, which are to be grounded, individually to the ground is more preferable than connecting the parallel arms to the ground after previously connecting them in common within the acoustic wave filter device. The reason is that parasitic inductors, etc. attributable to wiring lines, etc. are generated in the ground. In the case of two adjacent parallel arm resonators, however, even when the parallel arms to be grounded are connected to the ground after previously connecting them in common within the acoustic wave filter device, the filter attenuation characteristics are not deteriorated. Accordingly, the above configuration can realize a frequency variable filter circuit in which the number of terminals connected to the ground can be reduced, and in which size reduction and space-saving can be obtained without deteriorating the filter characteristics.

Furthermore, in the acoustic wave filter device 10 according to this embodiment, the ground connection node of the parallel arm resonator pH3 is connected to the ground connection terminal 170 (fifth terminal). The ground connection terminals 130 and 170 are connected to the ground in common on the external side, but they are not connected to each other within the acoustic wave filter device 10. Thus, the ground connection terminal 130 (first terminal) for the adjacent parallel arm resonators pH1 and pH2 is separated from the ground connection terminal 170 (fifth terminal) for the parallel arm resonator pH3. In other words, the ground connection terminal 130 (first terminal) for the adjacent parallel arm resonators pH1 and pH2 and the ground connection terminal 170 (fifth terminal) for the parallel arm resonator pH3 are not connected in common. As described above, in the case of the two adjacent parallel arm resonators pH1 and pH2, the filter attenuation characteristics are not deteriorated even when the nodes to be grounded are connected to the ground after previously connecting them in common at the ground connection terminal 130. However, the filter attenuation characteristics near the filter pass band are deteriorated when the nodes of the three or more adjacent parallel arm resonators pH1, pH2 and PH3, which nodes are to be grounded, are connected to the ground after previously connecting them in common.

From the above point of view, in the acoustic wave filter device 10 according to this embodiment, the nodes of the two adjacent parallel arm resonators pH1 and pH2 are connected to the same ground connection terminal 130, and the node of the parallel arm resonator pH3 is connected to the different ground connection terminal 170.

As a result, even in the case of a filter circuit configuration including three or more stages of unit circuits each constituted by the serial and parallel arm resonators, the frequency variable filter circuit can be realized in which the number of terminals connected to the ground is reduced, good filter attenuation characteristics are ensured, and in which size reduction and space-saving are obtained.

The parallel arm resonators pL1, pL2 and pL3 may be separately connected to the ground connection terminals 140, 150 and 160, respectively, as illustrated in FIG. 1, or they may be all connected to one ground connection terminal in common.

At least one of the first serial arm circuit and the third serial arm circuit may be a longitudinally-coupled filter resonator including a plurality of acoustic wave resonators.

The above configuration can be adapted for filter characteristics in which enhancement of attenuation, for example, is demanded.

[1.2 Practical Circuit Configuration of Acoustic Wave Filter Device]

Figure 2A:
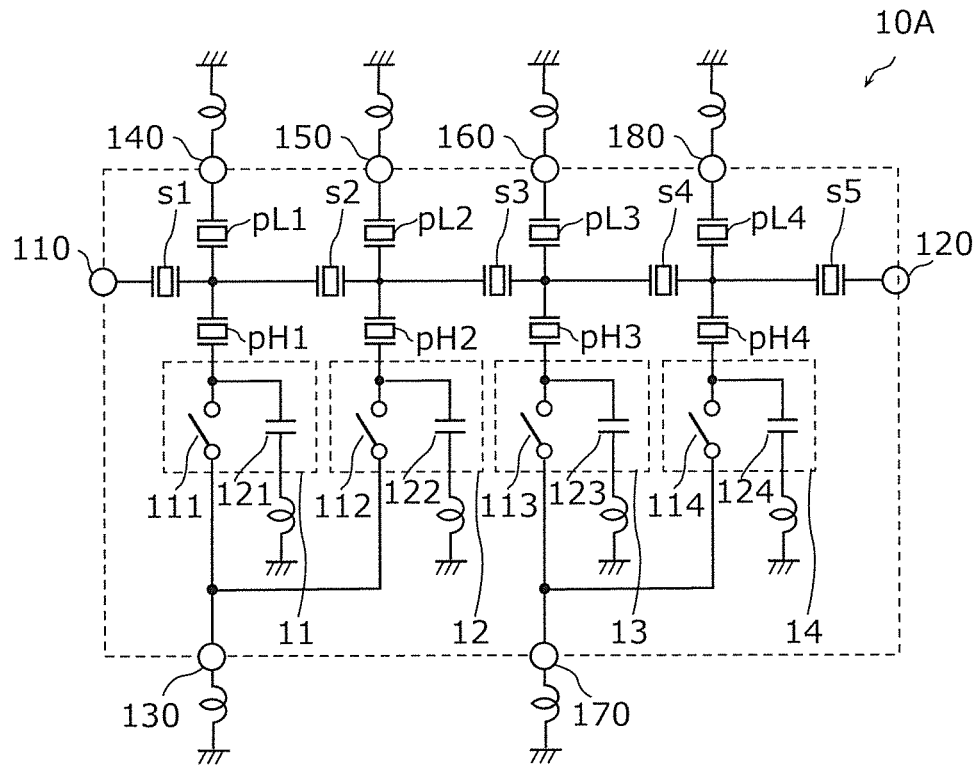
FIG. 2A is a circuit diagram of an acoustic wave filter device according to Embodiment 1.

FIG. 2A is a circuit diagram of an acoustic wave filter device 10A according to Embodiment 1. The acoustic wave filter device 10A illustrated in FIG. 2A represents an example of a practical circuit configuration of the acoustic wave filter device 10 according to Embodiment 1.

The acoustic wave filter device 10A includes input/output terminals 110 and 120, ground connection terminals 130 to 180, serial arm resonators s1 to s5, parallel arm resonators pL1 to pL4, parallel arm resonators pH1 to pH4, and frequency varying circuits 11 to 14.

Comparing with the acoustic wave filter device 10, the acoustic wave filter device 10A according to this embodiment is different in that four unit circuits each constituted by two parallel arm resonators and one serial arm resonator are disposed, and that practical circuit configurations of the frequency varying circuits 11 to 14 are disclosed. In the following, description of the same constituent elements as those in the acoustic wave filter device 10 is omitted, and different constituent elements are mainly described.

The ground connection terminals 130 to 180 are each a terminal connected to an external ground electrode.

The serial arm resonators s1, s2, s3, s4 and s5 are serial arm circuits that are connected in series in the mentioned order on a path connecting the input/output terminal 110 and the input/output terminal 120.

The parallel arm resonator pL4 is a fourth lower-frequency parallel arm resonator that is connected between the ground connection terminal 180 and a fourth node among the nodes on the path connecting the input/output terminal 110 and the input/output terminal 120, the fourth node being positioned closer to the input/output terminal 120 than the serial arm resonator s4, and that has a resonant frequency lower than the center frequency of the above-mentioned pass band. The parallel arm resonator pH4 is a fourth higher-frequency parallel arm resonator that is connected between the fourth node and the ground connection terminal 170 (fifth terminal), and that has a resonant frequency higher than the center frequency of the above-mentioned pass band. The frequency varying circuit 14 is connected to the parallel arm resonator pH4 and the ground connection terminal 170 (fifth terminal). The parallel arm resonator pH4 and the frequency varying circuit 14 constitute a fourth parallel arm circuit.

The frequency varying circuit 11 includes a switch 111 and a capacitor 121. The switch 111 and the capacitor 121 are connected to a parallel arm of the parallel arm resonator pH1, the parallel arm being not connected to the first node.

The switch 111 is connected to the above-mentioned parallel arm and the ground connection terminal 130. The capacitor 121 is connected in parallel between the above-mentioned parallel arm and the ground electrode. Circuit configurations of the frequency varying circuits 12 to 14 are each similar to that of the frequency varying circuit 11. A switch 113 and a capacitor 123 of the frequency varying circuit 13 are connected in parallel between a parallel arm of the parallel arm resonator pH3 and the ground electrode. A switch 114 and a capacitor 124 of the frequency varying circuit 14 are connected in parallel between a parallel arm of the parallel arm resonator pH4 and the ground electrode.

Here, the switch 111 of the frequency varying circuit 11 and the switch 112 of the frequency varying circuit 12 are connected to the ground connection terminal 130. The switch 113 of the frequency varying circuit 13 and the switch 114 of the frequency varying circuit 14 are connected to the ground connection terminal 170 that is different from the ground connection terminal 130.

According to the above configuration, the switches 111 and 112 connected to the adjacent parallel arm resonators pH1 and pH2 are connected to the ground connection terminal 130, and the switches 113 and 114 connected to the adjacent parallel arm resonators pH3 and pH4 are connected to the ground connection terminal 170. Therefore, the number of ground terminals provided in the acoustic wave filter device 10A can be reduced. Furthermore, the switches 111, 112 and 113 connected to the three adjacent parallel arm resonators pH1, pH2 and pH3 are not connected to the same ground connection terminal in common. In other words, the ground connection terminal 130 (first terminal) for the adjacent parallel arm resonators pH1 and pH2 is separated from the ground connection terminal 170 (fifth terminal) for the adjacent parallel arm resonators pH3 and pH4. Thus, even in the case of the filter circuit configuration including three or more stages of unit circuits each constituted by the serial and parallel arm resonators, the frequency variable filter circuit can be realized in which the number of terminals connected to the ground is reduced, good filter attenuation characteristics are ensured, and in which size reduction and space-saving are obtained.

Figure 2B:
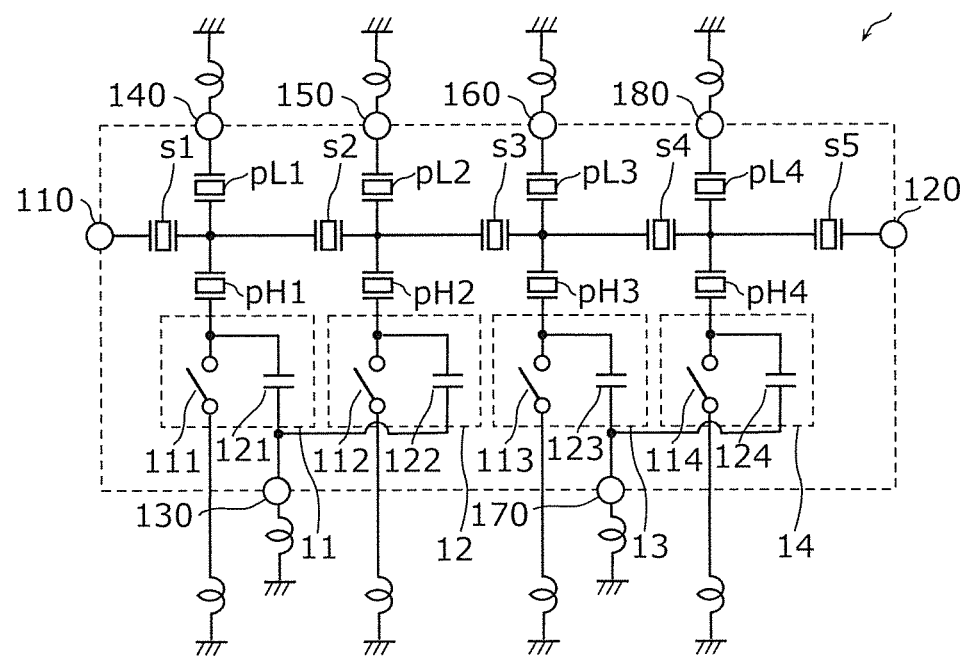
FIG. 2B is a circuit diagram of an acoustic wave filter device according to Modification 1 of Embodiment 1.

FIG. 2B is a circuit diagram of an acoustic wave filter device 10B according to Modification 1 of Embodiment 1. The acoustic wave filter device 10B illustrated in FIG. 2B represents another example of the practical circuit configuration of the acoustic wave filter device 10 according to Embodiment 1.

The acoustic wave filter device 10B includes input/output terminals 110 and 120, ground connection terminals 130 to 180, serial arm resonators s1 to s5, parallel arm resonators pL1 to pL4, parallel arm resonators pH1 to pH4, and frequency varying circuits 11 to 14.

Comparing with the acoustic wave filter device 10, the acoustic wave filter device 10B according to this modification is different in that four unit circuits each constituted by two parallel arm resonators and one serial arm resonator are disposed, and that the practical circuit configurations of the frequency varying circuits 11 to 14 are disclosed. In the following, description of the same constituent elements as those in the acoustic wave filter device 10 is omitted, and different constituent elements are mainly described.

The ground connection terminals 130 to 180 are each a terminal connected to an external ground electrode.

The serial arm resonators s1, s2, s3, s4 and s5 are serial arm circuits that are connected in series in the mentioned order on a path connecting the input/output terminal 110 and the input/output terminal 120.

The frequency varying circuit 11 includes a switch 111 and a capacitor 121. The switch 111 and the capacitor 121 are connected in parallel between a parallel arm of the parallel arm resonator pH1, the parallel arm being not connected to a first serial arm, and the ground electrode. Circuit configurations of the frequency varying circuits 12 to 14 are each similar to that of the frequency varying circuit 11. A switch 112 and a capacitor 122 of the frequency varying circuit 12 are connected in parallel between a parallel arm of the parallel arm resonator pH2 and the ground electrode. A switch 113 and a capacitor 123 of the frequency varying circuit 13 are connected in parallel between a parallel arm of the parallel arm resonator pH3 and the ground electrode. A switch 114 and a capacitor 124 of the frequency varying circuit 14 are connected in parallel between a parallel arm of the parallel arm resonator pH4 and the ground electrode.

Here, the capacitor 121 of the frequency varying circuit 11 and the capacitor 122 of the frequency varying circuit 12 are connected to the ground connection terminal 130. The capacitor 123 of the frequency varying circuit 13 and the capacitor 124 of the frequency varying circuit 14 are connected to the ground connection terminal 170 that is different from the ground connection terminal 130.

According to the above configuration, the capacitors 121 and 122 connected to the adjacent parallel arm resonators pH1 and pH2 are connected to the ground connection terminal 130, and the capacitors 123 and 124 connected to the adjacent parallel arm resonators pH3 and pH4 are connected to the ground connection terminal 170. Therefore, the number of ground terminals provided in the acoustic wave filter device 10B can be reduced. Furthermore, the capacitors 121, 122 and 123 connected to the three adjacent parallel arm resonators pH1, pH2 and pH3 are not connected to the same ground connection terminal in common. In other words, the ground connection terminal 130 (first terminal) for the adjacent parallel arm resonators pH1 and pH2 is separated from the ground connection terminal 170 (fifth terminal) for the adjacent parallel arm resonators pH3 and pH4. Thus, even in the case of the filter circuit configuration including three or more stages of unit circuits each constituted by the serial and parallel arm resonators, the frequency variable filter circuit can be realized in which the number of terminals connected to the ground is reduced, good filter attenuation characteristics are ensured, and in which size reduction and space-saving are obtained.

Figure 2C:
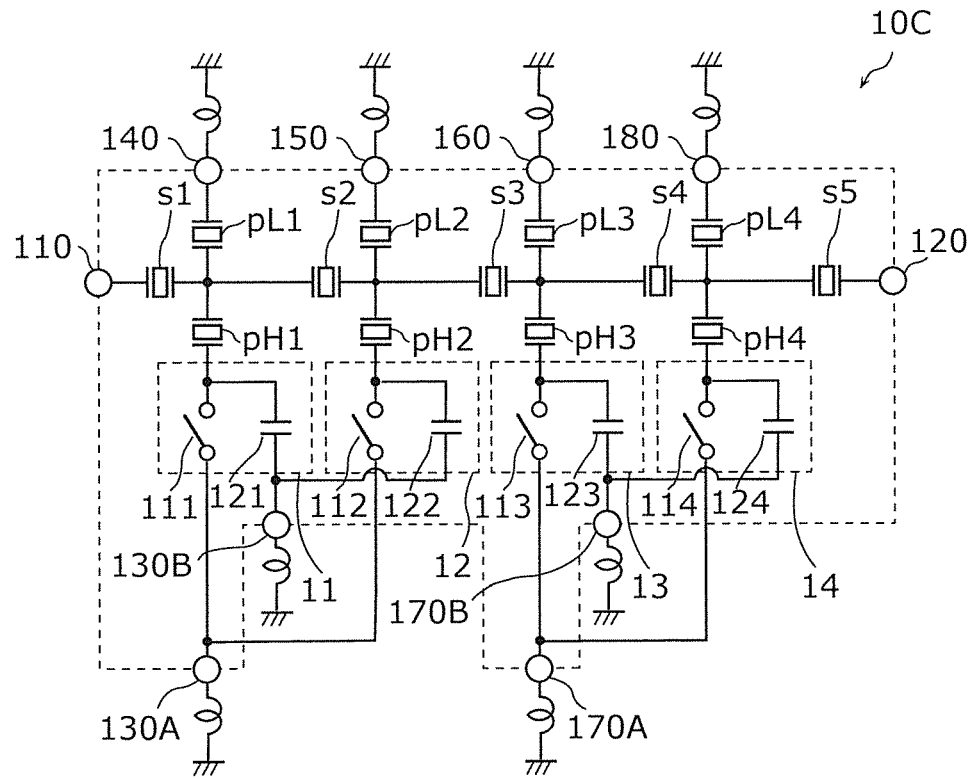
FIG. 2C is a circuit diagram of an acoustic wave filter device according to Modification 2 of Embodiment 1.

FIG. 2C is a circuit diagram of an acoustic wave filter device 10C according to Modification 2 of Embodiment 1. The acoustic wave filter device 10C illustrated in FIG. 2C represents still another example of the practical circuit configuration of the acoustic wave filter device 10 according to Embodiment 1.

The acoustic wave filter device 10C includes input/output terminals 110 and 120, ground connection terminals 130A, 130B, 140, 150, 160, 170A, 170B, and 180, serial arm resonators s1 to s5, parallel arm resonators pL1 to pL4, parallel arm resonators pH1 to pH4, and frequency varying circuits 11 to 14.

Comparing with the acoustic wave filter device 10, the acoustic wave filter device 10C according to this modification is different in that four unit circuits each constituted by two parallel arm resonators and one serial arm resonator are disposed, and that the practical circuit configurations of the frequency varying circuits 11 to 14 are disclosed. In the following, description of the same constituent elements as those in the acoustic wave filter device 10 is omitted, and different constituent elements are mainly described.

The ground connection terminals 130 to 180 are each a terminal connected to an external ground electrode.

The serial arm resonators s1, s2, s3, s4 and s5 are serial arm circuits that are connected in series in the mentioned order on a path connecting the input/output terminal 110 and the input/output terminal 120.

The frequency varying circuit 11 includes a switch 111 and a capacitor 121. The switch 111 and the capacitor 121 are connected in parallel between a parallel arm of the parallel arm resonator pH1 and the ground electrode. Circuit configurations of the frequency varying circuits 12 to 14 are each similar to that of the frequency varying circuit 11. A switch 112 and a capacitor 122 of the frequency varying circuit 12 are connected in parallel between a parallel arm of the parallel arm resonator pH2 and the ground electrode. A switch 113 and a capacitor 123 of the frequency varying circuit 13 are connected in parallel between a parallel arm of the parallel arm resonator pH3 and the ground electrode. A switch 114 and a capacitor 124 of the frequency varying circuit 14 are connected in parallel between a parallel arm of the parallel arm resonator pH4 and the ground electrode.

Here, the switch 111 of the frequency varying circuit 11 and the switch 112 of the frequency varying circuit 12 are connected to the ground connection terminal 130A. The capacitor 121 of the frequency varying circuit 11 and the capacitor 122 of the frequency varying circuit 12 are connected to the ground connection terminal 130B. The switch 113 of the frequency varying circuit 13 and the switch 114 of the frequency varying circuit 14 are connected to the ground connection terminal 170A that is different from the ground connection terminal 130A. The capacitor 123 of the frequency varying circuit 13 and the capacitor 124 of the frequency varying circuit 14 are connected to the ground connection terminal 170B that is different from the ground connection terminal 130B.

According to the above configuration, the switches 111 and 112 connected to the adjacent parallel arm resonators pH1 and pH2 are connected to the ground connection terminal 130A, and the switches 113 and 114 connected to the adjacent parallel arm resonators pH3 and pH4 are connected to the ground connection terminal 170A. The capacitors 121 and 122 connected to the adjacent parallel arm resonators pH1 and pH2 are connected to the ground connection terminal 130B, and the capacitors 123 and 124 connected to the adjacent parallel arm resonators pH3 and pH4 are connected to the ground connection terminal 170B. Therefore, the number of ground terminals provided in the acoustic wave filter device 10C can be reduced. Furthermore, the switches 111, 112 and 113 connected to the three adjacent parallel arm resonators pH1, pH2 and pH3 are not connected to the same ground connection terminal in common. The capacitors 121, 122 and 123 connected to the three adjacent parallel arm resonators pH1, pH2 and pH3 are not connected to the same ground connection terminal in common. In other words, the ground connection terminals 130A and 130B (first terminals) for the adjacent parallel arm resonators pH1 and pH2 are separated from the ground connection terminals 170A and 170B (fifth terminals) for the adjacent parallel arm resonators pH3 and pH4. Thus, even in the case of the filter circuit configuration including three or more stages of unit circuits each constituted by the serial and parallel arm resonators, the frequency variable filter circuit can be realized in which the number of terminals connected to the ground is reduced, good filter attenuation characteristics are ensured, and in which size reduction and space-saving are obtained.

Figure 2D:
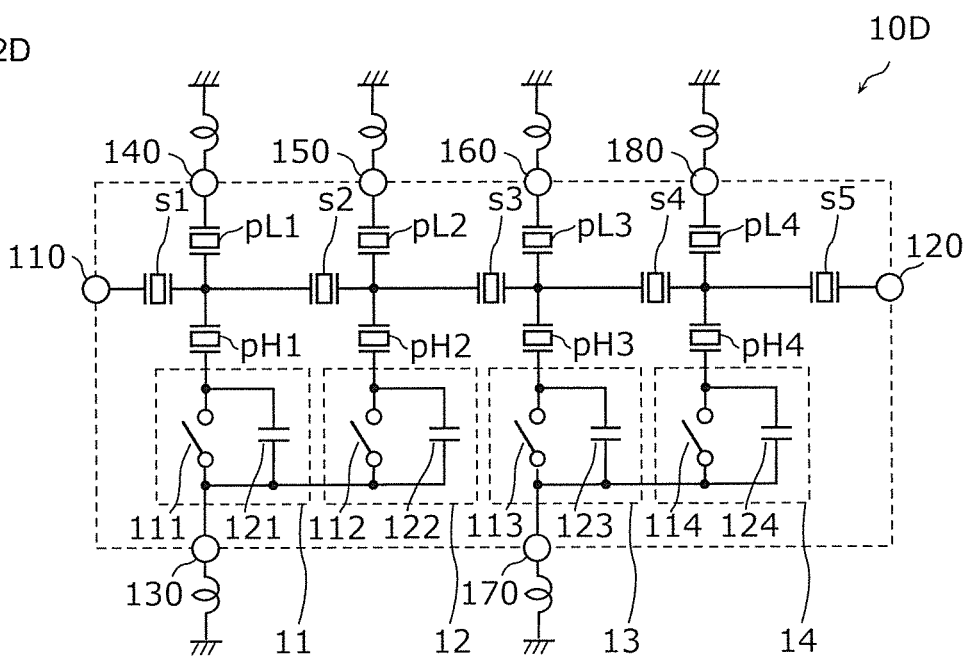
FIG. 2D is a circuit diagram of an acoustic wave filter device according to Modification 3 of Embodiment 1.

FIG. 2D is a circuit diagram of an acoustic wave filter device 10D according to Modification 3 of Embodiment 1. The acoustic wave filter device 10D illustrated in FIG. 2D represents still another example of the practical circuit configuration of the acoustic wave filter device 10 according to Embodiment 1.

The acoustic wave filter device 10D includes input/output terminals 110 and 120, ground connection terminals 130, 140, 150, 160, 170 and 180, serial arm resonators s1 to s5, parallel arm resonators pL1 to pL4, parallel arm resonators pH1 to pH4, and frequency varying circuits 11 to 14.

Comparing with the acoustic wave filter device 10, the acoustic wave filter device 10D according to this embodiment is different in that four unit circuits each constituted by two parallel arm resonators and one serial arm resonator are disposed, and that the practical circuit configurations of the frequency varying circuits 11 to 14 are disclosed. In the following, description of the same constituent elements as those in the acoustic wave filter device 10 is omitted, and different constituent elements are mainly described.

The ground connection terminals 130 to 180 are each a terminal connected to an external ground electrode.

The serial arm resonators s1, s2, s3, s4 and s5 are serial arm circuits that are connected in series in the mentioned order on a path connecting the input/output terminal 110 and the input/output terminal 120.

The frequency varying circuit 11 includes a switch 111 and a capacitor 121. The switch 111 and the capacitor 121 are connected in parallel between a parallel arm of the parallel arm resonator pH1 and the ground electrode. Circuit configurations of the frequency varying circuits 12 to 14 are each similar to that of the frequency varying circuit 11. A switch 112 and a capacitor 122 of the frequency varying circuit 12 are connected in parallel between a parallel arm of the parallel arm resonator pH2 and the ground electrode. A switch 113 and a capacitor 123 of the frequency varying circuit 13 are connected in parallel between a parallel arm of the parallel arm resonator pH3 and the ground electrode. A switch 114 and a capacitor 124 of the frequency varying circuit 14 are connected in parallel between a parallel arm of the parallel arm resonator pH4 and the ground electrode.

Here, the switch 111 and the capacitor 121 of the frequency varying circuit 11 and the switch 112 and the capacitor 122 of the frequency varying circuit 12 are connected to the ground connection terminal 130. The switch 113 and the capacitor 123 of the frequency varying circuit 13 and the switch 114 and the capacitor 124 of the frequency varying circuit 14 are connected to the ground connection terminal 170 that is different from the ground connection terminal 130.

According to the above configuration, the switches 111 and 112 and the capacitors 121 and 122 connected to the adjacent parallel arm resonators pH1 and pH2 are connected to the ground connection terminal 130, and the switches 113 and 114 and the capacitors 123 and 124 connected to the adjacent parallel arm resonators pH3 and pH4 are connected to the ground connection terminal 170. Therefore, the number of ground terminals provided in the acoustic wave filter device 10D can be reduced. Furthermore, the switches 111, 112 and 113 connected to the three adjacent parallel arm resonators pH1, pH2 and pH3 are not connected to the same ground connection terminal in common. The capacitors 121, 122 and 123 connected to the three adjacent parallel arm resonators pH1, pH2 and pH3 are not connected to the same ground connection terminal in common. In other words, the ground connection terminal 130 (first terminal) for the adjacent parallel arm resonators pH1 and pH2 is separated from the ground connection terminal 170 (fifth terminal) for the adjacent parallel arm resonators pH3 and pH4. Thus, even in the case of the filter circuit configuration including three or more stages of unit circuits each constituted by the serial and parallel arm resonators, the frequency variable filter circuit can be realized in which the number of terminals connected to the ground is reduced, good filter attenuation characteristics are ensured, and in which size reduction and space-saving are obtained.

The switches 111 to 114 may be each, for example, a FET (Field Effect Transistor) switch made of GaAs or a CMOS (Complementary Metal Oxide Semiconductor), or a diode switch. Since the switches 111 to 114 can be constituted using one FET switch or one diode switch, the acoustic wave filter devices 10A to 10D can be realized in a small size. Furthermore, the switches 111 to 114 are preferably arranged in one package. This enables the filter device to be realized in a smaller size.

The capacitors 121 to 124 may be each a variable impedance element. The variable impedance element may be, for example, a tunable capacitor such as a varicap or a DTC (Digitally Tunable Capacitor), or a tunable inductor utilizing MEMS (Micro Electro Mechanical Systems). A frequency variable width can be finely adjusted with use of such a component.

[1.3 Resonator Structure in Acoustic Wave Filter Device]

In this embodiment, the resonators constituting the acoustic wave filter devices 10A to 10D are each a resonator utilizing a surface acoustic wave. Thus, because acoustic wave filter devices 10A to 10D can be constituted by IDT (InterDigital Transducer) electrodes formed on a piezoelectric substrate, the small-sized and low-height filter device having bandpass characteristics with high sharpness can be realized. The structure of a surface acoustic wave resonator will be described below.

FIG. 3 represents examples of a plan view and a sectional view schematically illustrating each of resonators in the acoustic wave filter devices 10A to 10D according to Embodiment 1. FIG. 3 represents, by way of example, a schematic plan view and a schematic sectional view illustrating the structure of the serial arm resonator s1 among the resonators constituting each of the acoustic wave filter devices 10A to 10D. It is to be noted that the serial arm resonator illustrated in FIG. 3 is merely purported to explain a typical structure of the plurality of above-mentioned resonators, and that the number and length of electrode fingers constituting the electrode are not limited to those illustrated in the drawing.

The resonators in the acoustic wave filter devices 10A to 10D are each constituted by a piezoelectric substrate 100 and IDT electrodes 11a and 11b each having a comb-like shape.

As illustrated in the plan view of FIG. 3, the pair of the IDT electrodes 11a and 11b opposing to each other are formed on the piezoelectric substrate 100. The IDT electrode 11a is constituted by a plurality of electrode fingers 110a parallel to one another, and a busbar electrode 111a interconnecting the electrode fingers 110a. The IDT electrode 11b is constituted by a plurality of electrode fingers 110b parallel to one another, and a busbar electrode 110b interconnecting the electrode fingers 111b. The electrode fingers 110a and 110b are formed side by side along a direction perpendicular to the propagation direction of the surface acoustic wave.

The IDT electrode 104 constituted by the electrode fingers 110a and 110b and the busbar electrodes 111a and 111b has a multilayer structure made up of a close contact layer 101 and a main electrode layer 102, as illustrated in the sectional view of FIG. 3.

The close contact layer 101 is a layer acting to increase adhesion between the piezoelectric substrate 100 and the main electrode layer 102. For example, Ti is used as a material of the close contact layer 101. A film thickness of the close contact layer 101 is 12 nm, for example.

For example, Al containing 1% of Cu is used as a material of the main electrode layer 102. A film thickness of the main electrode layer 102 is 162 nm, for example.

A protective layer 103 is formed so as to cover the IDT electrodes 11a and 11b. The protective layer 103 is a layer aiming to protect the main electrode layer 102 from external environments, to adjust frequency-temperature characteristics, and to increase humidity resistance. The protective layer 103 is made of a film containing, as a main ingredient, silicon dioxide, for example.

The materials forming the close contact layer 101, the main electrode layer 102, and the protective layer 103 are not limited to the above-mentioned ones. The IDT electrode 104 is not always required to have the above-described multilayer structure. In another example, the IDT electrode 104 may be made of a metal such as Ti, Al, Cu, Pt, Au, Ag or Pd, or an alloy of any of those metals. Alternatively, the IDT electrode 104 may be made using a plurality of multilayer bodies each made of the above-mentioned metal or alloy. The protective layer 103 is not always required to be formed.

The piezoelectric substrate 100 is made of, for example, a $LiTaO_3$ piezoelectric single crystal, a $LiNbTaO_3$ piezoelectric single crystal, or a piezoelectric ceramic. The piezoelectric substrate 100 may be a substrate having piezoelectricity at least in its part. In an example, the piezoelectric substrate 100 may be constituted as a multilayer body made up of a film including a piezoelectric thin film formed on its surface and having an acoustic velocity different from that of the piezoelectric thin film, a support substrate, and so on. In another example, the piezoelectric substrate 100 may be a multilayer body including a higher acoustic velocity support substrate and a piezoelectric thin film formed on the higher acoustic velocity support substrate, a multilayer body including a higher acoustic velocity support substrate, a lower acoustic velocity film formed on the higher acoustic velocity support substrate, and a piezoelectric thin film formed on the lower acoustic velocity film, or a multilayer body including a support substrate, a higher acoustic velocity film formed on the support substrate, a lower acoustic velocity film formed on the higher acoustic velocity film, and a piezoelectric thin film formed on the lower acoustic velocity film.

The structure of each resonator in the acoustic wave filter devices 10A to 10D is not limited to the structure illustrated in FIG. 3. In another example, the IDT electrode 104 may be formed of a single layer of a metal film instead of the multilayer structure of metal films.

Each resonator in the acoustic wave filter devices 10A to 10D is not always required to be the surface acoustic wave resonator, and it may be a resonator utilizing a BAW (Bulk Acoustic Wave). In other words, each resonator is just required to have a "resonance point", i.e., a peculiar point at which impedance is locally minimized (ideally, a point at which impedance becomes 0), and an "anti-resonance point", i.e., a peculiar point at which impedance is locally maximized (ideally, a point at which impedance becomes infinite).

[1.4 Frequency Varying Operation in Acoustic Wave Filter Device]

Bandpass characteristics of the acoustic wave filter devices 10A to 10D illustrated in FIGS. 2A to 2D take first bandpass characteristics when the switches 111 to 114 are all turned on, and take second bandpass characteristics different from the first bandpass characteristics when the switches 111 to 114 are all turned off.

The frequency varying operations in the acoustic wave filter devices 10A to 10D will be described below with reference to FIGS. 4A to 4C.

In the following, a tunable filter 22A (frequency variable filter) resulting from simplifying the circuit configurations of the acoustic wave filter devices 10A to 10D is used for the purpose of explaining the frequency varying operations. More specifically, the acoustic wave filter devices 10A to 10D have a multistage configuration on an assumption that a combination of one serial arm resonator and two parallel arm resonators constitutes one stage. On the other hand, the tunable filter 22A has one among the multiple stages of the above-described combination in the acoustic wave filter devices 10A to 10D.

Although a difference occurs in insertion loss in the pass band and attenuation in the attenuation band between the acoustic wave filter devices 10A to 10D and the simplified tunable filter 22A, the operation principle is substantially the same therebetween.

Figure 4A:
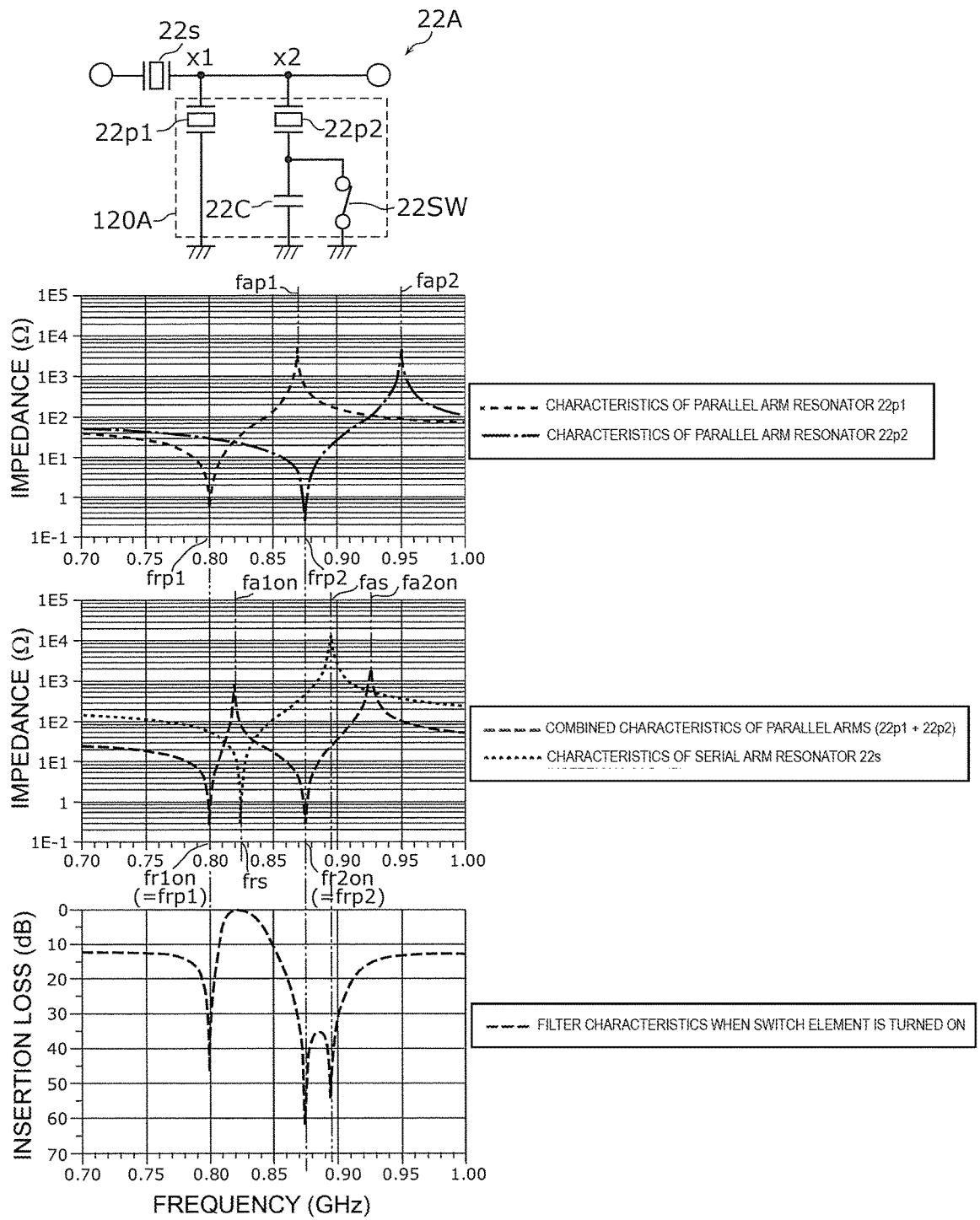

FIG. 4A represents graphs depicting impedance characteristics and bandpass characteristics of the tunable filter 22A when a switch 22SW is turned on. FIG. 4B represents graphs depicting impedance characteristics and bandpass characteristics of the tunable filter 22A when the switch 22SW is turned off. FIG. 4C represents graphs comparatively depicting the impedance characteristics and the bandpass characteristics of the tunable filter 22A when the switch 22SW is turned on and off. The tunable filter 22A illustrated in FIGS. 4A to 4C is assumed for the purpose of explaining the operation principle of the acoustic wave filter devices 10A to 10D according to Embodiment 1.

A serial arm resonator 22s in a circuit configuration illustrated in an upper zone of FIG. 4A corresponds to, for example, the serial arm resonator s1 in FIG. 2A, and parallel arm resonators 22p1 and 22p2 in the circuit configuration illustrated in the upper zone of FIG. 4A correspond to, for example, the parallel arm resonators pL1 and pH1 in FIG. 2A, respectively. A capacitor 22C in the circuit configuration illustrated in the upper zone of FIG. 4A corresponds to, for example, the capacitor 121 in FIG. 2A. A switch 22SW in the circuit configuration illustrated in the upper zone of FIG. 4A corresponds to, for example, the switch 111 in FIG. 2A. The acoustic wave filter device 10A illustrated in FIG. 2A includes the circuit configuration of the tunable filter 22A illustrated in FIG. 4A in four stages. A ground connection terminal connected to the switch 22SW in FIG. 4A is shared in common by adjacent switches including the switch 22SW, and ground terminals connected to three or more adjacent switches, including the switch 22SW, are not connected in common.

First, impedance characteristics of each resonator alone are described with reference to FIG. 4A. For the sake of convenience, the following point is assumed for not only the resonator, but also a parallel arm circuit. A peculiar point at which impedance is locally minimized (ideally, a point at which impedance becomes 0) is called a "resonance point", and a frequency at the resonance point is called a "resonant frequency". A peculiar point at which impedance is locally maximized (ideally, a point at which impedance becomes infinite) is called an "anti-resonance point", and a frequency at the anti-resonance point is called an "anti-resonant frequency".

As illustrated in FIG. 4A, the serial arm resonator 22s, the parallel arm resonator 22p1, and the parallel arm resonator 22p2 have impedance characteristics described below. Specifically, the parallel arm resonator 22p1 has a resonant frequency frp1 and an anti-resonant frequency fap1 (here, frp1<fap1 is satisfied). The parallel arm resonator 22p2 has a resonant frequency frp2 and an anti-resonant frequency fap2 (here, frp1<frp2<fap2 is satisfied). The serial arm resonator 22s has a resonant frequency frs and an anti-resonant frequency fas (here, frs<fas and frp1<frs<frp2 is satisfied).

Impedance characteristics of a parallel arm circuit 120A are described below.

As illustrated in FIG. 4A, when the switch 22SW is turned on, the impedance characteristics of the parallel arm circuit 120A are not affected by the capacitor 22C. Thus, in this state, the impedance characteristics of the parallel arm circuit 120A are given by combined characteristics of the two parallel arm resonators (i.e., the parallel arm resonators 22p1 and 22p2) (denoted by "COMBINED CHARACTERISTICS OF PARALLEL ARMS (22p1+22p2)" in FIG. 4A).

More specifically, when the switch 22SW is turned on, the parallel arm circuit 120A has the following impedance characteristics.

The parallel arm circuit 120A has two resonant frequencies fr1on and fr2on (here, fr1on=frp1 and fr2on=frp2 are satisfied). In other words, the impedance of the parallel arm circuit 120A is locally minimized at (i) the resonant frequency of the parallel arm resonator 22p1 constituting the parallel arm circuit 120A, and (ii) the resonant frequency of the parallel arm resonator 22p2.

Furthermore, the parallel arm circuit 120A has two anti-resonant frequencies fa1on and fa2on (here, fr1on<fa1on<fr2on<fa2on, fa1on<fap1, and fa2on<fap2 are satisfied). In other words, the impedance of the parallel arm circuit 120A is locally maximized at (i) a frequency between the resonant frequencies of the parallel arm resonators 22p1 and 22p2 constituting the parallel arm circuit 120A, and (ii) a frequency between the anti-resonant frequencies of those two parallel arm resonators 22p1 and 22p2.

The reason why fa1on<fap1 is held resides in that the parallel arm resonator 22p2 acts as a parallel capacitor with respect to the parallel arm resonator 22p1 in a frequency band near the anti-resonant frequency fap1 of the parallel arm resonator 22p1. The reason why fa2on<fap2 is held resides in that the parallel arm resonator 22p1 acts as a parallel capacitor with respect to the parallel arm resonator 22p2 in a frequency band near the anti-resonant frequency fap2 of the parallel arm resonator 22p2.

In more detail, when the switch 22SW is turned on in the parallel arm circuit 120A, resonance between a resonator (here, the parallel arm resonator 22p1) and a capacitor (here, the parallel arm resonator 22p2) occurs as frequency increases from the resonant frequency frp1 at which the parallel arm resonator 22p1 resonates, and then comes closer to the anti-resonant frequency fap1. To explain using a conceptual equivalent circuit of the parallel arm circuit 120A, resonance occurs between an LC serial circuit constituting a resonator (i.e., the parallel arm resonator 22p1) and a capacitor connected in parallel thereto, namely a capacitor (i.e., the parallel arm resonator 22p2) connected in parallel to the resonator. In the parallel arm circuit 120A, therefore, the impedance is locally maximized (anti-resonance) at a frequency (fa1on) lower than the anti-resonant frequency fap1. Through the similar mechanism, also when frequency increases from the resonant frequency frp2 and then comes closer to the anti-resonant frequency fap2, the impedance is locally maximized (anti-resonance) at a frequency (fa2on) lower than the anti-resonant frequency fap2.

In trying to constitute a bandpass filter using a ladder resonator, the anti-resonant frequency fa1on of the parallel arm circuit 120A and the resonant frequency frs of the serial arm resonator 22s are set close to each other. Thus, when the switch 22SW is turned on, a band near the resonant frequency fr1on in which the impedance of the parallel arm circuit 120A comes closer to 0 serves as a lower-frequency side stop band. When frequency increases from the resonant frequency fr1on, the impedance of the parallel arm circuit increases near the anti-resonant frequency fa1on, and the impedance of the serial arm resonator 22s comes closer to 0 near the resonant frequency frs. Accordingly, a band near the anti-resonant frequency fa1on and the resonant frequency frs serves as a signal pass band in a signal path (serial arm) extending from the input/output terminal 110 to the input/output terminal 120. When frequency further increases and comes closer to the resonant frequency fr2on and the anti-resonant frequency fas, the impedance of the serial arm resonator 22s increases and the impedance of the parallel arm circuit 120A comes closer to 0, thus providing a higher-frequency side stop band.

Stated in another way, in the turned-on state of the switch 22SW, the tunable filter 22A has first bandpass characteristics that a pass band is defined by the anti-resonant frequency fa1on and the resonant frequency frs, that a pole (attenuation pole) on the lower frequency side of the pass band is defined by the resonant frequency fr1on, and that a pole (attenuation pole) on the higher frequency side of the pass band is defined by the resonant frequency fr2on and the anti-resonant frequency fas.

The anti-resonant frequency fa2on of the parallel arm circuit does not impose a significant influence upon the bandpass characteristics of the tunable filter 22A (here, the first bandpass characteristics) because the impedance of the serial arm resonator 22s at the anti-resonant frequency fa2on is high.

Figure 4B:
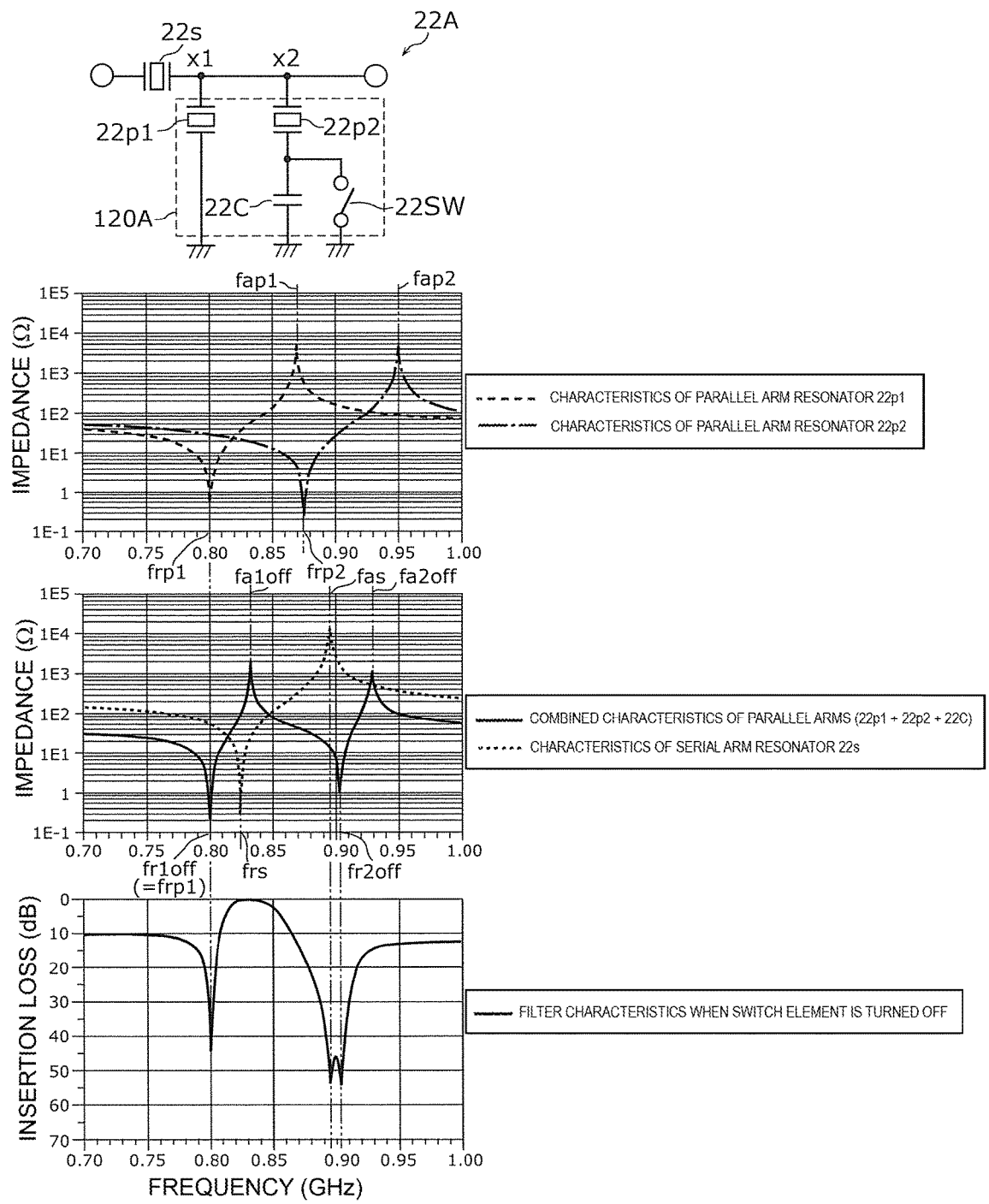
FIG. 4B represents graphs depicting impedance characteristics and bandpass characteristics of the tunable filter according to Embodiment 1 when a switch is turned off.

On the other hand, as illustrated in FIG. 4B, when the switch 22SW is turned off, the impedance characteristics of the parallel arm circuit 120A are affected by the capacitor 22C. Thus, in this state, the impedance characteristics of the parallel arm circuit 120A are given by combined characteristics of the two parallel arm resonators (i.e., the parallel arm resonators 22p1 and 22p2) and the capacitor 22C (denoted by "COMBINED CHARACTERISTICS OF PARALLEL ARMS (22p1+22p2+22C)" in FIG. 4A).

More specifically, when the switch 22SW is turned off, the parallel arm circuit 120A has the following impedance characteristics.

The parallel arm circuit 120A has two resonant frequencies fr1off and fr2off and two anti-resonant frequencies fa1off and fa2off (here, fr1off<fa1off<fr2off<fa2off, fa1off<fap1, frp2<fr2off, and fa2off<fap2 are satisfied). In other words, the impedance of the parallel arm circuit 120A is locally minimized at (i) the resonant frequency of the parallel arm resonator 22p1 constituting the parallel arm circuit 120A, and (ii) a frequency higher than the resonant frequency of the parallel arm resonator 22p2. Furthermore, the impedance of the parallel arm circuit 120A is locally maximized at (i) a frequency between the resonant frequencies of the parallel arm resonators 22p1 and 22p2 constituting the parallel arm circuit 120A, and (ii) a frequency between the anti-resonant frequencies of those two parallel arm resonators 22p1 and 22p2.

The reason why fa1off<fap1 is held resides in that the parallel arm resonator 22p2 acts as a capacitor with respect to the parallel arm resonator 22p1 in a frequency band near the anti-resonant frequency fap1 of the parallel arm resonator 22p1. The reason why frp2<fr2off is held resides in that resonance between the parallel arm resonator 22p2 and the capacitor 22C occurs in a frequency band near the resonant frequency frp2 of the parallel arm resonator 22p2. The reason why fa2off<fap2 is held resides in that the parallel arm resonator 22p1 acts as a capacitor with respect to the parallel arm resonator 22p2 in a frequency band near the anti-resonant frequency fap2 of the parallel arm resonator 22p2.

In more detail, when the switch 22SW is turned off in the parallel arm circuit 120A, resonance between a resonator (here, the parallel arm resonator 22p1) and a capacitor (here, the parallel arm resonator 22p2 and the capacitor 22C) occurs as frequency increases from the resonant frequency frp1 at which the parallel arm resonator 22p1 resonates, and then comes closer to the anti-resonant frequency fap1. To explain using a conceptual equivalent circuit of the parallel arm circuit 120A, resonance occurs between an LC serial circuit constituting a resonator (i.e., the parallel arm resonator 22p1) and a capacitor connected in parallel thereto, namely a capacitor (i.e., the parallel arm resonator 22p2 and the capacitor 22C) connected in parallel to the resonator. In the parallel arm circuit 120A, therefore, the impedance is locally maximized (anti-resonance) at a frequency (fa1off) lower than the anti-resonant frequency fap1. Through the similar mechanism, also when frequency increases from the resonant frequency frp2 and then comes closer to the anti-resonant frequency fap2, the impedance is locally maximized (anti-resonance) at a frequency (fa2off) lower than the anti-resonant frequency fap2. Furthermore, resonance between the parallel arm resonator 22p2 and the capacitor 22C occurs as frequency increases from the anti-resonant frequency fa1off and then comes closer to the resonant frequency frp2. To explain using a conceptual equivalent circuit of the parallel arm circuit 120A, resonance occurs between an LC serial circuit constituting a resonator (i.e., the parallel arm resonator 22p2) and a capacitor connected in parallel thereto, namely a capacitor (i.e., the capacitor 22C) connected in series to the resonator. In the parallel arm circuit, therefore, the impedance is locally minimized (resonance) at a frequency (fr2off) higher than the resonant frequency frp2.

Comparing the anti-resonant frequencies on the lower frequency side between the cases when the switch 22SW is turned off and on, fa1on<fa1off is satisfied. This is attributable to the fact that, when the switch 22SW is turned off, a frequency variable width from the anti-resonant frequency fap1 of the parallel arm resonator 22p1 is narrower due to the influence of the capacitor 22C than when the switch 22SW is turned on.

Comparing the resonant frequencies on the higher frequency side between the cases when the switch 22SW is turned off and on, fr2on<fr2off is satisfied. This is attributable to the fact that, when the switch 22SW is turned off, fr2on (=frp2)<fr2off is held, as described above, due to the influence of the capacitor 22C relative to the case where the switch 22SW is turned on.

In trying to constitute a bandpass filter using a ladder resonator, the anti-resonant frequency fa1off of the parallel arm circuit 120A and the resonant frequency frs of the serial arm resonator 22s are set close to each other. Thus, when the switch 22SW is turned off, a band near the resonant frequency fr1off in which the impedance of the parallel arm circuit 120A comes closer to 0 serves as a lower-frequency side stop band. When frequency increases from the resonant frequency fr1off, the impedance of the parallel arm circuit increases near the anti-resonant frequency fa1off, and the impedance of the serial arm resonator 22s comes closer to 0 near the resonant frequency frs. Accordingly, a band near the anti-resonant frequency fa1off and the resonant frequency frs serves as a signal pass band in the signal path (serial arm) extending from the input/output terminal 110 to the input/output terminal 120. When frequency further increases and comes closer to the resonant frequency fr2off and the anti-resonant frequency fas, the impedance of the serial arm resonator 22s increases and the impedance of the parallel arm circuit 120A comes closer to 0, thus providing a higher-frequency side stop band.

In other words, in the turned-off state of the switch 22SW, the tunable filter 22A has the second bandpass characteristics that a pass band is defined by the anti-resonant frequency fa1off and the resonant frequency frs, that a pole (attenuation pole) on the lower frequency side of the pass band is defined by the resonant frequency fr1off, and that a pole (attenuation pole) on the higher frequency side of the pass band is defined by the resonant frequency fr2off and the anti-resonant frequency fas.

The anti-resonant frequency fa2off of the parallel arm circuit does not impose a significant influence upon the bandpass characteristics of the tunable filter 22A (here, the second bandpass characteristics) as with the anti-resonant frequency fa2on described above because the impedance of the serial arm resonator 22s at the anti-resonant frequency fa2off is high.

The impedance characteristics and the bandpass characteristics obtained when the switch 22SW in the tunable filter 22A is turned on and when the switch 22SW is turned off will be compared in detail below with reference to FIG. 4C.

As illustrated in FIG. 4C, when the switch 22SW is turned off from on, the impedance characteristics of the parallel arm circuit 120A change as follows. In the parallel arm circuit 120A, each of the resonant frequency on the higher frequency side between the two resonant frequencies and the anti-resonant frequency on the lower frequency side between the two anti-resonant frequencies shifts to the higher frequency side. In this embodiment, since only the parallel arm resonator 22p2 is connected in series to the capacitor 22C and the switch 22SW, the resonant frequency on the higher frequency side between the two resonant frequencies shifts from fr2on to fr2off, i.e., to the higher frequency side (see a region B in the drawing). Furthermore, the anti-resonant frequency on the lower frequency side shifts from fa1on to fa1off, i.e., to the higher frequency side (see a region A in the drawing).

Here, the anti-resonant frequency of the parallel arm circuit 120A on the lower frequency side and the resonant frequency thereof on the higher frequency side define an attenuation slope on the higher frequency side of the pass band of the tunable filter 22A, and they shift to the higher frequency side as described above. As illustrated in a lower zone of FIG. 4C, therefore, with the switch 22SW turned off from on, the bandpass characteristics of the tunable filter 22A shift to the higher frequency side while the attenuation slope on the higher frequency side of the pass band maintains high sharpness (see a black arrow in the drawing). Stated in another way, the tunable filter 22A can shift the bandpass characteristics to the higher frequency side without dropping a shoulder of the attenuation slope on the higher frequency side of the pass band (see a region C in the drawing) while the attenuation pole on the higher frequency side of the pass band is shifted to the higher frequency side (see a region D in the drawing).

Although the impedance element is illustrated as the capacitor 22C in FIGS. 4A to 4C, the impedance element is not limited to the capacitor, and it may be an inductor. In such a case, the shift direction of the attenuation slope with turning on/off of the switch 22SW is different from that in comparison with the tunable filter 22A illustrated in FIGS. 4A to 4C. More specifically, the attenuation slope in the second bandpass characteristics when the switch 22SW is turned off shifts to the lower frequency side from that in the first bandpass characteristics when the switch 22SW is turned on. Also, in that case, a higher-frequency side end of the pass band can be changed while dropping of a shoulder of the pass band is suppressed.

[1.5 Filter Characteristics of Acoustic Wave Filter Device]

The following description is made about an example in which the acoustic wave filter devices 10A and 10B are each applied to a tunable filter that switches over Band26 (transmit band: 814 to 849 MHz, receive band: 859 to 894 MHz) and Band27 (transmit band: 807 to 824 MHz, receive band: 852 to 869 MHz) of LTE (Long Term Evolution).

First, the case of applying the acoustic wave filter device 10A is described. When the switches 111 to 114 are all turned on in the circuit illustrated in FIG. 2A, the acoustic wave filter device 10A has filter characteristics including a pass band assigned as the transmit band (807 to 824 MHz) of Band27. When the switches 111 to 114 are all turned off, the acoustic wave filter device 10A has filter characteristics including a pass band assigned as the transmit band (814 to 849 MHz) of Band26.

Figure 5A:
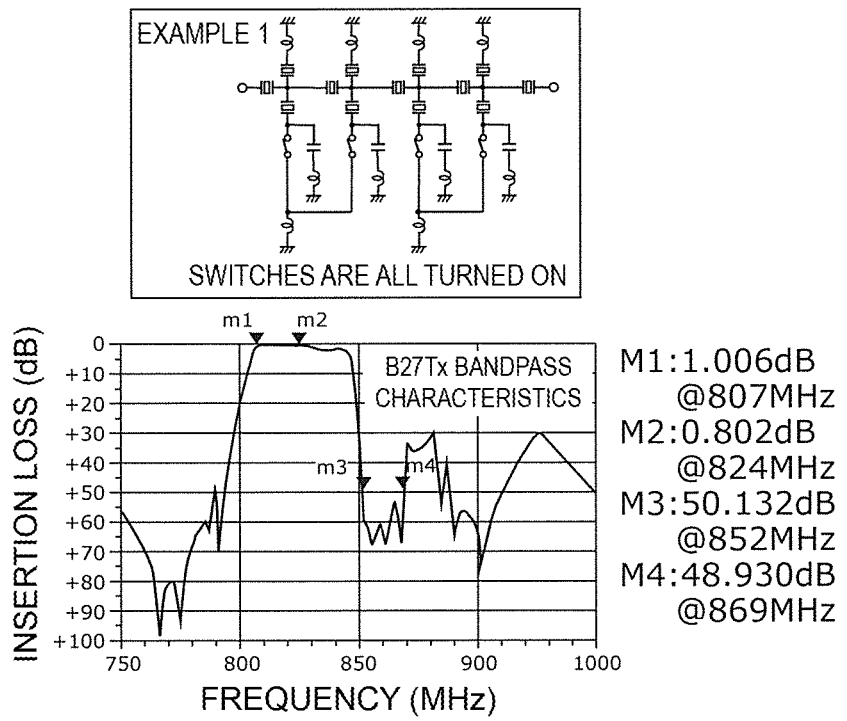

FIG. 5A is a graph depicting bandpass characteristics of the acoustic wave filter device 10A according to Example 1 when the switches are turned on. FIG. 5A represents the filter characteristics including a pass band assigned as the transmit band of Band27 when the switches 111 to 114 are all turned on. When the switches 111 to 114 are all turned on, the parallel arm resonators are connected to the external ground electrode from the switches via the ground connection terminals 130 to 170. In this example, an attenuation in the receive band of Band27 is obtained at a level of 48 dB or more.

Figure 5B:
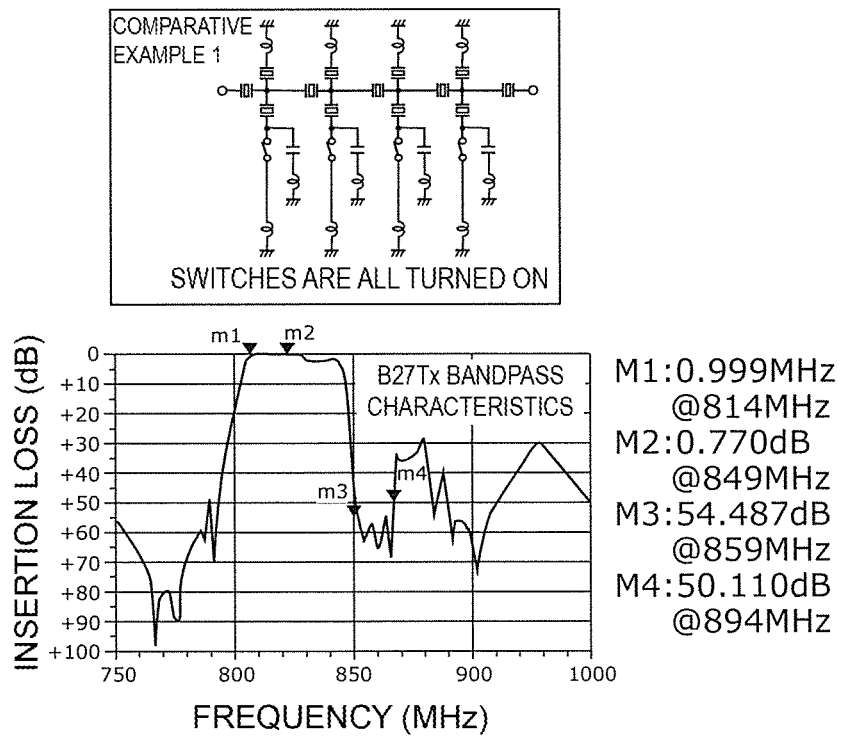

FIG. 5B is a graph depicting bandpass characteristics of an acoustic wave filter device according to Comparative Example 1 when switches are turned on. The acoustic wave filter device according to Comparative Example 1 is different from the acoustic wave filter device 10A only in that the parallel arm resonators pH1 to pH4 are separately connected to the external ground electrode. In the case of Comparative Example 1, an attenuation in the receive band of Band27 is obtained at a level of 50 dB or more.

Figure 5C:
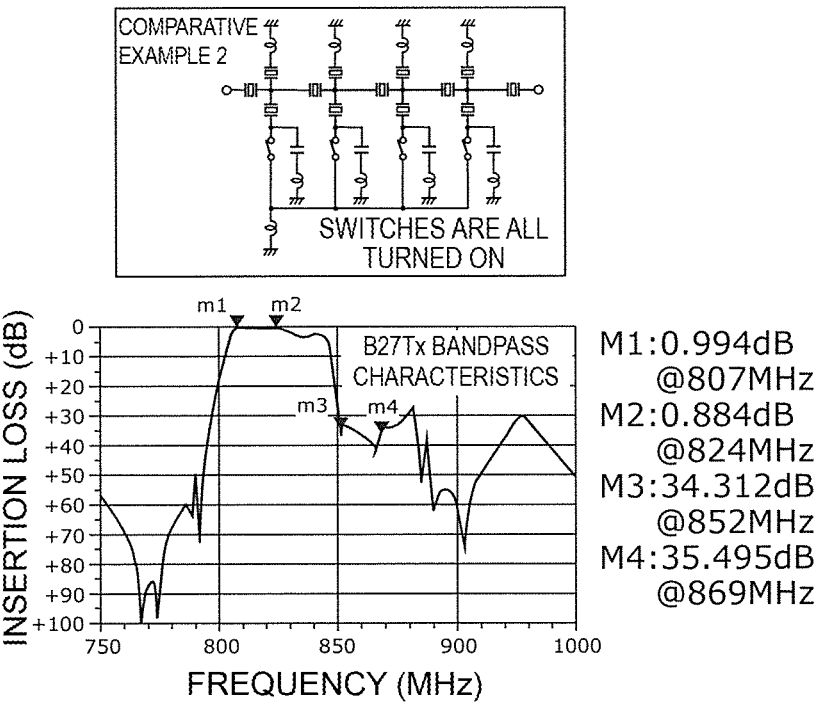

FIG. 5C is a graph depicting bandpass characteristics of an acoustic wave filter device according to Comparative Example 2 when switches are turned on. The acoustic wave filter device according to Comparative Example 2 is different from the acoustic wave filter device 10A only in that the parallel arm resonators pH1 to pH4 are all connected to the same ground connection terminal. In the case of Comparative Example 2, an attenuation in the receive band of Band27 is worsened to 34 dB.

Figure 5D:
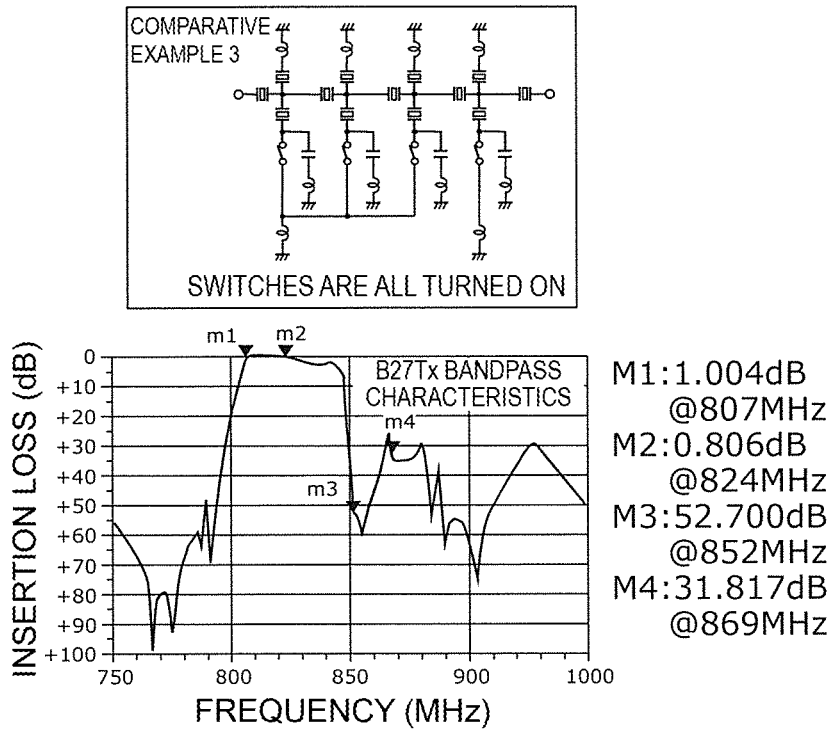

FIG. 5D is a graph depicting bandpass characteristics of an acoustic wave filter device according to Comparative Example 3 when switches are turned on. The acoustic wave filter device according to Comparative Example 3 is different from the acoustic wave filter device 10A in that the parallel arm resonators pH1, pH2 and pH3 are connected to the same ground connection terminal. In the case of Comparative Example 3, an attenuation in the receive band of Band27 is worsened to 31 dB.

Figure 6:
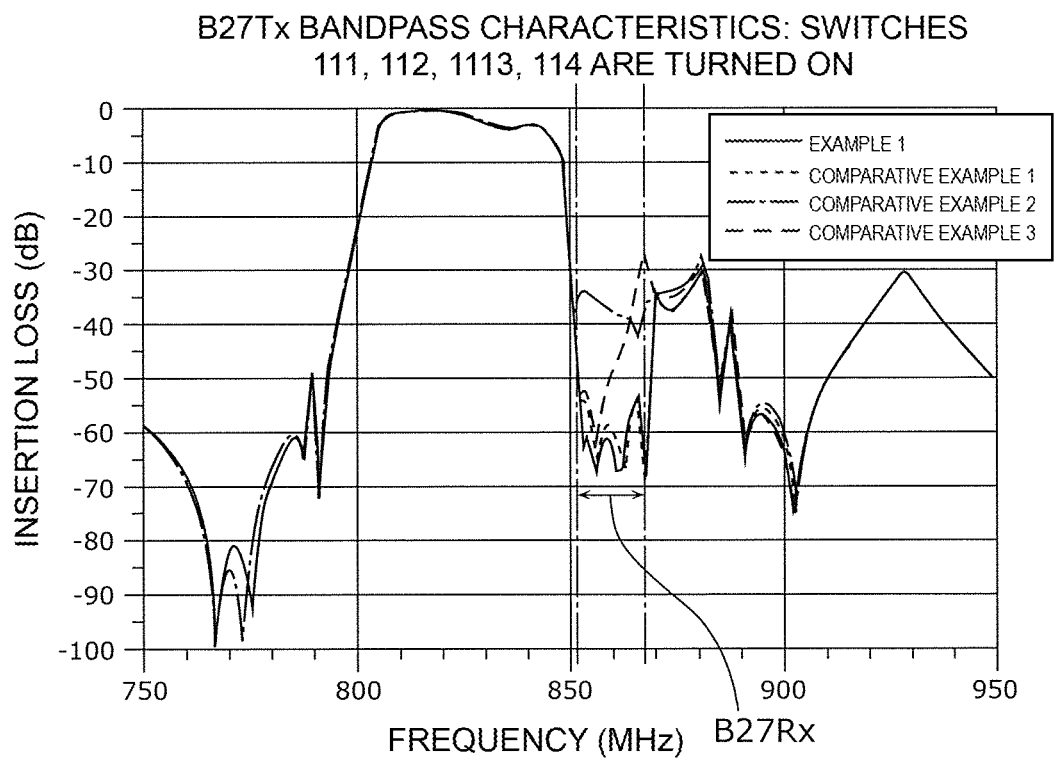

FIG. 6 is a graph comparatively depicting the bandpass characteristics of the acoustic wave filter devices according to Example 1, Comparative Example 1, Comparative Example 2, and Comparative Example 3 when the switches are turned on. As seen from FIG. 6, regarding the filter characteristics when the switches 111 to 114 are all turned on, good attenuation characteristics are obtained in the acoustic wave filter devices according to Example 1 and Comparative Example 1. In the acoustic wave filter device according to Comparative Example 1, however, the same number of the ground connection terminals as the parallel arm resonators are required, and the reduction in size and area cannot be obtained with Comparative Example 1. On the other hand, in the acoustic wave filter device 10A according to Example 1, since the two ground connection terminals are disposed for the four parallel arm resonators, the frequency variable filter circuit can be realized in which size reduction and space-saving can be obtained while the attenuation (e.g., 45 dB or more) required in the receive band is ensured.

Next, the case of applying the acoustic wave filter device 10B is described. When the switches 111 to 114 are all turned on in the circuit illustrated in FIG. 2B, the acoustic wave filter device 10B has filter characteristics including a pass band assigned as the transmit band (807 to 824 MHz) of Band27. When the switches 111 to 114 are all turned off, the acoustic wave filter device 10B has filter characteristics including a pass band assigned as the transmit band (814 to 849 MHz) of Band26.

Figure 7A:
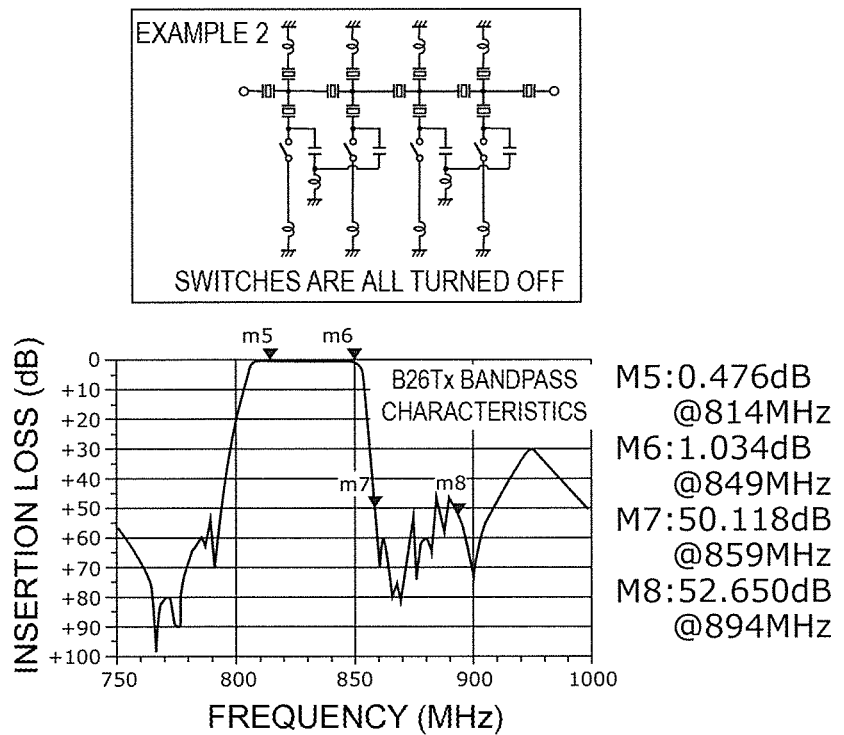
FIG. 7A is a graph depicting bandpass characteristics of an acoustic wave filter device according to Example 2 when switches are turned off.

FIG. 7A is a graph depicting bandpass characteristics of the acoustic wave filter device 10B according to Example 2 when the switches are turned off. FIG. 7A represents the filter characteristics including a pass band assigned as the transmit band of Band26 when the switches 111 to 114 are all turned off. When the switches 111 to 114 are all turned off, the parallel arm resonators are connected to the external ground electrode from the capacitors via the ground connection terminals 130 to 170. In this example, an attenuation in the receive band of Band26 is obtained at a level of 45 dB or more.

Figure 7B:
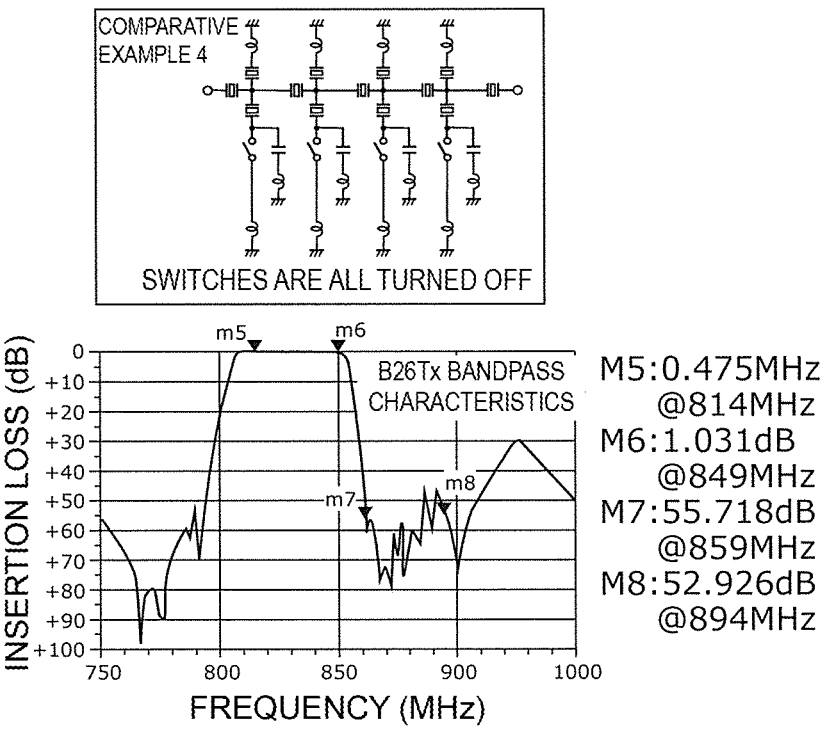
FIG. 7B is a graph depicting bandpass characteristics of an acoustic wave filter device according to Comparative Example 4 when switches are turned off.

FIG. 7B is a graph depicting bandpass characteristics of an acoustic wave filter device according to Comparative Example 4 when switches are turned on. The acoustic wave filter device according to Comparative Example 4 is different from the acoustic wave filter device 10B only in that the parallel arm resonators pH1 to pH4 are separately connected to the external ground electrode. In the case of Comparative Example 4, an attenuation in the receive band of Band26 is obtained at a level of 45 dB or more.

Figure 7C:
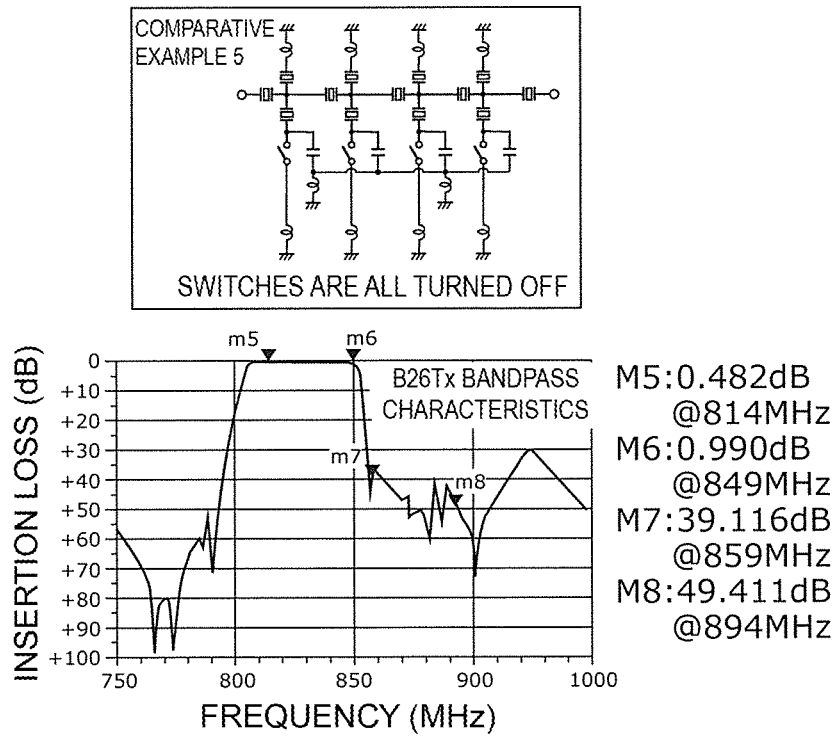
FIG. 7C is a graph depicting bandpass characteristics of an acoustic wave filter device according to Comparative Example 5 when switches are turned off.

FIG. 7C is a graph depicting bandpass characteristics of an acoustic wave filter device according to Comparative Example 5 when switches are turned on. The acoustic wave filter device according to Comparative Example 5 is different from the acoustic wave filter device 10B only in that the parallel arm resonators pH1 to pH4 are all connected to the same ground connection terminal. In the case of Comparative Example 5, an attenuation in the receive band of Band26 is worsened to 37 dB.

Figure 7D:
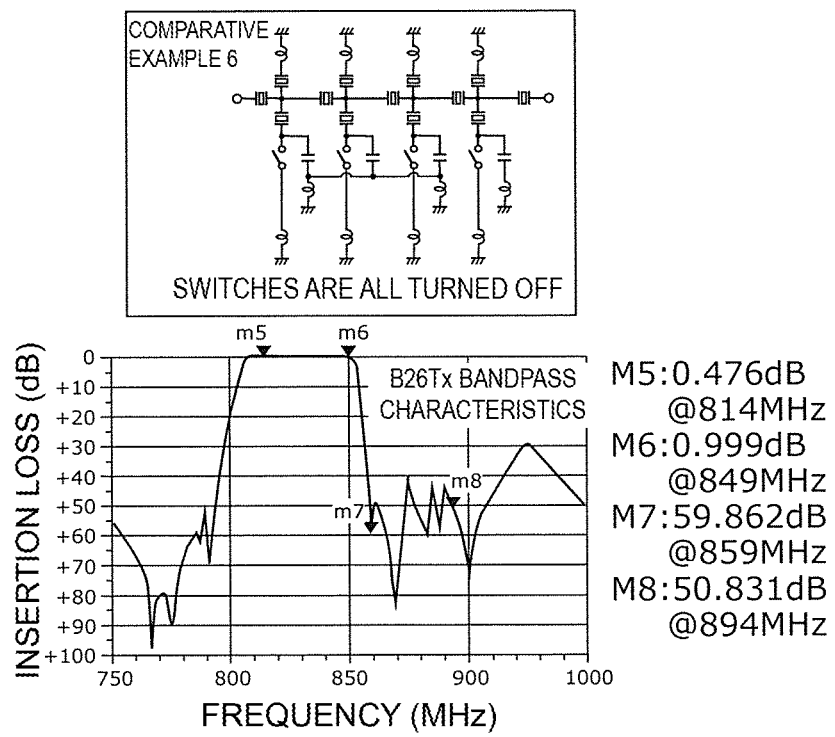
FIG. 7D is a graph depicting bandpass characteristics of an acoustic wave filter device according to Comparative Example 6 when switches are turned off.

FIG. 7D is a graph depicting bandpass characteristics of an acoustic wave filter device according to Comparative Example 6 when switches are turned on. The acoustic wave filter device according to Comparative Example 6 is different from the acoustic wave filter device 10B in that the parallel arm resonators pH1, pH2 and pH3 are connected to the same ground connection terminal. In the case of Comparative Example 6, an attenuation in the receive band of Band26 is worsened to about 40 dB.

Figure 8:
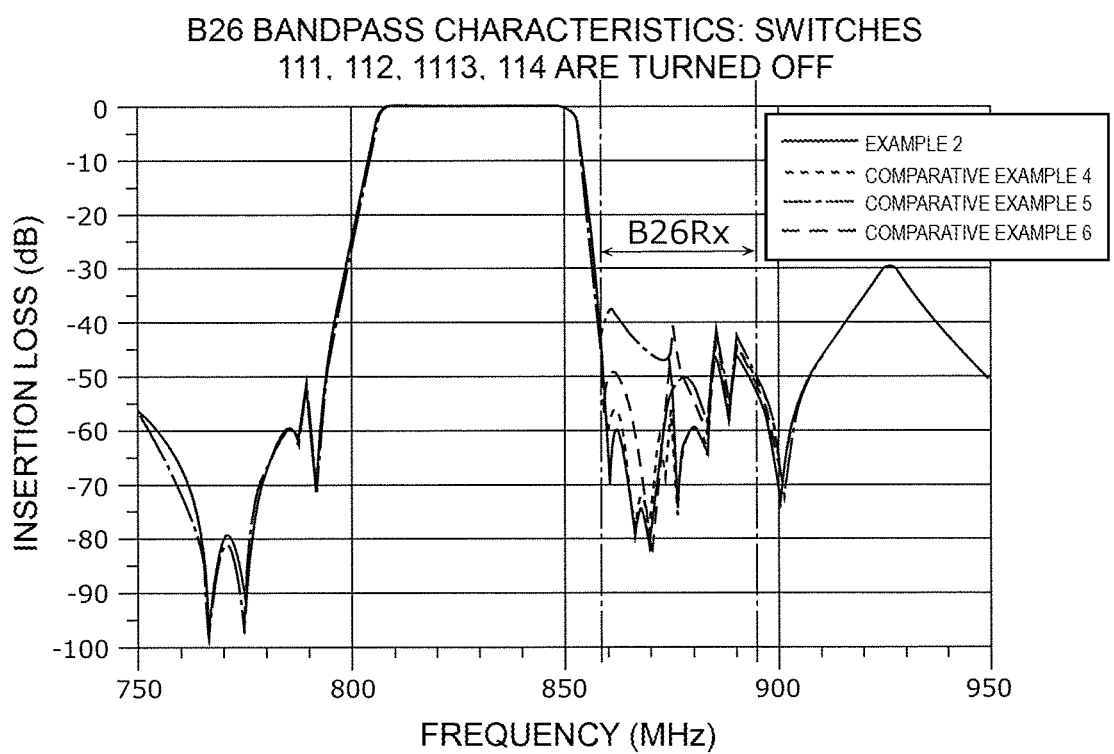
FIG. 8 is a graph comparatively depicting the bandpass characteristics of the acoustic wave filter devices according to Example 2, Comparative Example 4, Comparative Example 5, and Comparative Example 6 when the switches are turned off.

FIG. 8 is a graph comparatively depicting the bandpass characteristics of the acoustic wave filter devices according to Example 2, Comparative Example 4, Comparative Example 5, and Comparative Example 6 when the switches are turned off. As seen from FIG. 8, regarding the filter characteristics when the switches 111 to 114 are all turned off, good attenuation characteristics are obtained in the acoustic wave filter devices according to Example 2 and Comparative Example 4. In the acoustic wave filter device according to Comparative Example 4, however, the same number of the ground connection terminals as the parallel arm resonators are required, and the reduction in size and area cannot be obtained with Comparative Example 4. On the other hand, in the acoustic wave filter device 10B according to Example 2, since the two ground connection terminals are disposed for the four parallel arm resonators, the frequency variable filter circuit can be realized in which size reduction and space-saving can be obtained while good filter characteristics are ensured.

[1.6 Attenuation Characteristics due to Connection Forms of Ground Connection Terminals]

The following description is made about the point that attenuation characteristics are different depending on ground connection forms of the parallel arm resonators connected to different serial arms.

First, a fifth-order ladder circuit constituted by serial arm resonators s1 and s2 and parallel arm resonators pH1, pH2 and pH3 on the higher frequency side is discussed, by way of example, with intent to explain the reason why ground connection terminals of the parallel arm resonators on the higher frequency side, which are apart from each other with at least one resonator interposed therebetween (namely, which are not adjacent to each other), are not to be connected in common.

Figure 9:
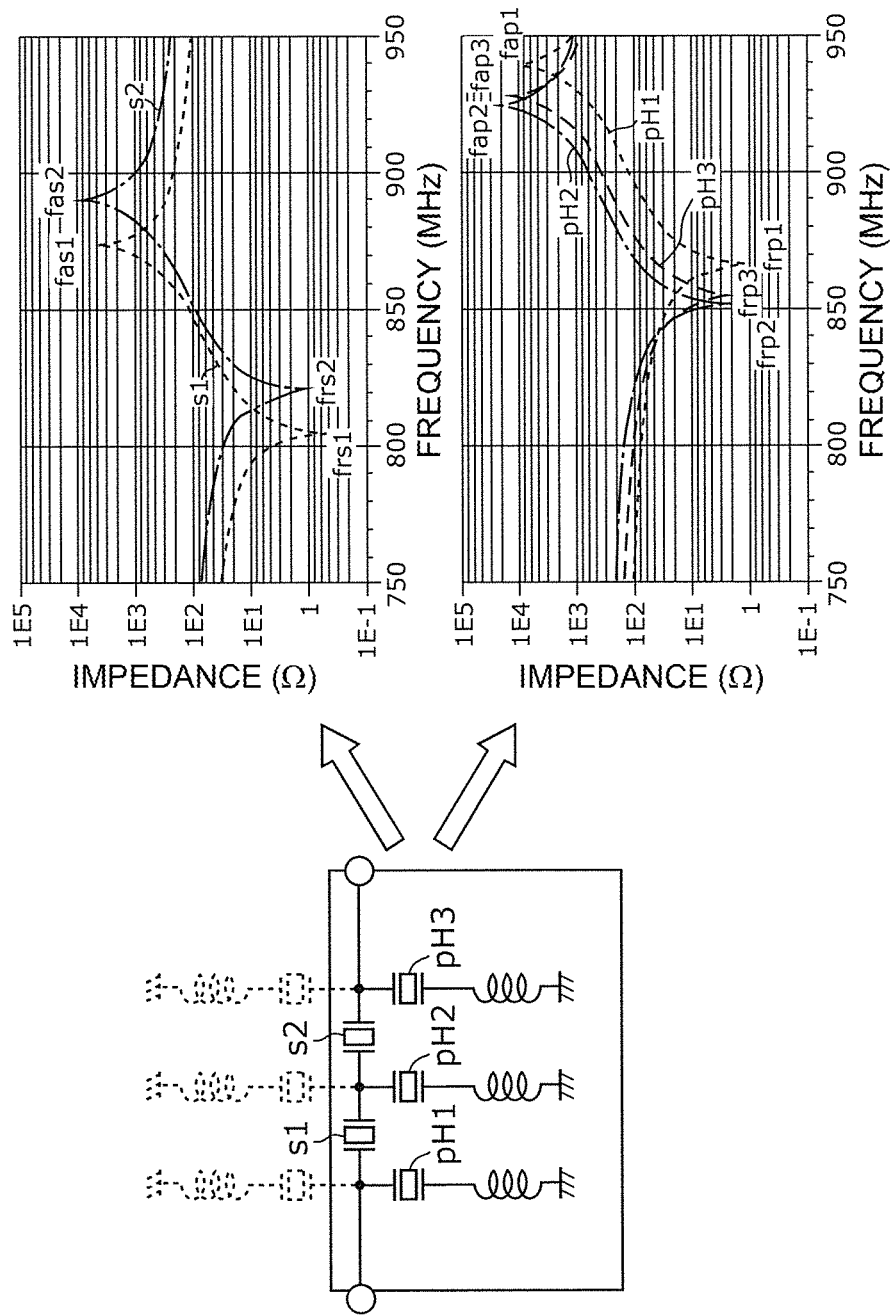
FIG. 9 illustrates a filter circuit in which ground terminals of three parallel arm resonators are separated from one another, together with resonance characteristics of the filter circuit.

FIG. 9 illustrates a filter circuit in which ground terminals of three parallel arm resonators are separated from one another, together with resonance characteristics of the filter circuit. As seen from FIG. 9, resonant frequencies frp1, frp2 and frp3 of the parallel arm resonators pH1, pH2 and pH3 are higher than resonant frequencies frs1 and frs2 of the serial arm resonators s1 and s2. The parallel arm resonators pH1, pH2 and pH3 on the higher frequency side contribute to providing attenuation characteristics on the higher frequency side of the pass band, while parallel arm resonators pL1, pL2 and pL3 on the lower frequency side contribute to defining the pass band. The parallel arm resonators pL1, pL2 and pL3 on the lower frequency side are not taken into consideration because it is intended here to explain behaviors of the attenuation characteristics depending on ground connection forms of the parallel arm resonators on the higher frequency side.

Figure 10:
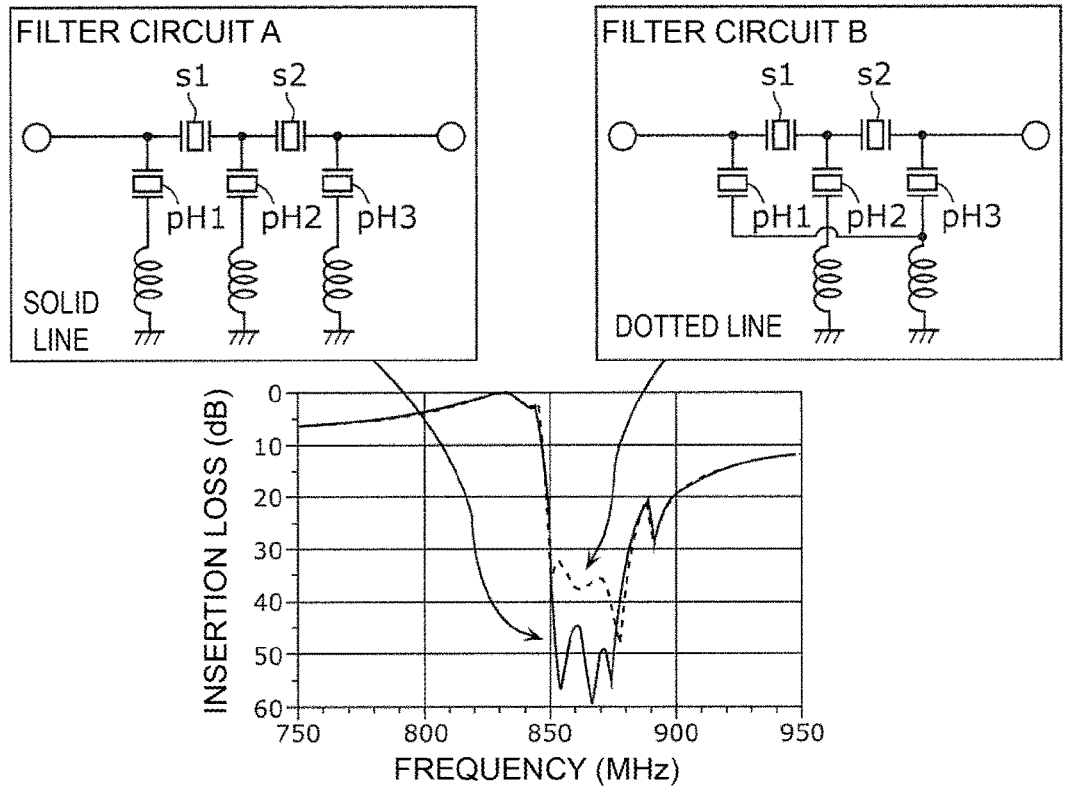
FIG. 10 is a graph comparatively depicting bandpass characteristics of a filter circuit in which ground terminals of three parallel arm resonators are separated from one another, and bandpass characteristics of a filter circuit in which the ground terminals of two among the three parallel arm resonators at both the ends are connected in common.

FIG. 10 is a graph comparatively depicting bandpass characteristics of a filter circuit A in which ground terminals of three parallel arm resonators are separated from one another, and bandpass characteristics of a filter circuit B in which the ground terminals of two among the three parallel arm resonators at both the ends are connected in common. As seen from FIG. 10, the attenuation on the higher frequency side of the pass band is worsened in the filter circuit B in which the ground terminals of two among the three parallel arm resonators at both the ends are connected in common (namely, in which the ground terminals of the parallel arm resonators apart from each other with at least one resonator interposed therebetween are connected in common).

Figure 11:
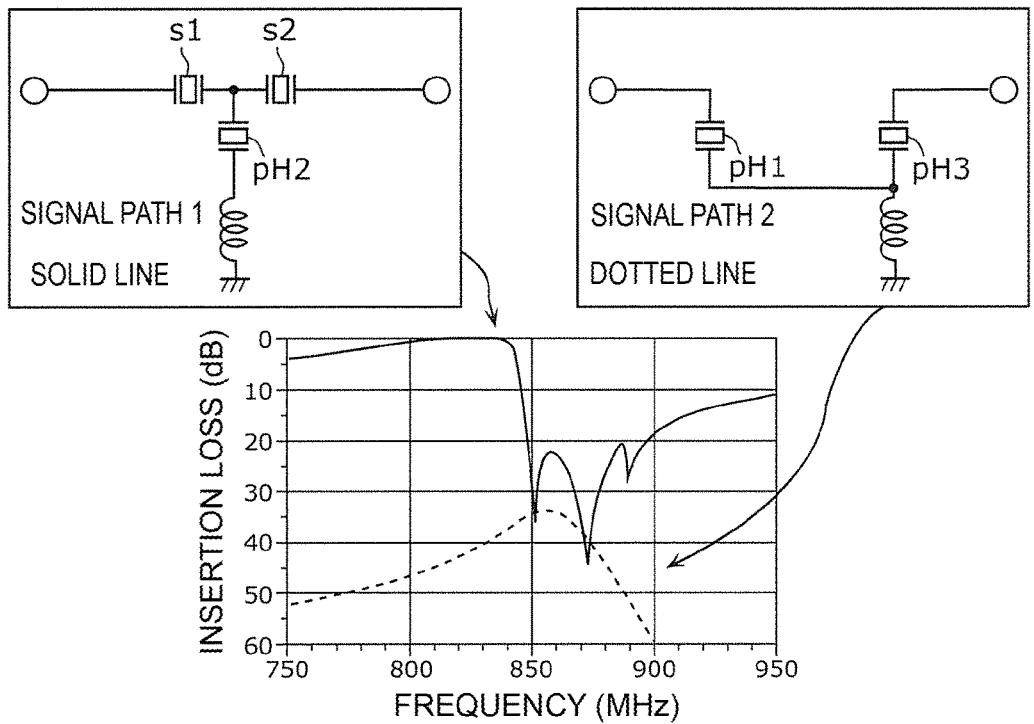
FIG. 11 is a graph depicting bandpass characteristics when the filter circuit in which the ground terminals of two among the three parallel arm resonators at both the ends are connected in common is separated into two circuits.

FIG. 11 is a graph depicting bandpass characteristics when the filter circuit B in which the ground terminals of two among the three parallel arm resonators at both the ends are connected in common is separated into two circuits. As illustrated in an upper zone of FIG. 11, the filter circuit B can be separated into two signal paths 1 and 2. The signal path 1 represents a T ladder circuit made up of the serial arm resonators s1 and s2, the parallel arm resonator pH2, and an inductance component. The signal path 2 represents a circuit made up of the parallel arm resonators pH1 and pH3, and an inductance component.

The signal path 1 provides characteristics of attenuating a band of 850 to 900 MHz on the basis of the anti-resonant frequencies of the serial arm resonators s1 and s2 and the resonant frequency of the parallel arm resonator pH2.

On the other hand, with the signal path 2, a band of 900 to 950 MHz is attenuated on the basis of the resonant frequencies of the parallel arm resonators pH1 and pH3, while an attenuation as small as about 30 dB is just obtained as a peak value due to the presence of the inductance component. If the inductance component is increased, the peak value of the attenuation decreases.

The following description is made with reference to the filter circuit B again. In the attenuation band of 850 to 900 MHz, impedances of the serial arm resonators s1 and s2 are so very high as not to allow passage of a signal. On the other hand, impedances of the parallel arm resonators pH1, pH2 and pH3 are low, and a signal passes through a path formed by the parallel arm resonator pH1, the inductance component, and the parallel arm resonator pH3. Accordingly, in the attenuation band of 850 to 900 MHz, the influence of the inductance component increases, and the attenuation characteristics are deteriorated. In other words, when ground impedance becomes higher (namely, when the inductance component increases), the attenuation characteristics are further deteriorated. Thus, the influence of the ground connection form upon the filter characteristics is high.

In comparison with the above, the case of connecting the adjacent parallel arm resonators in common is now described.

Figure 12:
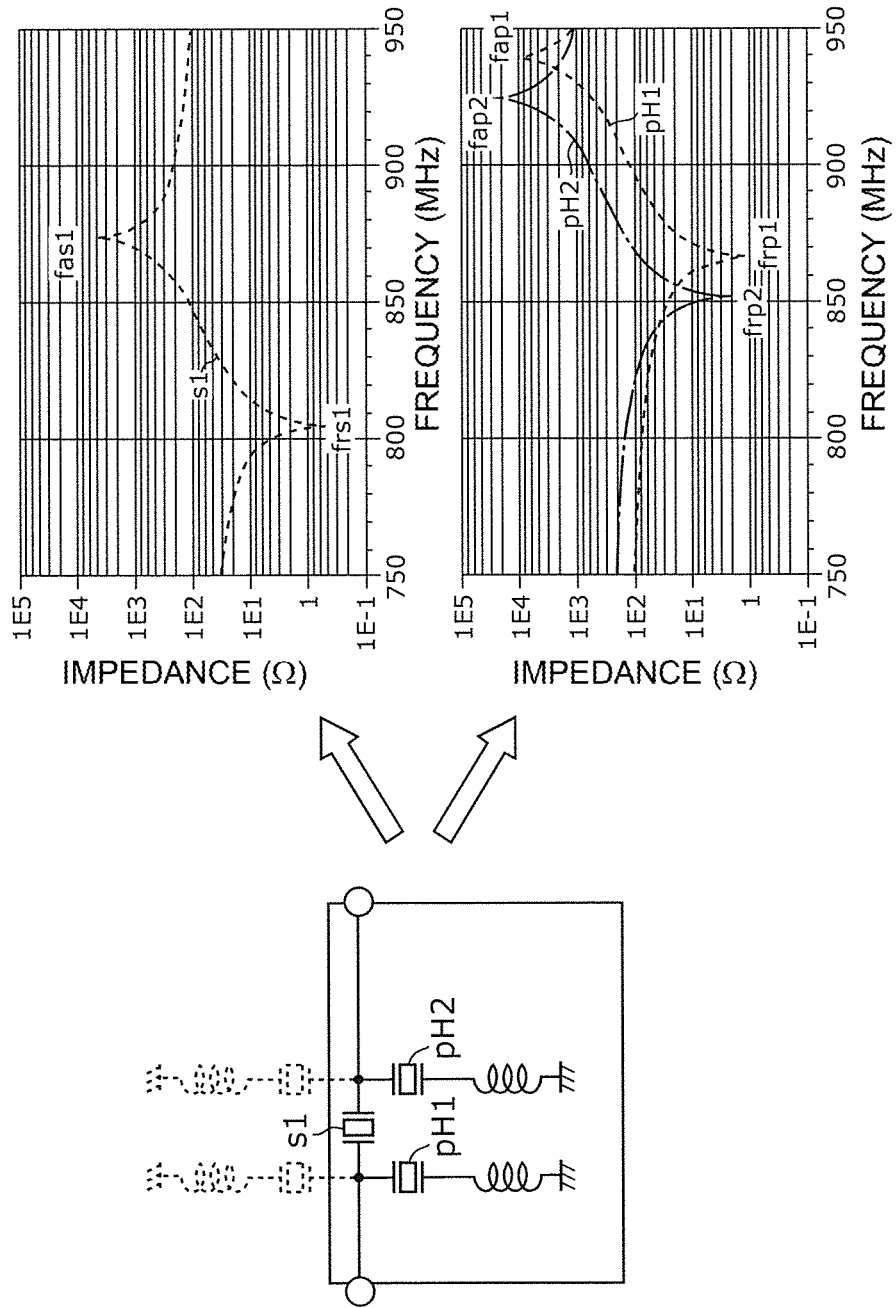
FIG. 12 illustrates a filter circuit in which the ground terminals of two parallel arm resonators are separated from each other, together with resonance characteristics of the filter circuit.

FIG. 12 illustrates a filter circuit C in which the ground terminals of two parallel arm resonators pH1 and pH2 are separated from each other, together with resonance characteristics of the filter circuit. As seen from FIG. 12, resonant frequencies frp1 and frp2 of the parallel arm resonators pH1 and pH2 are higher than a resonant frequency frs1 of a serial arm resonator s1. The parallel arm resonators pH1 and pH2 on the higher frequency side contribute to providing attenuation characteristics on the higher frequency side of the pass band, while parallel arm resonators pL1 and pL2 on the lower frequency side contribute to defining the pass band. The parallel arm resonators pL1 and pL2 on the lower frequency side are not taken into consideration because it is intended here to explain behaviors of the attenuation characteristics depending on ground connection forms of the parallel arm resonators on the higher frequency side.

Figure 13:
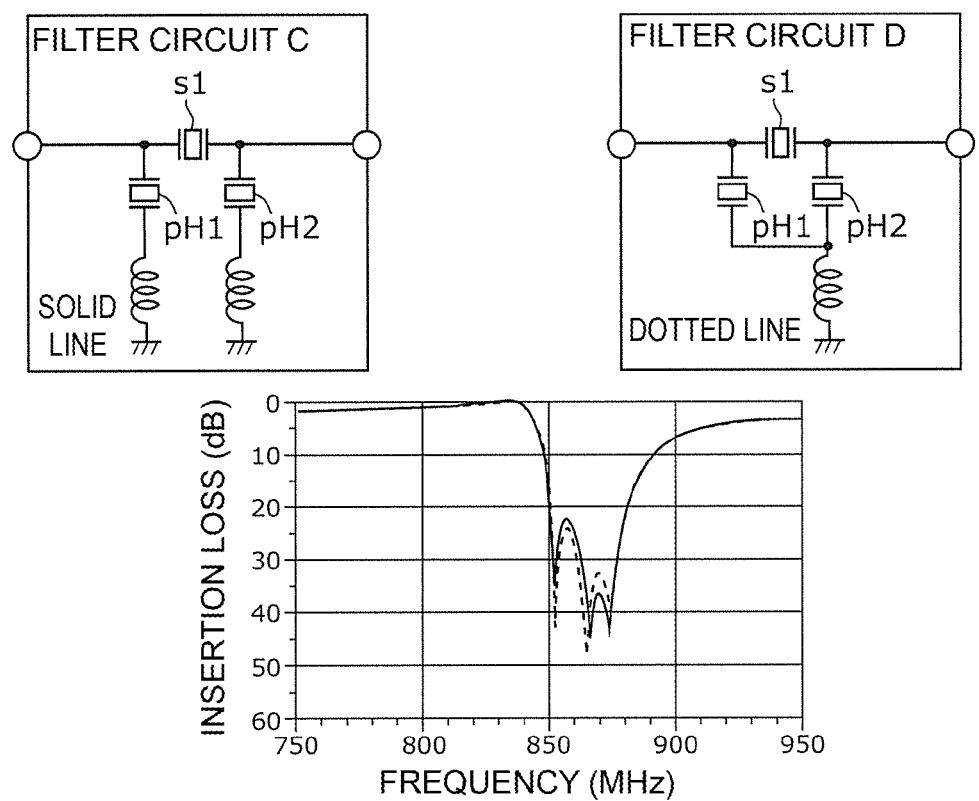
FIG. 13 is a graph comparatively depicting bandpass characteristics of the filter circuit in which the ground terminals of the two parallel arm resonators are separated from each other, and bandpass characteristics of a filter circuit in which the ground terminals of the two parallel arm resonators are connected in common.

FIG. 13 is a graph comparatively depicting bandpass characteristics of the filter circuit C in which the ground terminals of the two parallel arm resonators pH1 and pH2 are separated from each other, and bandpass characteristics of a filter circuit D in which the ground terminals of the two parallel arm resonators pH1 and pH2 are connected in common. Even when the filter circuit is simplified to a third-order configuration as illustrated in an upper zone of FIG. 13, the filter circuit D allows a signal to pass through a path constituted by the parallel arm resonator pH1, the inductance component, and the parallel arm resonator pH2 in the attenuation band of 850 to 900 MHz. Accordingly, it is supposed that, in the attenuation band of 850 to 900 MHz, the influence of the inductance component increases and the attenuation characteristics are deteriorated. In the filter circuit C, however, since the order number of the circuit is low, an intrinsic attenuation is smaller than that in a commonly-grounded circuit path (i.e., the filter circuit D). Hence the ground terminals can be connected in common without deteriorating the characteristics.

As understood from the above discussion, the attenuation characteristics in the attenuation band of 850 to 900 MHz are deteriorated due to the influence of the inductance component in the filter circuit B in which the ground terminals of two among the three parallel arm resonators at both the ends are connected in common. In contrast, the attenuation characteristics in the attenuation band of 850 to 900 MHz are not deteriorated in the filter circuit D in which the ground terminals of the two adjacent parallel arm resonators pH1 and pH2 are connected in common.

[1.7 Mount Configuration of Acoustic Wave Filter Device]

Figure 14A:
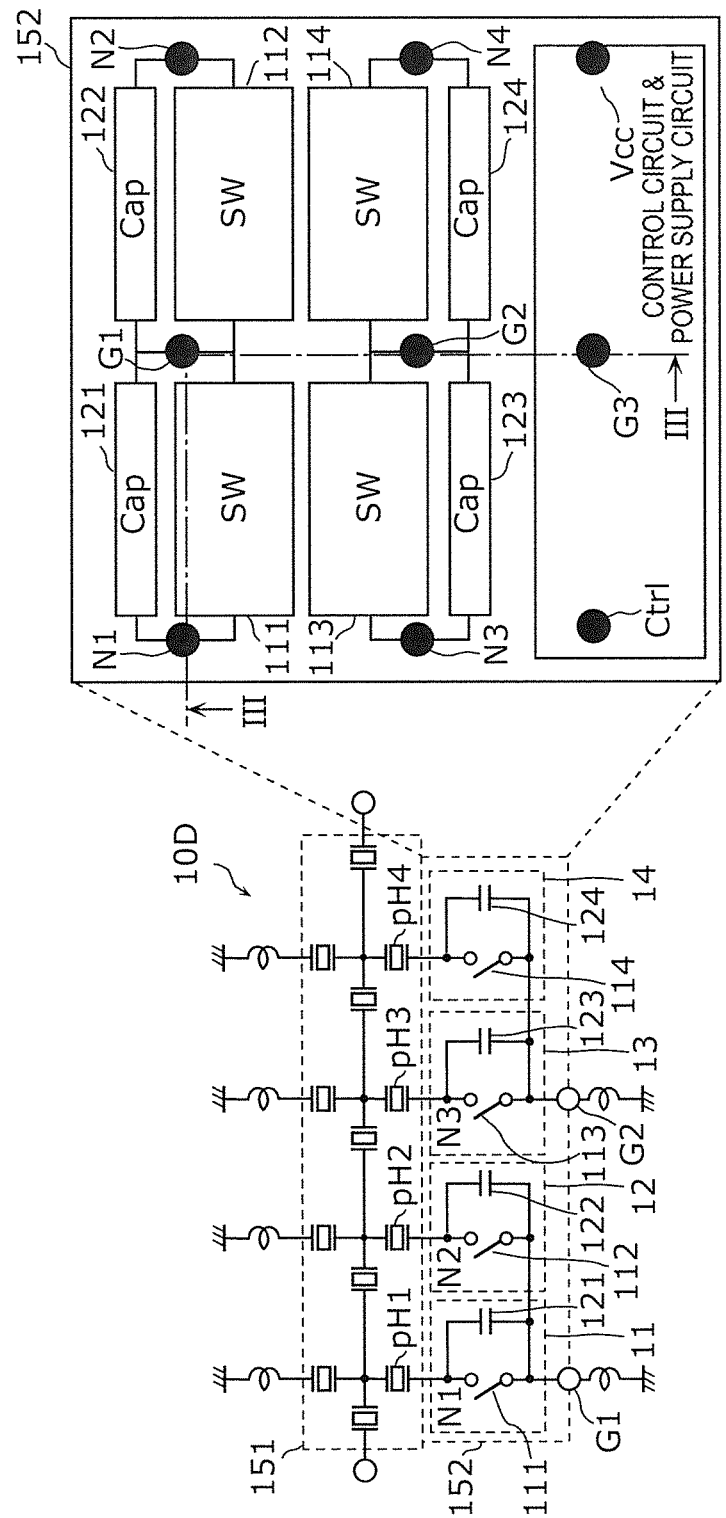
FIG. 14A illustrates a mount configuration of frequency varying circuits in the acoustic wave filter device according to Modification 3 of Embodiment 1 when viewed in plan.

FIG. 14A illustrates a mount configuration of the frequency varying circuits 11 to 14 in the acoustic wave filter device 10D according to Modification 3 of Embodiment 1 when viewed in plan. As illustrated in FIG. 14A, the frequency varying circuits 11 to 14 are formed within a tunable circuit section 152. The tunable circuit section 152 includes the frequency varying circuits 11 to 14, and external connection terminals G1 and G2 that correspond to the ground connection terminals 130 and 170, respectively. The tunable circuit section 152 may further include a control circuit and a power supply circuit.

FIG. 14B illustrates a mount configuration of the acoustic wave filter device 10D according to Modification 3 of Embodiment 1 when viewed in section. FIG. 14B is a schematic sectional view taken along III-III in FIG. 14A.

The acoustic wave filter device 10D according to this modification is constituted by a filter substrate 151 and the tunable circuit section 152. The serial arm resonators s1 to s5, the parallel arm resonators pL1 to pL4, and the parallel arm resonators pH1 to pH4 are formed in or on the filter substrate 151. The filter substrate 151 and the tunable circuit section 152 are arranged on a mounting board 150 including an external ground electrode GND.

With the above configuration, parallel arms of the parallel arm resonators pH1 to pH4 formed in or on the filter substrate 151, the parallel arms being positioned on the unground connection side, are connected to the external connection terminal G1 (corresponding to the ground connection terminal 130) and the external connection terminal G2 (corresponding to the ground connection terminal 170) of the tunable circuit section 152. In the acoustic wave filter device 10D, therefore, the number of ground terminals for connecting the tunable circuit section 152 and the mounting board 150 to the ground can be reduced. As a result, the filter circuit can be realized in which size reduction and space-saving can be obtained without deteriorating the filter characteristics.

When the tunable circuit section 152 includes the control circuit and the power supply circuit, the external connection terminal G3 used for connecting the control circuit and the power supply circuit to the ground is preferably different from the external connection terminals G1 and G2. In this case, the external connection terminal G3 is connected to the external ground electrode GND without passing the external connection terminals G1 and G2, while the external connection terminals G1 and G2 are connected to the external ground electrode GND without passing the external connection terminal G3. That layout can suppress the filter characteristics of the acoustic wave filter device from deteriorating due to the influence of power supply noise.

Although the above-described mount configuration represents an example in which the capacitors 121 to 124 constituting the frequency varying circuits are mounted into a package of the tunable circuit section 152, the capacitors 121 to 124 may be formed in or on the filter substrate 151.

[1.8 Another Modification of Acoustic Wave Filter Device]

In the acoustic wave filter device according to the present disclosure, the filter circuit capable of switching over the pass band may be designed so as to shift attenuation slopes on both the higher frequency side and the lower frequency side of the pass band. From such a point of view, that type of filter is described as Modification 4 of the filter according to this embodiment.

In the following, a tunable filter 22E resulting from simplifying the circuit configuration of the acoustic wave filter devices 10 is used for the purpose of explaining a modification of the frequency varying operation in the acoustic wave filter device 10. More specifically, the acoustic wave filter device 10 has a multistage configuration on an assumption that a combination of one serial arm resonator and two parallel arm resonators constitutes one stage. On the other hand, the tunable filter 22E has one among the multiple stages of the above-described combination.

Although a difference occurs in insertion loss in the pass band and attenuation in the attenuation band between the acoustic wave filter device 10 and the simplified tunable filter 22E, the operation principle is substantially the same therebetween.

Figure 15:
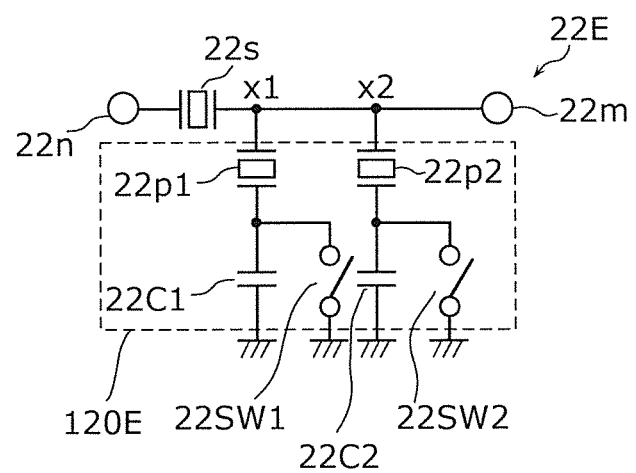
FIG. 15 is a circuit diagram of a tunable filter according to Modification 4 of Embodiment 1.

FIG. 15 is a circuit diagram of the tunable filter 22E according to Modification 4 of Embodiment 1. The tunable filter 22E illustrated in FIG. 15 is different from the filter 22A illustrated in FIG. 4 in that capacitors 22C1 to 22C2 and switches 22SW1 and 22SW2 are disposed corresponding to two parallel arm resonators 22p1 and 22p2, respectively, and are connected in series to the corresponding parallel arm resonators 22p1 and 22p2. In other words, a parallel arm circuit 120E includes the capacitor 22C1 (impedance element) and the switch 22SW1 (switch element), which are connected in series to one (here, the parallel arm resonator 22p1) of the parallel arm resonators 22p1 and 22p2, and which are connected in parallel to each other. The parallel arm circuit 120E further includes the capacitor 22C2 (impedance element) and the switch 22SW2 (switch element), which are connected in series to the other (here, the parallel arm resonator 22p2) of the parallel arm resonators 22p1 and 22p2, and which are connected in parallel to each other.

The serial arm resonator 22s in the circuit configuration of FIG. 15 corresponds to, for example, the serial arm resonator s1 in FIG. 2A, and the parallel arm resonators 22p1 and 22p2 in the circuit configuration of FIG. 15 correspond to, for example, the parallel arm resonators pL1 and pH1 in FIG. 2A, respectively. The capacitor 22C2 in the circuit configuration of FIG. 15 corresponds to, for example, the capacitor 121 in FIG. 2A. The switch 22SW2 in the circuit configuration of FIG. 15 corresponds to, for example, the switch 111 in FIG. 2A. Furthermore, the modification of the acoustic wave filter device 10A illustrated in FIG. 2A has four stages of the circuit configuration of the tunable filter 22E illustrated in FIG. 15, and the ground connection terminal connected to the switch 22SW2 in FIG. 15 is connected to the adjacent switch 22SW2 in common. However, the ground terminals connected to the three or more adjacent switches 22SW2 are not connected in common.

The capacitor 22C2 and the switch 22SW2 in this modification correspond respectively to the capacitor 22C and the switch 22SW in the above-described filter 22A. For that reason, detailed description of the capacitor 22C2 and the switch 22SW2 is omitted.

In this modification, the parallel arm resonators 22p1 and 22p2, the capacitors 22C1 and 22C2, and the switches 22SW1 and 22SW2 are connected between the ground and nodes on a path connecting an input/output terminal 22m and an input/output terminal 22n, thereby constituting the parallel arm circuit 120E.

Bandpass characteristics of the filter 22E having the above-described configuration are switched over between first bandpass characteristics and second bandpass characteristics upon the switches 22SW1 and 22SW2 being turned on and off in accordance with control signals. The bandpass characteristics of the filter 22E will be described below together with states of the switches 22SW1 and 22SW2 by referring to FIG. 16.

Figure 16:
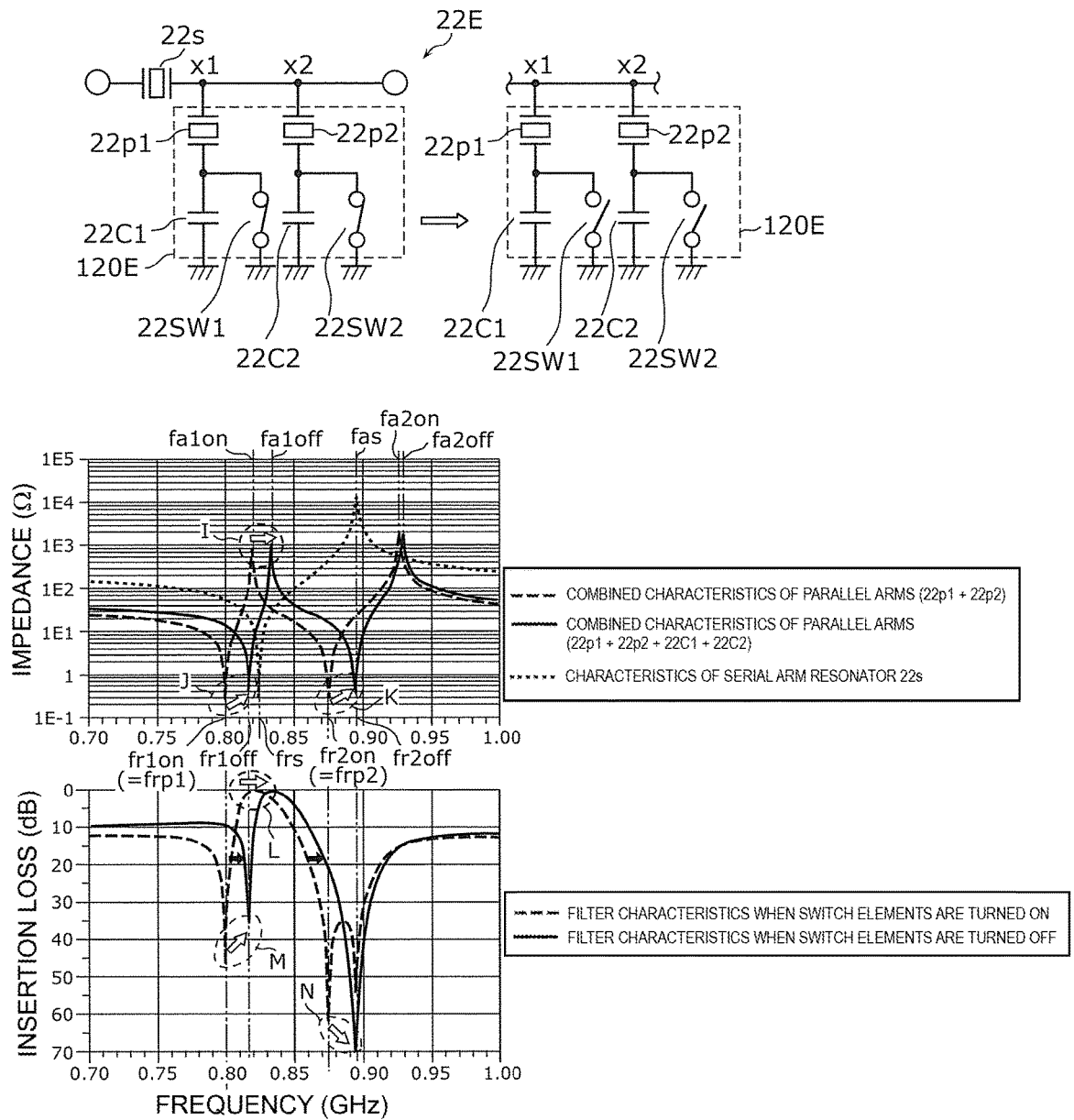
FIG. 16 represents graphs comparatively depicting impedance characteristics and bandpass characteristics of the tunable filter according to Modification 4 of Embodiment 1 when switches are turned on and off.

FIG. 16 represents graphs comparatively depicting the impedance characteristics and the bandpass characteristics of the tunable filter 22E according to Modification 4 of Embodiment 1 when the switches are turned on and off.

As seen from FIG. 16, when the switches 22SW1 and 22SW2 are both turned on, the impedance characteristics of the parallel arm circuit 120E are not affected by the capacitors 22C1 and 22C2. Thus, in this state, as in the case of the characteristics described above in connection with the filter 22A, the impedance characteristics of the parallel arm circuit are given by combined characteristics of the two parallel arm resonators (i.e., the parallel arm resonators 22p1 and 22p2) (denoted by "COMBINED CHARACTERISTICS OF PARALLEL ARMS (22p1+22p2)" in FIG. 16).

Stated in another way, when the switches 22SW1 and 22SW2 are both turned on, the filter 22E has the first bandpass characteristics similar to those obtained when the switch 22SW in the filter 22A is turned on.

On the other hand, as illustrated in FIG. 16, when the switches 22SW1 and 22SW2 are turned off, the impedance characteristics of the parallel arm circuit 120E are affected by the capacitors 22C1 and 22C2. Thus, in this state, the impedance characteristics of the parallel arm circuit are given by combined characteristics of the two parallel arm resonators (i.e., the parallel arm resonators 22p1 and 22p2) and the capacitors 22C1 and 22C2 (denoted by "COMBINED CHARACTERISTICS OF PARALLEL ARMS (22p1+22p2+22C1+22C2)" in FIG. 16).

More specifically, when the switches 22SW1 and 22SW2 are both turned off, the parallel arm circuit 120E has the following impedance characteristics.

The parallel arm circuit 120E has two resonant frequencies fr1off and fr2off and two anti-resonant frequencies fa1off and fa2off (here, fr1off<fa1off<fr2off<fa2off, fa1off<fap1, frp1<frp1off, frp2<frp2off, and fa2off<fap2 are satisfied). In other words, the impedance of the parallel arm circuit 120E is locally minimized at (i) a frequency higher than the resonant frequency of the parallel arm resonator 22p1 constituting the parallel arm circuit 120E, and (ii) a frequency higher than the resonant frequency of the parallel arm resonator 22p2. Furthermore, the impedance of the parallel arm circuit 120E is locally maximized at (i) a frequency between the resonant frequencies of the parallel arm resonators 22p1 and 22p2 constituting the parallel arm circuit 120E, and (ii) a frequency between the anti-resonant frequencies of those two parallel arm resonators 22p1 and 22p2.

The reason and the detailed mechanism with and through which the above-described impedance characteristics are obtained are similar to those in the case of the parallel arm circuit 120A, and they are not described here.

In other words, when the switches 22SW1 and 22SW2 are turned off, the filter 22E has the second bandpass characteristics that a pass band is defined by the anti-resonant frequency fa1off and the resonant frequency frs, that a pole (attenuation pole) on the lower frequency side of the pass band is defined by the resonant frequency fr1off, and that a pole (attenuation pole) on the higher frequency side of the pass band is defined by the resonant frequency fr2off and the anti-resonant frequency fas.

The impedance characteristics and the bandpass characteristics obtained when the switches 22SW1 and 22SW2 in the filter 22E are both turned on and when the switches 22SW1 and 22SW2 are both turned off will be compared in detail below.

As illustrated in FIG. 16, when the switches 22SW1 and 22SW2 are both turned off from on, the impedance characteristics of the parallel arm circuit 120E change as follows. In the parallel arm circuit 120E, both of the two resonant frequencies and one of the two anti-resonant frequencies on the lower frequency side shift to the higher frequency side. In this modification, since the parallel arm resonators 22p1 and 22p2 are connected in series to the capacitors 22C1 and 22C2, respectively, both of the resonant frequencies shift to the higher frequency side (see regions J and K in the drawing). Furthermore, the anti-resonant frequency on the lower frequency side shifts to the higher frequency side (see a region I in the drawing).

Here, the anti-resonant frequency of the parallel arm circuit on the lower frequency side and the resonant frequency thereof on the higher frequency side define an attenuation slope on the higher frequency side of the pass band of the filter 22E, and they shift to the higher frequency side as described above. Furthermore, the anti-resonant frequency of the parallel arm circuit on the lower frequency side and the resonant frequency thereof on the lower frequency side define an attenuation slope on the lower frequency side of the pass band of the filter 22E, and they shift to the higher frequency side as described above. As illustrated in a lower zone of FIG. 16, therefore, with the switches 22SW1 and 22SW2 turned off from on, the bandpass characteristics of the filter 22E shift to the higher frequency side while the attenuation slopes on both the higher frequency side and the lower frequency side of the pass band maintain high sharpness (see black arrows in the drawing). Stated in another way, the filter 22E can shift the bandpass characteristics to the higher frequency side without dropping shoulders of the attenuation slopes on both the higher frequency side and the lower frequency side of the pass band (see a region L in the drawing) while the attenuation poles on both the higher frequency side and the lower frequency side of the pass band are shifted to the higher frequency side (see regions N and M in the drawing). As a result, the filter 22E can shift, for example, a center frequency while a band width is maintained.

In the filter 22E, the switches 22SW1 and 22SW2 are not always required to be turned on and off together, and they may be separately turned on and off. However, when the switches 22SW1 and 22SW2 are turned on and off together, the number of control lines for controlling the switches 22SW1 and 22SW2 can be reduced, and hence the configuration of the filter 22E can be simplified.

On the other hand, when the switches 22SW1 and 22SW2 are separately turned on and off, the number of variations of the pass band, which are selectively switchable by the filter 22E, can be increased.

More specifically, as described in connection with the filter 22A, the higher frequency side end of the pass band can be changed in accordance with the turning-on and -off of the switch 22SW1 connected in series to the parallel arm resonator 22p1. Furthermore, as described in connection with the filter 22E, the lower frequency side end of the pass band can be changed depending on the turning-on and -off of the switch 22SW2 connected in series to the parallel arm resonator 22p2.

Accordingly, by turning on or off the switches 22SW1 and 22SW2 together, the lower frequency side end and the higher frequency side end of the pass band can be each shifted to the lower frequency side or the higher frequency side. In other words, the center frequency of the pass band can be shifted to the lower frequency side or the higher frequency side. Moreover, by turning one of the switches 22SW1 and 22SW2 off from on and turning the other on from off, the lower frequency side end and the higher frequency side end of the pass band can be each shifted to widen or narrow a span of frequency difference between both the ends. Thus, a pass band width can be changed while the center frequency of the pass band is kept substantially constant. In addition, by turning one of the switches 22SW1 and 22SW2 on and off while the other is held in the off- or on-state, one of the lower frequency side end and the higher frequency side end of the pass band can be shifted to the lower frequency side or the higher frequency side while the other is held fixed. Thus, the lower frequency side end or the higher frequency side end of the pass band can be changed.

As seen from the above, a degree of freedom in varying the pass band can be increased with the provision of the capacitors 22C1 and 22C2 and the switches 22SW1 and 22SW2.

FIG. 17 represents a circuit diagram of a tunable filter according to Modification 5 of Embodiment 1, and a graph comparatively depicting bandpass characteristics when a switch is turned on and off. As seen from FIG. 17, the tunable filter according to this modification can be used as the unit circuit of the acoustic wave filter device 10A according to this embodiment instead of the tunable filter 22A illustrated in FIG. 4A and the tunable filter 22E illustrated in FIG. 15. As illustrated in FIG. 17, the tunable filter according to this modification includes a serial arm resonator s1, parallel arm resonators p1 and p2, and a switch SW. The parallel arm resonator p1 is connected to one end of the serial arm resonator s1 and the ground. A circuit including the parallel arm resonator p2 and the switch SW connected in series is connected to the one end of the serial arm resonator s1 and the ground.

The switch SW is connected between the parallel arm resonator p2 and the ground. Here, a resonant frequency fp1 of the parallel arm resonator p1 is lower than a resonant frequency fp2 of the resonant frequency p2 and a resonant frequency fs1 of the serial arm resonator s1. Thus, the serial arm resonator s1 in the circuit configuration of FIG. 17 corresponds to the serial arm resonator s1 in FIG. 1, and the parallel arm resonators p1 and p2 in the circuit configuration of FIG. 17 correspond to the parallel arm resonators pL1 and pH1 in FIG. 1, respectively. The switch SW in the circuit configuration of FIG. 17 corresponds to the frequency varying circuit 11 in FIG. 1.

With the configuration of the tunable filter according to this modification, a slope of a pass band on the higher frequency side is shifted to the higher frequency side by turning the switch SW off from on. Hence the pass band of the tunable filter can be changed.

Still another modification of the acoustic wave filter device according to this embodiment will be described below.

FIG. 18A is a circuit diagram of an acoustic wave filter device 10E according to Modification 6 of Embodiment 1. As illustrated in FIG. 18A, the acoustic wave filter device 10E according to this modification is different from the acoustic wave filter device 10A according to Embodiment 1 only in that the frequency varying circuit 12 is not disposed. In other words, one of parallel arms of the parallel arm resonator pH2 on the side not connected to a second serial arm is directly connected to the ground connection terminal 130.

Thus, the switch 111 connected to the parallel arm resonator pH1 and the parallel arm resonator pH2 adjacent to the parallel arm resonator pH1 are connected to the ground connection terminal 130. The switches 113 and 114 connected to the adjacent parallel arm resonators pH3 and pH4, respectively, are connected to the ground connection terminal 170. Accordingly, the number of ground terminals provided in the acoustic wave filter device 10E can be reduced. Furthermore, the switch 111 connected to the parallel arm resonator pH1, the parallel arm resonator pH2, and the switch 113 connected to the parallel arm resonator pH3 are not connected to the same ground connection terminal in common. In other words, the ground connection terminal 130 (first terminal) for the adjacent parallel arm resonators pH1 and pH2 is separated from the ground connection terminal 170 (fifth terminal) for the adjacent parallel arm resonators pH3 and pH4. Even in the case of the filter circuit configuration including three or more stages of unit circuits each constituted by the serial and parallel arm resonators, therefore, the frequency variable filter circuit can be realized in which the number of terminals connected to the ground is reduced, good filter attenuation characteristics are ensured, and in which size reduction and space-saving are obtained.

Figure 18B:
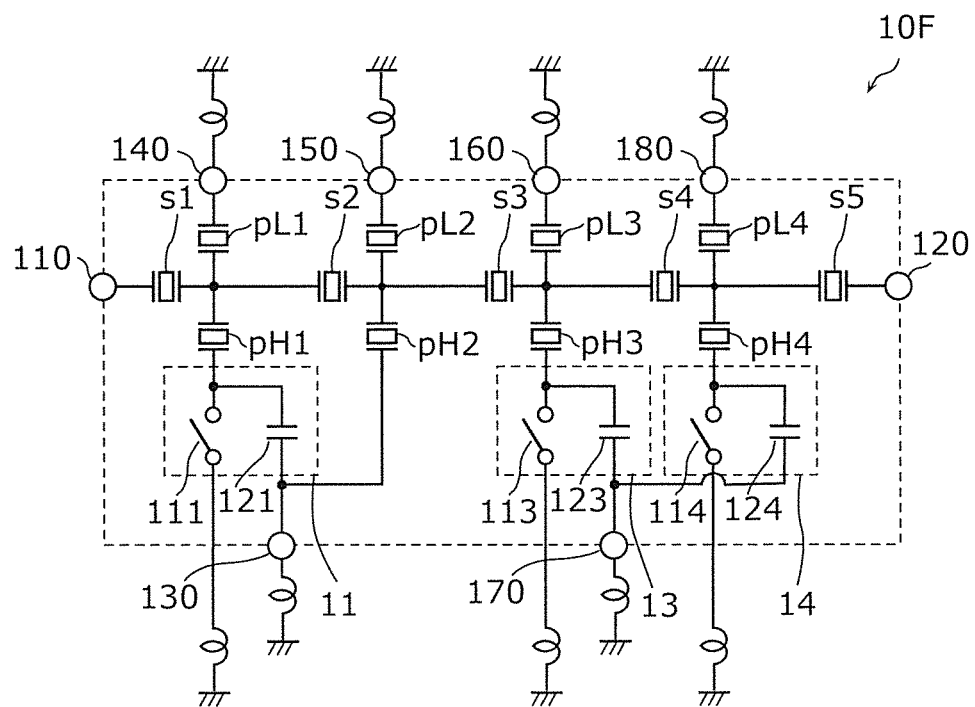
FIG. 18B is a circuit diagram of an acoustic wave filter device according to Modification 7 of Embodiment 1.

FIG. 18B is a circuit diagram of an acoustic wave filter device 10F according to Modification 7 of Embodiment 1. As illustrated in FIG. 18B, the acoustic wave filter device 10F according to this modification is different from the acoustic wave filter device 10B according to Embodiment 1 only in that the frequency varying circuit 12 is not disposed. In other words, one of parallel arms of the parallel arm resonator pH2 on the side not connected to the second serial arm is directly connected to the ground connection terminal 130.

Thus, the capacitor 121 connected to the parallel arm resonator pH1 and the parallel arm resonator pH2 adjacent to the parallel arm resonator pH1 are connected to the ground connection terminal 130. The capacitors 123 and 124 connected to the adjacent parallel arm resonators pH3 and pH4, respectively, are connected to the ground connection terminal 170. Accordingly, the number of ground terminals provided in the acoustic wave filter device 10F can be reduced. Furthermore, the capacitor 121 connected to the parallel arm resonator pH1, the parallel arm resonator pH2, and the capacitor 123 connected to the parallel arm resonator pH3 are not connected to the same ground connection terminal in common. In other words, the ground connection terminal 130 (first terminal) for the adjacent parallel arm resonators pH1 and pH2 is separated from the ground connection terminal 170 (fifth terminal) for the adjacent parallel arm resonators pH3 and pH4. Even in the case of the filter circuit configuration including three or more stages of unit circuits each constituted by the serial and parallel arm resonators, therefore, the frequency variable filter circuit can be realized in which the number of terminals connected to the ground is reduced, good filter attenuation characteristics are ensured, and in which size reduction and space-saving are obtained.

Figure 18C:
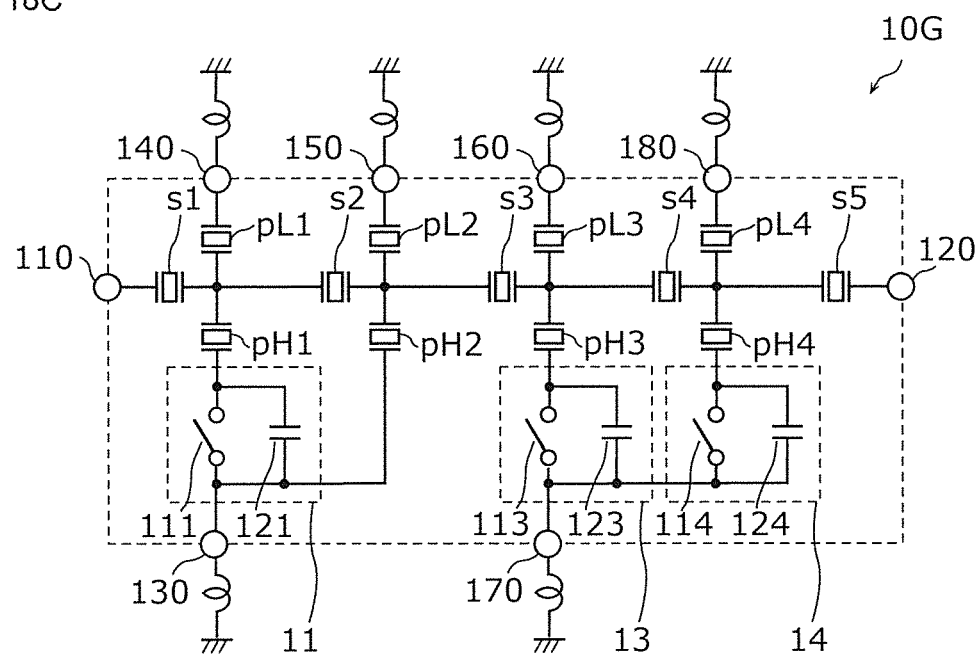
FIG. 18C is a circuit diagram of an acoustic wave filter device according to Modification 8 of Embodiment 1.

FIG. 18C is a circuit diagram of an acoustic wave filter device 10G according to Modification 8 of Embodiment 1. As illustrated in FIG. 18C, the acoustic wave filter device 10G according to this modification is different from the acoustic wave filter device 10D according to Embodiment 1 only in that the frequency varying circuit 12 is not disposed. In other words, one of parallel arms of the parallel arm resonator pH2 on the side not connected to the second serial arm is directly connected to the ground connection terminal 130.

Thus, the switch 111 and the capacitor 121 both connected to the parallel arm resonator pH1 and the parallel arm resonator pH2 adjacent to the parallel arm resonator pH1 are connected to the ground connection terminal 130. The switches 113 and 114 and the capacitors 123 and 124 connected to the adjacent parallel arm resonators pH3 and pH4, respectively, are connected to the ground connection terminal 170. Accordingly, the number of ground terminals provided in the acoustic wave filter device 10G can be reduced. Furthermore, the switch 111 and the capacitor 121 both connected to the parallel arm resonator pH1, the parallel arm resonator pH2, and the switch 113 and the capacitor 123 both connected to the parallel arm resonator pH3 are not connected to the same ground connection terminal in common. In other words, the ground connection terminal 130 (first terminal) for the adjacent parallel arm resonators pH1 and pH2 is separated from the ground connection terminal 170 (fifth terminal) for the adjacent parallel arm resonators pH3 and pH4. Even in the case of the filter circuit configuration including three or more stages of unit circuits each constituted by the serial and parallel arm resonators, therefore, the frequency variable filter circuit can be realized in which the number of terminals connected to the ground is reduced, good filter attenuation characteristics are ensured, and in which size reduction and space-saving are obtained.

Figure 19:
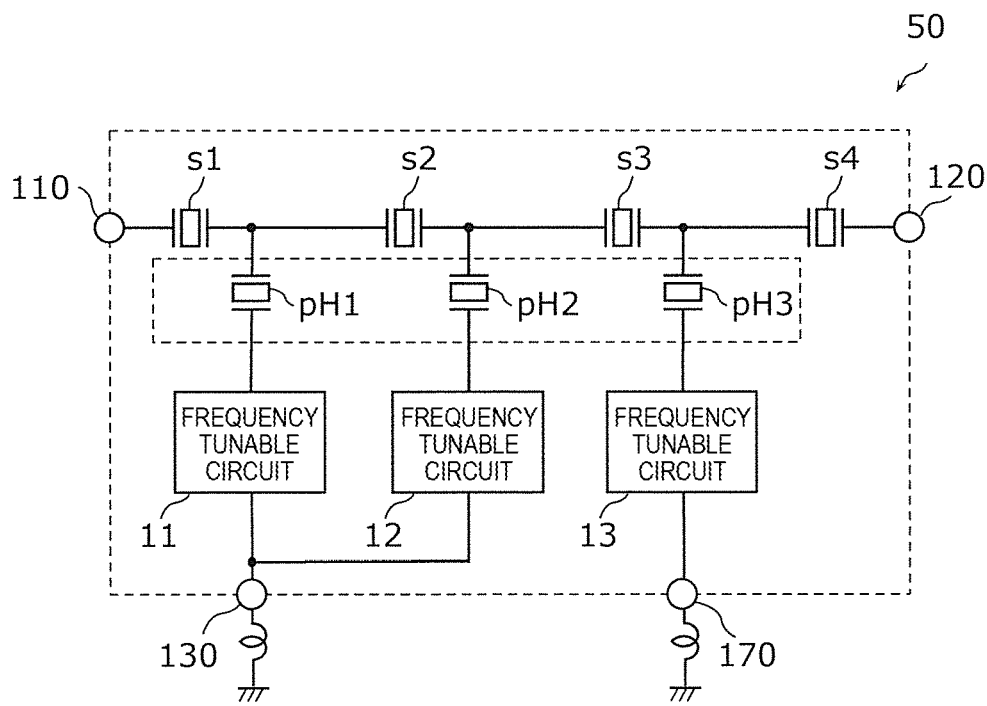
FIG. 19 is a circuit block diagram of an acoustic wave filter device according to Modification 9 of Embodiment 1.

FIG. 19 is a circuit block diagram of an acoustic wave filter device 50 according to Modification 9 of Embodiment 1. The acoustic wave filter device 50 illustrated in FIG. 19 includes input/output terminals 110 and 120, ground connection terminals 130 and 170, serial arm resonators s1, s2, s3 and s4, parallel arm resonators pH1, pH2 and pH3, and frequency varying circuits 11, 12 and 13. The acoustic wave filter device 50 according to this modification is different from the acoustic wave filter device 10 according to the embodiment in that the parallel arm resonators pL1, pL2 and pL3 are not disposed. In the following, the acoustic wave filter device 50 according to this modification is described mainly about different points from the acoustic wave filter device 10 while description of the same points as in the acoustic wave filter device 10 is omitted.

With the above configuration, the acoustic wave filter device 50 constitutes a bandpass (low-pass) filter of type having a pass band on the lower-frequency side, the pass band being formed mainly by the serial arm resonators s1 to s4. Furthermore, the frequency varying circuits 11 to 13 shift the pass band or an attenuation band to the lower frequency side or the higher frequency side.

The ground connection terminals 130 and 170 are each a terminal connected to an external ground electrode. The ground connection terminal 130 is connected to the external ground electrode without passing the ground connection terminal 170, and the ground connection terminal 170 is connected to the external ground electrode without passing the ground connection terminal 130.

The parallel arm resonator pH1 is a first higher-frequency parallel arm resonator that is connected between a first serial arm of the serial arm resonator s1 and the ground connection terminal 130 (first terminal), and that has a resonant frequency higher than a center frequency of the above-mentioned pass band. The frequency varying circuit 11 is connected to one of parallel arms of the parallel arm resonator pH1 on the side not connected to the first serial arm, and to the ground connection terminal 130 (first terminal). The parallel arm resonator pH1 and the frequency varying circuit 11 constitute a first parallel arm circuit.

The parallel arm resonator pH2 is a second higher-frequency parallel arm resonator that is connected between a second serial arm of the serial arm resonator s2 and the ground connection terminal 130 (first terminal), and that has a resonant frequency higher than the center frequency of the above-mentioned pass band. The frequency varying circuit 12 is connected to one of parallel arms of the parallel arm resonator pH2 on the side not connected to the second serial arm, and to the ground connection terminal 130 (first terminal). The parallel arm resonator pH2 and the frequency varying circuit 12 constitute a second parallel arm circuit.

The parallel arm resonator pH3 is a third higher-frequency parallel arm resonator that is connected between a third serial arm of the serial arm resonator s3 and the ground connection terminal 170 (fifth terminal), and that has a resonant frequency higher than the center frequency of the above-mentioned pass band. The frequency varying circuit 13 is connected to one of parallel arms of the parallel arm resonator pH3 on the side not connected to the third serial arm, and to the ground connection terminal 170 (fifth terminal). The parallel arm resonator pH3 and the frequency varying circuit 13 constitute a third parallel arm circuit. An example of detailed circuit configurations of the frequency varying circuits 11 to 13 is illustrated in FIG. 20.

Figure 20:
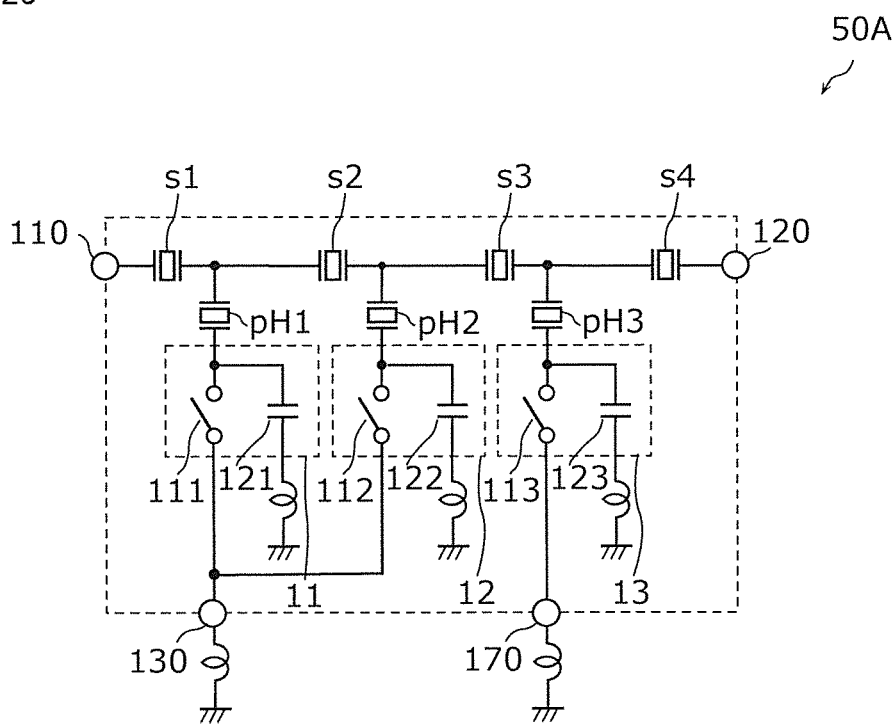
FIG. 20 is a circuit diagram of an acoustic wave filter device according to Modification 9 of Embodiment 1.

FIG. 20 is a circuit diagram of an acoustic wave filter device 50A according to Modification 9 of Embodiment 1. Filter characteristics obtained with the acoustic wave filter device 50A will be described below with reference to FIGS. 21A and 21B.

Figure 21A:
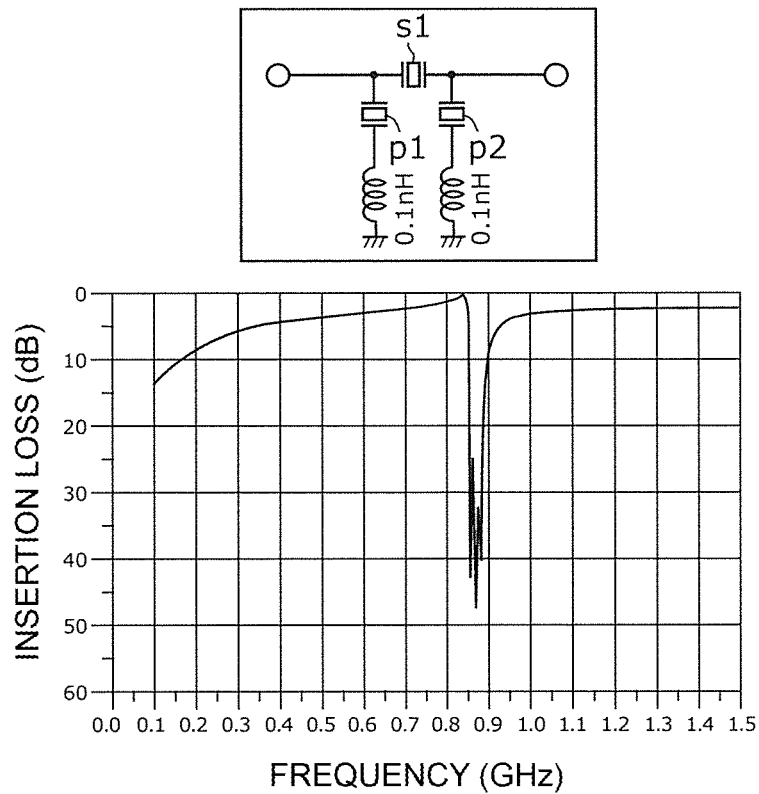
FIG. 21A is a graph depicting bandpass characteristics of a unit configuration in the acoustic wave filter device according to Modification 9 of Embodiment 1.
Figure 21B:
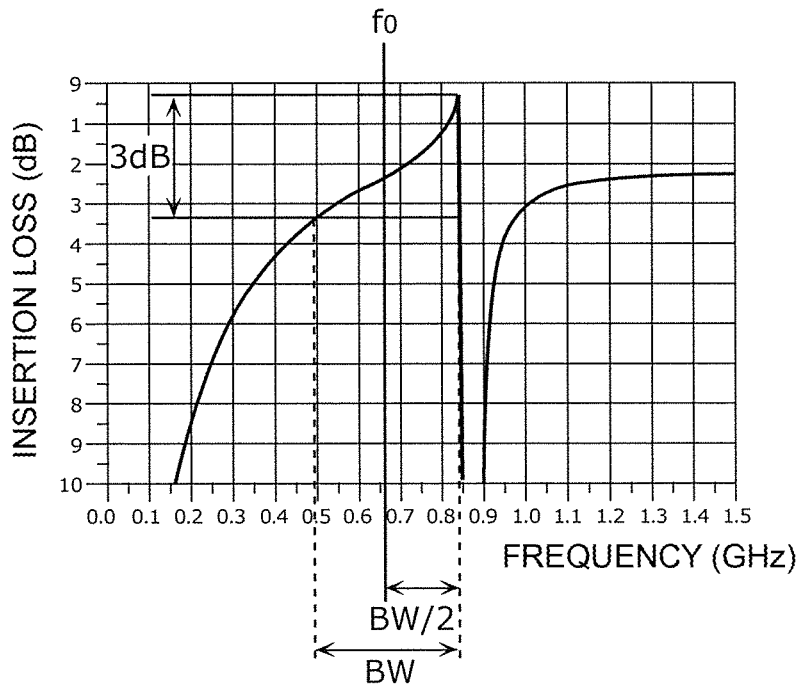
FIG. 21B is a graph referenced to explain definition of a center frequency of the acoustic wave filter device according to Modification 9 of Embodiment 1.

FIG. 21A is a graph depicting bandpass characteristics of a unit configuration in the acoustic wave filter device 50A according to Modification 9 of Embodiment 1. FIG. 21B is a graph referenced to explain definition of a center frequency of the acoustic wave filter device 50A according to Modification 9 of Embodiment 1.

Bandpass (low-pass) filter characteristics having a pass band on the lower-frequency side, illustrated in a lower zone of FIG. 21A, are obtained with a unit circuit in the acoustic wave filter device 50A, the unit circuit being constituted by the serial arm resonator s1 and parallel arm resonators p1 (pH1) and p2 (pH2). In this case, the parallel arm resonators p1 (pH1) and p2 (pH2) contribute to defining an attenuation band that is formed near the higher frequency side of the pass band. This is attributable to such characteristics that the resonance frequencies of the parallel arm resonators p1 and p2 are higher than the center frequency of the pass band. Here, the center frequency in the low-pass filter characteristics, such as obtained with the acoustic wave filter device 50, is defined as follows. Assuming here that, as illustrated in FIG. 21B, a band width is given by a span from a frequency at which the insertion loss is minimized to a frequency at which the insertion loss is deteriorated by 3 dB, a center frequency of the band width is the center frequency of the filter characteristics.

With the above configuration, since the frequency varying circuit 11 is connected to the parallel arm resonator pH1 having the resonant frequency higher than the center frequency of the filter pass band, a slope or an attenuation pole on the higher frequency side of the filter pass band can be shifted. Thus, since multiple filter characteristics can be constituted by one filter circuit having the above configuration, a frequency variable filter circuit having a small size can be realized. Furthermore, when connecting the parallel arm resonators to the ground, parallel arms of the adjacent parallel arm resonators pH1 and pH2 on the side to be grounded are connected to the common ground connection terminal 130. Therefore, the number of ground terminals provided in the acoustic wave filter device 50 can be reduced.

Furthermore, in the acoustic wave filter device 50 according to this modification, a parallel arm of the parallel arm resonator pH3 on the side to be grounded is connected to the ground connection terminal 170 (fifth terminal). Although the ground connection terminals 130 and 170 are connected to the ground in common on the external side, they are not connected to each other within the acoustic wave filter device 50. Thus, the ground connection terminal 130 (first terminal) for the adjacent parallel arm resonators pH1 and pH2 is separated from the ground connection terminal 170 (fifth terminal) for the parallel arm resonator pH3. As described above, in the case of the two adjacent parallel arm resonators pH1 and pH2, the filter attenuation characteristics are not deteriorated even when the parallel arms to be grounded are connected to the ground after previously connecting them in common at the ground connection terminal 130. However, the attenuation characteristics near the filter pass band are deteriorated when parallel arms of the three or more adjacent parallel arm resonators pH1, pH2 and PH3 on the side to be grounded are connected to the ground after previously connecting them in common.

From the above point of view, in the acoustic wave filter device 50 according to this modification, the above-mentioned parallel arms of the two adjacent parallel arm resonators pH1 and pH2 are connected to the same ground connection terminal 130, and the above-mentioned parallel arm of the parallel arm resonator pH3 is connected to the different ground connection terminal 170.

As a result, even in the case of a filter circuit configuration including three or more stages of unit circuits each constituted by the serial and parallel arm resonators, the frequency variable filter circuit can be realized in which the number of terminals connected to the ground is reduced, good filter attenuation characteristics are ensured, and in which size reduction and space-saving are obtained.

Embodiment 2

The acoustic wave filter device described above in Embodiment 1 can be further applied to a radio frequency front-end circuit and a communication device, which are adapted for a system using a larger number of bands. From such a point of view, that type of radio frequency front-end circuit and communication device are described in this Embodiment 2.

Figure 22:
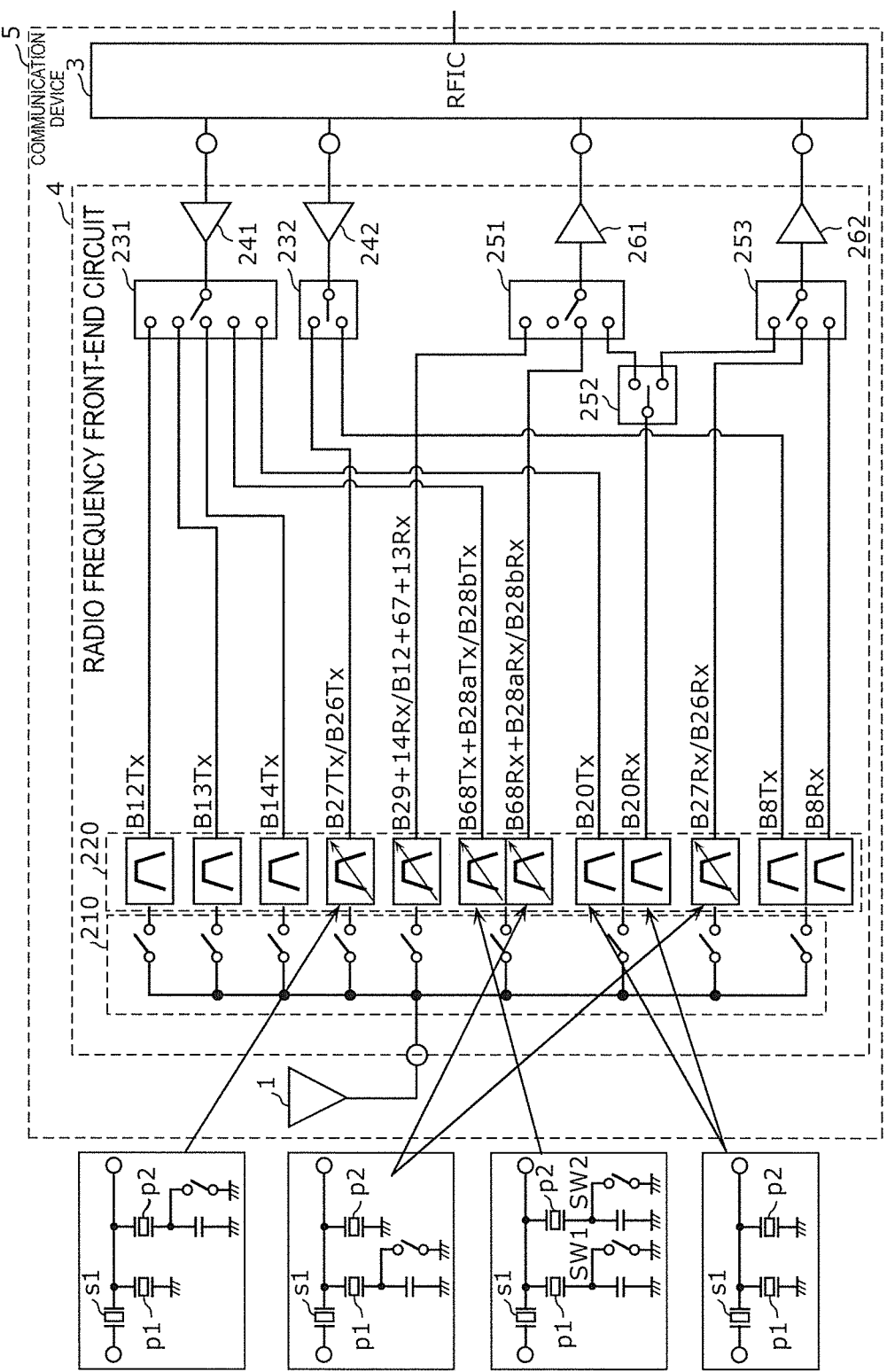
FIG. 22 is a circuit diagram of a radio frequency front-end circuit and a communication device according to Embodiment 2.
Figure 23:
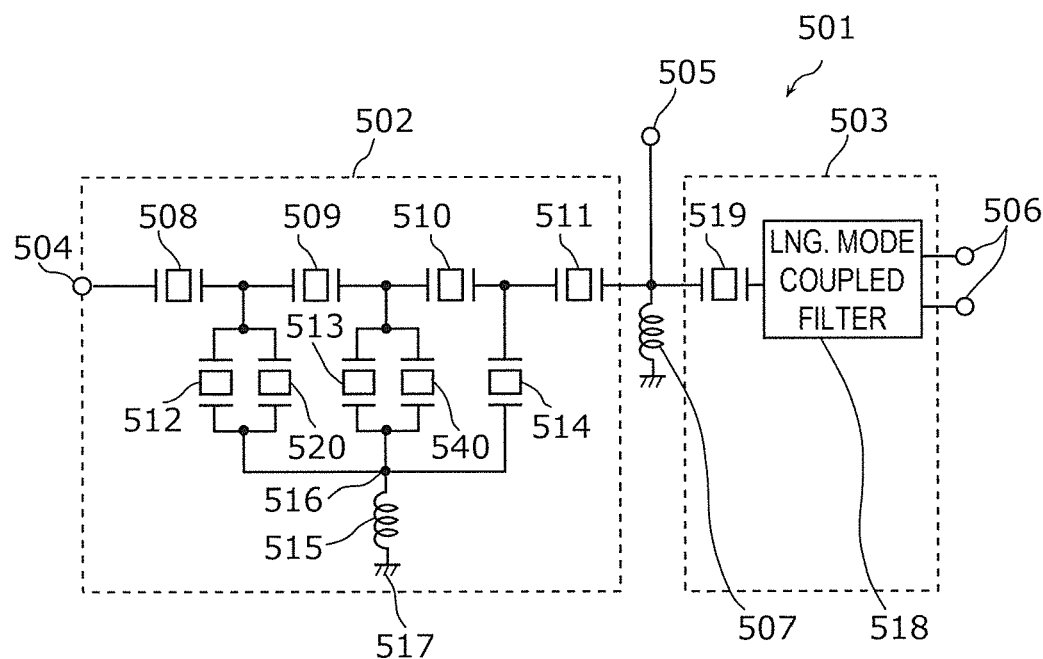
FIG. 23 is a circuit diagram of an antenna duplexer disclosed in Patent Document 1.

FIG. 22 is a circuit diagram of a radio frequency front-end circuit 4 and a communication device 5 according to Embodiment 2.

As illustrated in FIG. 22, the communication device 5 includes an antenna element 1, the radio frequency front-end circuit 4, and an RF signal processing circuit 3. The radio frequency front-end circuit 4 includes a switch group 210 made up of a plurality of switches, a filter group 220 made of a plurality of filters, and transmit-side switches 231 and 232, receive-side switches 251, 252 and 253, transmission amplifier circuits 241 and 242, and reception amplifier circuits 261 and 262, which are successively disposed from the side including the antenna element 1.

The switch group 210 connects the antenna element to a signal path corresponding to a predetermined band in accordance with a control signal from a control unit (not illustrated), and it is constituted by a plurality of SPST switches, for example. The number of signal paths connected to the antenna element is not limited to one, and it may be plural. In other words, the radio frequency front-end circuit 4 may be adaptable for carrier aggregation.

The filter group 220 is constituted by a plurality of filters (the term "filter" including a duplexer) having pass bands given, for example, as follows. Specifically, the pass bands are (i) a transmit band of Band12, (ii) a transmit band of Band13, (iii) a transmit band of Band14, (iv) a transmit band of Band27 (or Band26), (v) receive bands of Band29 and Band14 (or Band12, Band67 and Band13), (vi-Tx) transmit bands of Band68 and Band28a (or Band68 and Band28b), (vi-Rx) receive bands of Band68 and Band28a (or Band68 and Band28b), (vii-Tx) a transmit band of Band20, (vii-Rx) a receive band of Band20, (viii) a receive band of Band27 (or Band26), (ix-Tx) a transmit band of Band8, and (ix-Rx) a receive band of Band8.

The filter group 220 and the switch group 210 constitute a multiplexer equipped with a plurality of acoustic wave filter devices including the acoustic wave filter device 10 according to Embodiment 1.

The transmit-side switch 231 is a switch circuit having a plurality of select terminals connected to a plurality of transmit-side signal paths on the low-band side, and having a common terminal connected to the transmission amplifier circuit 241. The transmit-side switch 232 is a switch circuit having a plurality of select terminals connected to a plurality of transmit-side signal paths on the high-band side, and having a common terminal connected to the transmission amplifier circuit 242. Those transmit-side switches 231 and 232 are switch circuits that are disposed upstream of the filter group 220 (here, on the upstream side in the transmit-side signal paths), and that switch over their connection states in accordance with control signals from the control unit (not illustrated). Thus, radio frequency signals (here, radio frequency transmit signals) amplified by the transmission amplifier circuits 241 and 242 are outputted to the antenna element 1 from antenna terminals through a predetermined filter in the filter group 220.

The receive-side switch 251 is a switch circuit having a plurality of select terminals connected to a plurality of receive-side signal paths on the low-band side, and having a common terminal connected to the reception amplifier circuit 261. The receive-side switch 252 is a switch circuit having a common terminal connected to a receive-side signal path of a predetermined band (here, Band20), and having two select terminals connected to the select terminal of the receive-side switch 251 and the select terminal of the receive-side switch 252. The receive-side switch 253 is a switch circuit having a plurality of select terminals connected to a plurality of receive-side signal paths on the high-band side, and having a common terminal connected to the reception amplifier circuit 262. The receive-side switches 251 to 253 are disposed downstream of the filter group 220 (here, on the downstream side in the receive-side signal paths), and their connection states are switched over in accordance with control signals from the control unit (not illustrated). Thus, radio frequency signals (here, radio frequency receive signals) inputted to the antenna terminal are, after passing through predetermined filters in the filter group 220, amplified by the receive amplifier circuits 261 and 262 and then outputted to the RF signal processing circuit 3 from receive terminals. The RF signal processing circuit 3 adapted for low bands may be disposed separately from the RF signal processing circuit 3 adapted for high bands.

The transmission amplifier circuit 241 is a power amplifier that amplifies powers of the low-band radio frequency transmit signals, and the transmission amplifier circuit 242 is a power amplifier that amplifies powers of the high-band radio frequency transmit signals.

The reception amplifier circuit 261 is a low-noise amplifier that amplifies powers of the low-band radio frequency receive signals, and the reception amplifier circuit 262 is a low-noise amplifier that amplifies powers of the high-band radio frequency receive signals.

The radio frequency front-end circuit 4 having the above-described configuration includes, as a filter having a pass band set to (iv) the transmit band of Band27 (or Band26), the acoustic wave filter device 10A according to Embodiment 1. In other words, the relevant filter switches over the band pass between the transmit band of Band27 and the transmit band of Band26 in accordance with the control signal.

Furthermore, the radio frequency front-end circuit 4 includes, as a transmit filter having a pass band set to (vi-Tx) the transmit bands of Band68 and Band28a (or Band68 and Band28b), the acoustic wave filter device 10 in which the unit circuit is given by the tunable filter 22E illustrated in FIG. 15. In other words, a duplexer constituted by the relevant transmit filter switches over the band pass between the transmit bands of Band68 and Band28a and the transmit bands Band68 and Band28b in accordance with the control signal.

With the radio frequency front-end circuit 4 constituted as described above, because of including the acoustic wave filter device 10 according to Embodiment 1, the radio frequency front-end circuit and the communication device can be realized in which the number of terminals connected to the ground is reduced, good filter attenuation characteristics are ensured, and in which size reduction and space-saving are obtained.

It is to be noted that at least one of the transmit-side switches 231 and 232 and at least one of the receive-side switches 251 to 253 are just required to be disposed. The number of the transmit-side switches 231 and 232 and the number of the receive-side switches 251 to 253 are each not limited to the above-described value. In another example, one transmit-side switch and one receive-side switch may be disposed. Furthermore, the number of the select terminals, for example, in each of the transmit-side switch and the receive-side switch is also not limited to the value described in the embodiment, and it may be two.

Other Embodiments

The acoustic wave filter devices, the multiplexer, the radio frequency front-end circuit, and the communication device according to the embodiments of the present disclosure have been described in connection with Embodiments 1 and 2, but the present disclosure is not limited to the above embodiments and modifications. The present disclosure further includes other embodiments realized by combining optional constituent elements in the above embodiments and modifications, modifications obtained by variously modifying the above embodiments based on ideas conceived by those skilled in the art within a scope not departing from the gist of the present disclosure, and various apparatuses including any of the acoustic wave filter device, the multiplexer, the radio frequency front-end circuit, and the communication device according to the present disclosure.

For instance, the parallel arm circuit included in the acoustic wave filter device 10 may include one or more other parallel arm resonators in addition to the lower-frequency parallel arm resonator having the resonant frequency lower than the center frequency of the above-described pass band and the higher-frequency parallel arm resonator having the resonant frequency higher than the center frequency of the above-described pass band.

A relation regarding which one of a frequency span between the resonant frequency and the anti-resonant frequency of the serial arm resonator alone (i.e., a resonator band width of the serial arm resonator) and a frequency span between the resonant frequency and the anti-resonant frequency of the parallel arm resonator alone (i.e., a resonator band width of the parallel arm resonator) is larger or smaller is not limited to particular one. From the viewpoint of widening a frequency variable width, however, it is preferable that the resonator band widths of the parallel arm resonator and the serial arm resonator are substantially equal to each other, or that the parallel arm resonator has a wider resonator band width than the serial arm resonator. Here, the wording "substantially equal" includes not only the case that both the resonator band widths are perfectly equal, but also the case that they are virtually equal.

For instance, the control unit may be disposed outside the RF signal processing circuit 3. The control unit may be disposed in the radio frequency front-end circuit 4, for example. In other words, the radio frequency front-end circuit 4 may include the control unit and the acoustic wave filter device. The radio frequency front-end circuit 4 having such a configuration can switch over the pass bands depending on demanded frequency specifications.

In the radio frequency front-end circuit and the communication device, for example, an inductor or a capacitor may be connected between adjacent constituent elements.

The acoustic wave filter device according to the present disclosure may include a first input/output terminal and a second input/output terminal through each of which a radio frequency signal is inputted and outputted; a first terminal connected to an external ground electrode; a first serial arm circuit including one or more acoustic wave resonators and connected to a path connecting the first input/output terminal and the second input/output terminal; a first parallel arm circuit connected between the first terminal and a first node among nodes on the path connecting the first input/output terminal and the second input/output terminal, the first node being positioned closer to the first input/output terminal than the first serial arm circuit; and a second parallel arm circuit connected between the first terminal and a second node among the nodes on the path connecting the first input/output terminal and the second input/output terminal, the second node being positioned closer to the second input/output terminal than the first serial arm circuit, wherein the first parallel arm circuit may include a first lower-frequency parallel arm resonator, a first higher-frequency parallel arm resonator having a higher resonant frequency than the first lower-frequency parallel arm resonator, and a first frequency varying circuit connected to the first higher-frequency parallel arm resonator and the first terminal, wherein the second parallel arm circuit may include a second lower-frequency parallel arm resonator, and a second higher-frequency parallel arm resonator having a higher resonant frequency than the second lower-frequency parallel arm resonator and connected to the first terminal, and wherein the first frequency varying circuit and the second higher-frequency parallel arm resonator may be grounded in common at the first terminal.

With the above features, since the first frequency varying circuit is connected to the first higher-frequency parallel arm resonator having the higher resonant frequency, the slope or the attenuation pole on the higher frequency side of the filter pass band can be shifted. Thus, since multiple filter characteristics can be constituted by one filter circuit, the size of the frequency variable filter can be reduced. Furthermore, when connecting the parallel arm resonators to the ground, the first and second higher-frequency parallel arm resonators adjacent to each other are grounded in common at the first terminal. Therefore, the number of ground terminals provided in the acoustic wave filter device can be reduced. As a result, the frequency variable filter circuit can be realized in which the number of terminals connected to the ground is reduced, and in which size reduction and space-saving are obtained without deteriorating the filter characteristics.

The acoustic wave filter device according to the present disclosure may further include a fifth terminal connected to the external ground terminal, a second serial arm circuit disposed on the path connecting the first input/output terminal and the second input/output terminal, connected in series to the first serial arm circuit, and including one or more acoustic wave resonators, and a third parallel arm circuit connected between the fifth terminal and a third node among the nodes on the path connecting the first input/output terminal and the second input/output terminal, the third node being positioned closer to the second input terminal than the second serial arm circuit, wherein the third parallel arm circuit may include a third higher-frequency parallel arm resonator having a resonant frequency higher than a center frequency of a predetermined frequency band, and the third higher-frequency parallel arm resonator may not be grounded in common to the first frequency varying circuit and the second higher-frequency parallel arm resonator.

Thus, parallel arms of the adjacent first and second parallel arm circuits on the side to be grounded are connected to the first terminal, while a parallel arm of the third parallel arm circuit on the side to be grounded is connected to the fifth terminal. Here, the first terminal and the fifth terminal are both connected to the ground outside the acoustic wave filter device, but they are not connected to each other inside the acoustic wave filter device. In other words, the ground for the adjacent first and second parallel arm circuits and the ground for the third parallel arm circuit are not in common to each other. With the above features, therefore, even in the case of a filter circuit configuration including three or more stages of unit circuits each constituted by the serial and parallel arm resonators, the frequency variable filter circuit can be realized in which the number of terminals connected to the ground is reduced, good filter attenuation characteristics are ensured, and in which size reduction and space-saving are obtained.

The acoustic wave filter devices having the above-described features are based on the same technical concept as that of the acoustic wave filter devices according to the above-described embodiments.

The present disclosure can be utilized as any of an acoustic wave filter device, a multiplexer, a radio frequency front-end circuit, and a communication device each having a small size and being adaptable for a multiband system, and can be widely applied to communication apparatuses such as a cellular phone.

1 antenna element
RF signal processing circuit
radio frequency front-end circuit
communication device
10, 10A, 10B, 10C, 10D, 10E, 10F, 10G, 50, 50A acoustic wave filter device
11, 12, 13, 14 frequency varying circuit
11a, 11b, 104 IDT electrode
22A, 22E tunable filter
22C, 22C1, 22C2, 121, 122, 123, 124 capacitor
22m, 22n, 110, 120 input/output terminal
22p1, 22p2, p1, p2, pH1, pH2, pH3, pH4, pL1, pL2, pL3, pL4 parallel arm resonator
22s, s1, s2, s3, s4, s5 serial arm resonator
22SW, 22SW1, 22SW2, 111, 112, 113, 114, SW switch
100 piezoelectric substrate
101 close contact layer
102 main electrode layer
103 protective layer
110a, 110b electrode finger
111a, 111b busbar electrode
120A, 120E parallel arm circuit
130, 130A, 130B, 140, 150, 160, 170, 170A, 170B, 180 ground connection terminal
150 mounting board
151 filter substrate
152 tunable circuit section
210 switch group
220 filter group
231, 232 transmit-side switch
241, 242 transmission amplifier circuit
251, 252, 253 receive-side switch
261, 262 reception amplifier circuit
501 antenna duplexer
502 ladder acoustic wave filter
503 receive filter
504 input terminal
505 antenna terminal
508, 509, 510, 511 serial resonator
512, 513, 514 first parallel resonator
515 inductor
518 longitudinal mode coupled filter
519 resonator
520 second parallel resonator
540 third parallel resonator

The invention claimed is:

1. An acoustic wave filter device of frequency variable type allowing a radio frequency signal in a predetermined frequency band to pass therethrough, the acoustic wave filter device comprising:
a first input/output terminal through which the radio frequency signal is input and a second input/output terminal through which the radio frequency signal is output, the first input/output terminal being connected to the second input/output terminal via a path;
a first terminal connected to an external ground electrode;
a first serial arm circuit comprising one or more acoustic wave resonators and connected on the path;

a first parallel arm circuit connected between the first terminal and a first node on the path, the first node being closer to the first input/output terminal than the first serial arm circuit; and a second parallel arm circuit connected between the first terminal and a second node on the path, the second node being closer to the second input/output terminal than the first serial arm circuit, wherein the first parallel arm circuit comprises:
   a first higher-frequency parallel arm resonator having a resonant frequency that is greater than a center frequency of the predetermined frequency band; and
   a first frequency varying circuit connected in series with the first higher-frequency parallel arm resonator between the first node and the first terminal, wherein the second parallel arm circuit comprises a second higher-frequency parallel arm resonator having a resonant frequency that is greater than the center frequency of the predetermined frequency band, and wherein the first frequency varying circuit comprises a first switch and a first impedance element.

2. The acoustic wave filter device according to claim 1, further comprising:
   a second terminal connected to the external ground electrode;
   a third terminal being connected to the external ground electrode;
   a first lower-frequency parallel arm resonator connected between the first node and the second terminal, and having a resonant frequency that is less than the center frequency of the predetermined frequency band; and
   a second lower-frequency parallel arm resonator connected between the second node and the third terminal, and having a resonant frequency that is less than the center frequency of the predetermined frequency band.

3. The acoustic wave filter device according to claim 1, wherein the resonant frequency of the first higher-frequency parallel arm resonator is less than an anti-resonant frequency of the one or more acoustic wave resonators in the first serial arm circuit, and wherein the resonant frequency of the second higher-frequency parallel arm resonator is less than the anti-resonant frequency of the acoustic wave resonator in the one or more first serial arm circuits.

4. The acoustic wave filter device according to claim 1, wherein the first serial arm circuit is a longitudinally-coupled filter resonator comprising a plurality of acoustic wave resonators.

5. The acoustic wave filter device according to claim 1, wherein only either the first switch element or the first impedance element is connected between the first higher-frequency parallel arm resonator and the first terminal.

6. The acoustic wave filter device according to claim 5, wherein the second parallel arm circuit further comprises a second switch connected to the first terminal, and connected between the second higher-frequency parallel arm resonator and the first terminal, and wherein the first switch is connected to the first terminal.

7. The acoustic wave filter device according to claim 6, further comprising a fourth terminal connected to the external ground electrode, wherein the second parallel arm circuit further comprises a second impedance element connected to the second higher-frequency parallel arm resonator and to the fourth terminal, and wherein the first impedance element and the second impedance element are connected to the fourth terminal.

8. The acoustic wave filter device according to claim 5, wherein the second parallel arm circuit further comprises a second impedance element connected to the first terminal, and connected between the second higher-frequency parallel arm resonator and the first terminal, and wherein the first impedance element is connected to the first terminal.

9. The acoustic wave filter device according to claim 1, further comprising:
   a fifth terminal connected to the external ground electrode without passing through the first terminal;
   a second serial arm circuit comprising one or more acoustic wave resonators and connected in series with the first serial arm circuit between the first input/output terminal and the second input/output terminal; and
   a third parallel arm circuit connected between the fifth terminal and a third node on the path, the third node being closer to the second input/output terminal than the second serial arm circuit, wherein the first terminal is connected to the external ground electrode without passing through the fifth terminal, and the third parallel arm circuit comprises a third higher-frequency parallel arm resonator having a resonant frequency that is greater than the center frequency of the predetermined frequency band.

10. The acoustic wave filter device according to claim 9, further comprising:
    a sixth terminal connected to the external ground electrode; and
    a third lower-frequency parallel arm resonator connected between the third node and the sixth terminal, and having a resonant frequency that is less than the center frequency of the predetermined frequency band.

11. The acoustic wave filter device according to claim 9, wherein the second serial arm circuit comprises one or more acoustic wave resonators, and wherein the resonant frequency of the third higher-frequency parallel arm resonator is less than an anti-resonant frequency of the one or more acoustic wave resonators in the second serial arm circuit.

12. The acoustic wave filter device according to claim 9, wherein the third parallel arm circuit further comprises a third switch connected to the third higher-frequency parallel arm resonator and to the fifth terminal.

13. The acoustic wave filter device according to claim 12, wherein the third parallel arm circuit further comprises a third impedance element connected to the third higher-frequency parallel arm resonator and to the fifth terminal.

14. The acoustic wave filter device according to claim 1, further comprising:
    a filter substrate in or on which the first serial arm circuit, the first higher-frequency parallel arm resonator, and the second higher-frequency parallel arm resonator are located;
    a tunable circuit section in which the first frequency varying circuit and the first terminal are located; and
    a mounting board to which the filter substrate and the tunable circuit section are mounted, and that comprises the external ground electrode and wiring extending from the first terminal to the external ground electrode.

15. A multiplexer comprising a plurality of acoustic wave filter devices including the acoustic wave filter device according to claim 1.

16. A radio frequency front-end circuit comprising:
a plurality of acoustic wave filter devices including the acoustic wave filter device according to claim 1; and
a switch circuit disposed upstream or downstream of the plurality of acoustic wave filter devices, wherein the switch circuit comprises a plurality of select terminals individually connected to the plurality of acoustic wave filter devices, and a common terminal selectively connected to the plurality of select terminals.

17. A communication device comprising:
a radio frequency (RF) signal processing circuit configured to processes the radio frequency signal transmitted from or received by an antenna; and
the acoustic wave filter device according to claim 1, the acoustic wave filter device configured to transfer the radio frequency signal between the antenna and the RF signal processing circuit.

18. An acoustic wave filter device of frequency variable type allowing a radio frequency signal in a predetermined frequency band to pass therethrough, the acoustic wave filter device comprising:
a first input/output terminal through which the radio frequency signal is input and a second input/output terminal through which the radio frequency signal is output, the first input/output terminal being connected to the second input/output terminal via a path;
a first terminal connected to an external ground electrode;
a first serial arm circuit comprising one or more acoustic wave resonators and connected on the path;
a first parallel arm circuit connected between the first terminal and a first node on the path, the first node being closer to the first input/output terminal than the first serial arm circuit; and
a second parallel arm circuit connected between the first terminal and a second node on the path, the second node being closer to the second input/output terminal than the first serial arm circuit,
wherein the first parallel arm circuit comprises:
a first lower-frequency parallel arm resonator;
a first higher-frequency parallel arm resonator having a higher resonant frequency than the first lower-frequency parallel arm resonator; and
a first frequency varying circuit connected to the first terminal and connected in series with the first higher-frequency parallel arm resonator between the first node and the first terminal,
wherein the second parallel arm circuit comprises:
a second lower-frequency parallel arm resonator; and
a second higher-frequency parallel arm resonator having a higher resonant frequency than the second lower-frequency parallel arm resonator and connected to the first terminal, and
wherein the first frequency varying circuit and the second higher-frequency parallel arm resonator are commonly grounded at the first terminal.

19. The acoustic wave filter device according to claim 18, further comprising:
a fifth terminal connected to the external ground electrode;
a second serial arm circuit comprising one or more acoustic wave resonators and connected in series with the first serial arm circuit between the first input/output terminal and the second input/output terminal; and
a third parallel arm circuit connected between the fifth terminal and a third node on the path, the third node being closer to the second input/output terminal than the second serial arm circuit,
wherein the third parallel arm circuit includes a third higher-frequency parallel arm resonator having a resonant frequency that is greater than a center frequency of the predetermined frequency band, and
wherein the third higher-frequency parallel arm resonator does not share a common ground with the first frequency varying circuit and the second higher-frequency parallel arm resonator.

\* \* \* \* \*